US010121286B2

(12) United States Patent
Alsaffar et al.

(10) Patent No.: US 10,121,286 B2
(45) Date of Patent: Nov. 6, 2018

(54) CAD SYNCHRONIZATION SYSTEM AND METHOD

(71) Applicant: JOHNSON CONTROLS TECHNOLOGY COMPANY, Holland, MI (US)

(72) Inventors: Rahim Alsaffar, Novi, MI (US); Ramanamurthy Pentakota, Novi, MI (US); Rick Sturgeon, Ann Arbor, MI (US)

(73) Assignee: ADIENT LUXEMBOURG HOLDING S.A.R.L., Luxembourg (LU)

( * ) Notice: Subject to any disclaimer, the term of this patent is extended or adjusted under 35 U.S.C. 154(b) by 0 days.

(21) Appl. No.: 15/325,886

(22) PCT Filed: Jul. 29, 2014

(86) PCT No.: PCT/US2014/048678
§ 371 (c)(1),
(2) Date: Jan. 12, 2017

(87) PCT Pub. No.: WO2016/018264
PCT Pub. Date: Feb. 4, 2016

(65) Prior Publication Data
US 2017/0148227 A1    May 25, 2017

(51) Int. Cl.
*G06T 19/20*    (2011.01)
*G06T 11/20*    (2006.01)
(Continued)

(52) U.S. Cl.
CPC .......... *G06T 19/20* (2013.01); *G06F 17/5009* (2013.01); *G06T 11/20* (2013.01); *G06T 11/60* (2013.01); *G06T 15/20* (2013.01); *G06T 17/10* (2013.01); *G06T 2200/24* (2013.01); *G06T 2219/004* (2013.01)

(58) Field of Classification Search
CPC .... G06T 19/00; G06T 11/00; G06T 2219/004
See application file for complete search history.

(56) References Cited

U.S. PATENT DOCUMENTS 5,701,403 A * 12/1997 Watanabe ............... G06T 17/10
345/419
6,611,725 B1 * 8/2003 Harrison ................. G06T 19/00
345/420

(Continued)

OTHER PUBLICATIONS

International Search Report dated Apr. 2, 2015, received in corresponding International Application No. PCT/US2014/048678, 2 pages.

(Continued)

*Primary Examiner* — Thomas Lett
(74) *Attorney, Agent, or Firm* — Foley & Lardner LLP

(57) ABSTRACT

A method for reproducing a 2D drawing from an annotated 3D computer-aided design (CAD) model includes receiving a 3D CAD model of a physical part or assembly, generating a 2D drawing of the physical part of assembly using the 3D CAD model, receiving a modification to the 2D drawing, storing the modification to the 2D drawing within the 3D CAD model to produce an annotated 3D CAD model, and reproducing the 2D drawing with the modification using the annotated 3D CAD model.

34 Claims, 37 Drawing Sheets

(51) Int. Cl.
  *G06T 11/60* (2006.01)
  *G06T 15/20* (2011.01)
  *G06T 17/10* (2006.01)
  *G06F 17/50* (2006.01)

(56) References Cited

U.S. PATENT DOCUMENTS

| | | | |
|---|---|---|---|
| 2001/0043236 A1* | 11/2001 | Yamamoto | G06T 19/20 |
| | | | 715/781 |
| 2002/0118187 A1 | 8/2002 | Batori et al. | |
| 2003/0071810 A1* | 4/2003 | Shoov | G06F 17/50 |
| | | | 345/420 |
| 2005/0212797 A1 | 9/2005 | Lee et al. | |
| 2006/0259172 A1* | 11/2006 | Trammell | G06Q 30/0603 |
| | | | 700/97 |
| 2007/0285424 A1* | 12/2007 | Cheng | G06T 19/00 |
| | | | 345/427 |
| 2011/0257938 A1* | 10/2011 | Eyers | G06F 17/5004 |
| | | | 703/1 |
| 2012/0010739 A1 | 1/2012 | Elisma | |
| 2014/0067333 A1 | 3/2014 | Rodney et al. | |
| 2014/0163931 A1 | 6/2014 | Snyder et al. | |

OTHER PUBLICATIONS

Written Opinion of the International Searching Authority dated Apr. 2, 2015, in corresponding International Application No. PCT/US2014/048678, 7 pages.

International Preliminary Report on Patentability and Written Opinion of the International Searching Authority in PCT/US2014/048678 dated Feb. 9, 2017, 9 pages.

* cited by examiner

CAD SYNCHRONIZATION SYSTEM AND METHOD

CROSS-REFERENCE TO RELATED APPLICATIONS

The present application is a U.S. National Stage of International Application No. PCT/US2014/048678 filed on Jul. 29, 2014, the entire disclosure of which is incorporated herein by reference.

BACKGROUND

The present invention relates generally to the field of computer-aided design (CAD). The present invention relates more particularly to systems and methods for synchronizing three-dimensional CAD models and two-dimensional drawings created from the three-dimensional CAD models. The present invention relates more particularly still to systems and methods for automatically creating two-dimensional drawings from an annotated three-dimensional model.

CAD modeling software is used to design and represent three-dimensional (3D) parts for use in a variety of different industries (e.g., automotive, manufacturing, industrial, commercial, etc.). Typically, a design engineer will create a 3D model using CAD software. The associated drawings are generally created as a two-dimensional (2D) representation of the 3D model. The 2D drawings may be linked to the 3D model, but are stored as a separate document (e.g., a separate data file). The 2D drawings often contain additional information that is not included in the 3D model. For example, product manufacturing information (PMI) is often provided only on 2D drawings and is not included in the 3D model.

In many implementations, 2D drawings must be compliant with various drafting and custom organization standards in order to qualify as "formal" drawings. The standards for formal drawings can vary based on the intended use of the drawings, the industry associated with the drawings, or other entity specific standards that are generally followed by an organization or group. Drawings that do not comply with these standards are classified as "informal" drawings.

Typically, creating a formal 2D drawing from a 3D model is only partially automated and requires significant manual work to complete. Each time 3D model is revised, the formal 2D drawing may need to be revised as well. Revising a 2D drawing can be difficult, time-consuming, and can introduce errors into the 2D drawing. For example, revision errors can cause the 2D drawing to become out-of-sync with the 3D model, thereby creating significant issues in properly documenting and representing the product configuration defined in the 3D model.

SUMMARY

The present invention relates to systems and methods for automating the creation of 2D drawings to fully and accurately represent a design defined by an associated 3D model. All of the information required to create a formal 2D drawing is stored in the 3D model (e.g., as properties or attributes of the 3D model). Templates can be used to define a specific format for the 2D drawing (e.g., different complying with various formal standards). A variety of different formal drawings may be created from the 3D model and a selected template using the information stored in the 3D model.

One implementation of the present disclosure is a method for reproducing a 2D drawing from an annotated 3D computer-aided design (CAD) model. The method includes receiving, at a processing circuit, a 3D CAD model of a physical part or assembly; generating, by the processing circuit, a 2D drawing of the physical part of assembly using the 3D CAD model; receiving, at the processing circuit via a user interface, a modification to the 2D drawing; storing, by the processing circuit, the modification to the 2D drawing within the 3D CAD model to produce an annotated 3D CAD model; and reproducing, by the processing circuit, the 2D drawing with the modification using the annotated 3D CAD model.

In some embodiments, the modification to the 2D drawing includes supplemental content not included in the 3D CAD model. In some embodiments, the modification to the 2D drawing comprises at least one of non-solid geometry, a textual annotation, a dimension, and a tolerance.

In some embodiments, the method further includes receiving a user selection of a first standard view of the 3D CAD model via the user interface, automatically defining a plurality of other standard views of the 3D CAD model based on the first standard view, and storing the first standard view and the plurality of other standard views as objects of the 3D CAD model.

In some embodiments, the method further includes receiving, via the user interface, a command to generate a drawing from the 3D CAD model; prompting a user to identify a drawing template in response to receiving the command; using the identified drawing template to format the 2D drawing; and storing an indication of the identified drawing template as an attribute of the 3D CAD model.

In some embodiments, the method further includes prompting a user to select or input drawing parameters for the 2D drawing and storing the drawing parameters as attributes of the 3D CAD model.

In some embodiments, the modification to the 2D drawing includes a non-standard view of the 3D CAD model. In some embodiments, storing the modification within the 3D CAD model includes storing a view object defining the non-standard view as an object of the 3D CAD model.

In some embodiments, storing the modification to the 2D drawing within the 3D CAD model includes generating a drawing information object including one or more parameters defining the modification to the 2D drawing and storing the drawing information object as an object of the 3D CAD model.

In some embodiments, the method further includes generating multiple drawing information objects, each drawing information object corresponding to a different 2D drawing and comprising parameters defining multiple different views of the corresponding 2D drawing. The method may further include storing the drawing information objects as discrete sets of parameters within the 3D CAD model.

In some embodiments, the 3D CAD model is a first 3D CAD model, the modification to the 2D drawing includes a view of a second 3D CAD model, and storing the modification to the 2D drawing within the 3D CAD model includes storing a link defining a location of the second 3D CAD model as an attribute of the first 3D CAD model.

Another implementation of the present disclosure is a method for synchronizing a 3D computer-aided design (CAD) model and a 2D drawing. The method includes receiving, at a processing circuit, a 3D CAD model of a physical part or assembly; generating, by the processing circuit, a 2D drawing of the physical part or assembly using the 3D CAD model; and adding, by the processing circuit, supplemental content to the 2D drawing. The supplemental content includes content that is not included in the 3D CAD model. The method further includes modifying, by the processing circuit, the 3D CAD model to include the supplemental content added to the 2D drawing.

In some embodiments, the method includes using the modified 3D CAD model to re-create the 2D drawing with the supplemental content. In some embodiments, the method includes generating a graphical user interface, receiving user input via the graphical user interface, and using the user input to generate at least one non-standard view of the physical part of assembly. The supplemental content added to the 2D drawing may include the generated non-standard view.

In some embodiments, modifying the 3D CAD model to include the supplemental content includes generating a plurality of data elements and storing the plurality of data elements as properties of the 3D CAD model. Each data element may correspond to a view depicted in the 2D drawing and may include a parameter at least partially defining the corresponding view.

In some embodiments, adding supplemental content to the 2D drawing includes adding to a view of the 2D drawing at least one of a textual annotation, a dimension, and a tolerance. In some embodiments, modifying the 3D CAD model to include the supplemental content includes identifying the view of the 2D drawing to which the supplemental content is added and storing the supplemental content to a view plane of the 3D CAD model corresponding to the identified view.

In some embodiments, adding supplemental content to the 2D drawing includes adjusting the 2D drawing to clarify geometric items on the 2D drawing (e.g., by toggling on hidden lines, adding axes, adding centerlines, etc.). Modifying the 3D CAD model to include the supplemental content may include storing the clarifying information as a data element of the 3D model.

In some embodiments, modifying the 3D CAD model to include the supplemental content includes generating a plurality of data elements and storing the plurality of data elements as properties of the 3D CAD model. Each data element may correspond to a different 2D drawing and may include parameters defining multiple different views of the corresponding 2D drawing.

Another implementation of the present disclosure is a system for synchronizing a 3D computer-aided design (CAD) model and a 2D drawing. The system includes a communications interface configured to receive a 3D CAD model of a physical part or assembly. The system further includes a processing circuit configured to generate 2D drawing of the physical part or assembly using the 3D CAD model, add supplemental content to the 2D drawing, and modify the 3D CAD model to include the supplemental content added to the 2D drawing. The supplemental content includes content that is not included in the 3D CAD model.

In some embodiments, the processing circuit is configured to use the modified 3D CAD model to re-create the 2D drawing with the supplemental content. In some embodiments, the processing circuit is configured to generate a graphical user interface, receive user input via the graphical user interface, and use the user input to generate at least one non-standard view of the physical part of assembly. The supplemental content added to the 2D drawing may include the generated non-standard view.

In some embodiments, modifying the 3D CAD model to include the supplemental content includes generating a plurality of data elements and storing the plurality of data elements as properties of the 3D CAD model. Each data element may correspond to a view depicted in the 2D drawing and may include a parameter at least partially defining the corresponding view.

In some embodiments, adding supplemental content to the 2D drawing includes adding to a view of the 2D drawing at least one of a textual annotation, a dimension, and a tolerance. In some embodiments, modifying the 3D CAD model to include the supplemental content includes identifying the view of the 2D drawing to which the supplemental content is added and storing the supplemental content to a view plane of the 3D CAD model corresponding to the identified view.

In some embodiments, adding supplemental content to the 2D drawing includes using a formatting parameter to adjust the 2D drawing to comply with a formal drawing standard. Modifying the 3D CAD model to include the supplemental content may include storing the formatting parameter as a data element of the 3D model.

In some embodiments, modifying the 3D CAD model to include the supplemental content includes generating a plurality of data elements and storing the plurality of data elements as properties of the 3D CAD model. Each data element may correspond to a different 2D drawing and may include parameters defining multiple different views of the corresponding 2D drawing.

Another implementation of the present disclosure is a system for synchronizing a 3D computer-aided design (CAD) model and a 2D drawing. The system includes a communications interface configured to receive a 2D drawing based on a 3D CAD model of a physical part or assembly and a processing circuit configured to identify supplemental content in the 2D drawing that is not included in the 3D CAD model and modify the 3D CAD model to include the supplemental content from the 2D drawing.

In some embodiments, the supplemental content includes at least one of a textual annotation, a dimension, and a tolerance. In some embodiments, modifying the 3D CAD model to include the supplemental content includes identifying a view of the 2D drawing that includes the supplemental content and storing the supplemental content to a view plane of the 3D CAD model corresponding to the identified view. In some embodiments, the processing circuit is configured to use the modified 3D CAD model to re-create the 2D drawing with the supplemental content.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Referring generally to the FIGURES, systems and methods for synchronizing 3D CAD models and 2D drawings are shown, according to various exemplary embodiments. The systems and methods described herein may be used to automatically generate 2D drawings (e.g., one or more formal or informal drawings) from 3D CAD models (e.g., one or more 3D models of a part or assembly).

Advantageously, all of the information required to generate a specific 2D drawing (e.g., a 2D drawing complying with a particular formal standard) may be stored in the 3D model. For example, each view represented in the 2D drawing may be stored as a set of parameters in the associated 3D model. Drawing parameters stored in the 3D model may include, for example, functional tolerancing and annotation (FT&A) parameters, geometric dimensioning and tolerancing (GD&T) parameters, geometric set (GS) parameters, product and manufacturing information (PMI) parameters, model-based definition (MBD) parameters, and/or any other type of information that may be used to construct a 2D drawing from a 3D model.

In some embodiments, the stored parameters for each view of the 2D drawing are represented as hidden geometry (e.g., hidden lines, callout shapes, section lines, detail views, etc.) and/or text (e.g., dimensions, tolerances, annotations, etc.) in a view plane of the 3D model parallel to the corresponding view. When a 2D drawing is created from the 3D model, the hidden geometry and/or text may be rendered and overlaid with the geometry of the part or assembly in the corresponding view of the 2D drawing.

In some embodiments, the 3D model is modified to include the stored view parameters and other drawing parameters used to reconstruct one or more 2D drawings. Other drawing parameters stored in the 3D model may include, for example, location parameters defining a relative location of each view in the 2D drawing (e.g., a spacing between views), template parameters (e.g., a paper size, a drawing format, a layout template, etc.), table parameters (e.g., a title block format, tabular data, etc.) and/or other general information that can be used to generate the 2D drawing from the 3D model.

Figure 1:
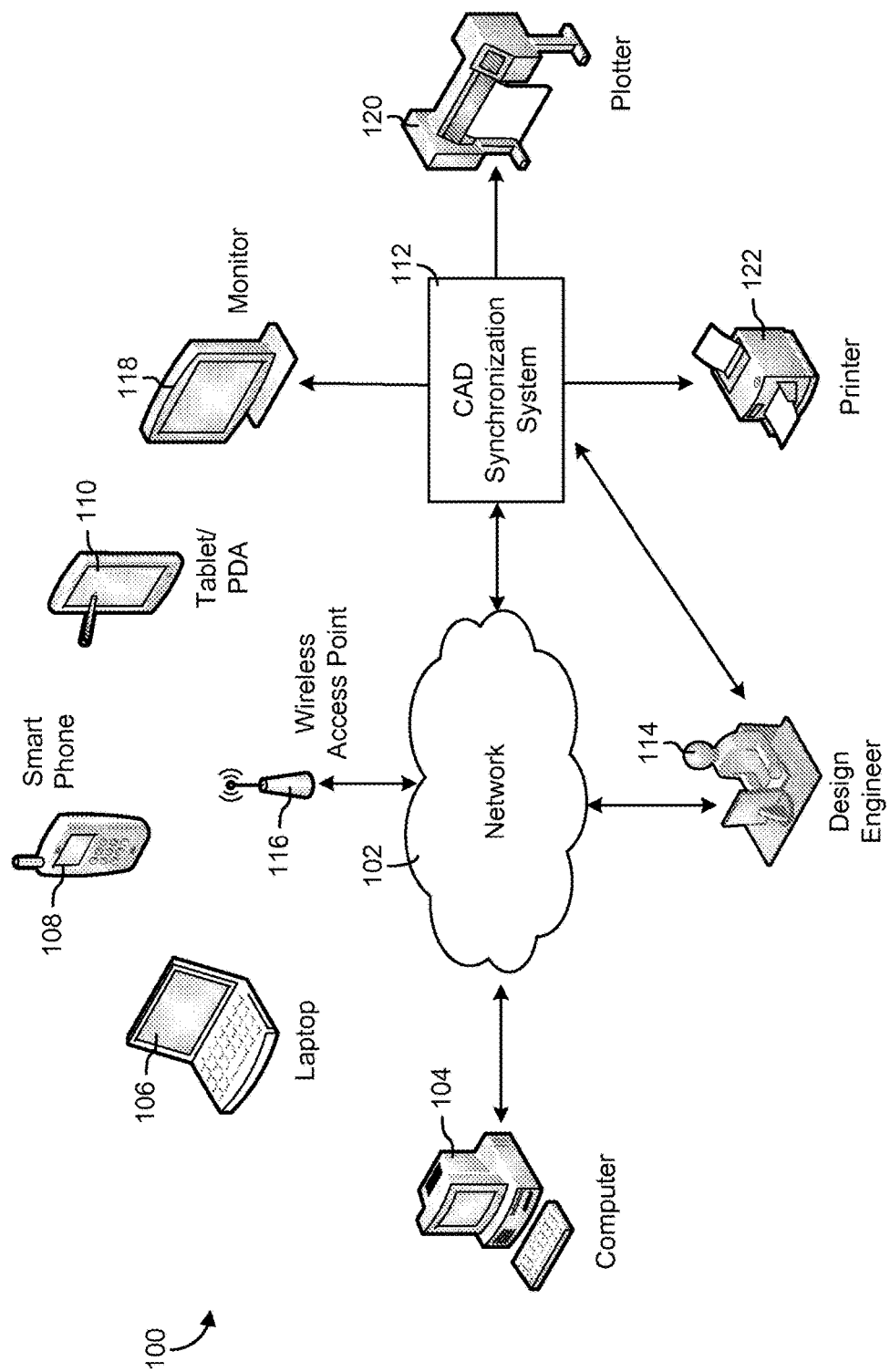
FIG. 1 is a block diagram of a computer system including a CAD synchronization system, according to an exemplary embodiment.

Referring now to FIG. 1, a diagram of a computer system 100 is shown, according to an exemplary embodiment. Computer system 100 illustrates an exemplary environment in which the systems and methods of the present disclosure may be implemented. Computer system 100 is shown to include a communications network 102, a design engineer 114, and various electronic devices (e.g., a computer 104, a laptop 106, a smart phone 108, a tablet/PDA 110, a CAD synchronization system 112, etc.).

Network 102 may include any type of computer network such as local area networks (LAN), wide area networks (WAN), cellular networks, satellite networks, radio networks, the Internet, or any other type of data network. Network 102 may include any number of computing devices (e.g., computers, servers, routers, network switches, etc.) configured to transmit, receive, or relay data. Network 102 may further include any number of hardwired and/or wireless connections. For example, laptop 106, smart phone 108, and tablet/PDA 110 may communicate wirelessly (e.g., via WiFi, cellular, radio, etc.) with a wireless access point 116 (e.g., a wireless transceiver) that is hardwired (e.g., via a fiber optic cable, a CAT5 cable, etc.) to a computing device of network 102.

Network 102 may facilitate electronic data communications between design engineer 114, CAD synchronization system 112, and electronic devices 104-110. For example, design engineer 114 may create a 3D CAD model of a part or assembly using 3D modeling software. The 3D CAD model may be provided from design engineer 114 to CAD synchronization system 112 directly or via network 102. CAD synchronization system 112 may generate a 2D drawing from the 3D model. In some embodiments, CAD synchronization system 112 provides the 2D drawing in an electronic form back to design engineer 114 or to another entity (e.g., a manufacturer, a project supervisor, etc.) for review and/or approval. In some embodiments, CAD synchronization system 112 displays the 2D drawing via monitor 118 or prints the 2D drawing using plotter 120 and/or printer 122. Monitor 118, plotter 120, and printer 122 may be connected with CAD synchronization system 112 directly (as shown in FIG. 1) or via network 102.

Still referring to FIG. 1, CAD synchronization system 112 may receive an input 3D CAD model from design engineer 114 (e.g., directly or via network 102). The input 3D CAD model may include part geometry data (e.g., lines, surfaces, shapes, splines, points, etc.) from which the solid surfaces and components of the modeled part or assembly can be constructed. CAD synchronization system 112 may generate a set of standard views of the 3D model (e.g., a front view, a right view, a left view, a back view, a top view, a bottom view, an isometric view, etc.). The standard views may be created automatically by CAD synchronization system 112 based on a front view selected or defined by a user.

CAD synchronization system 112 may use the standard views to construct a preview of a 2D drawing. The preview of the 2D drawing may allow design engineer 114 to add or remove views from the 2D drawing, adjust a spacing between views, define additional views (e.g., detail views, sectional views, etc.), and/or adjust content (e.g., annotations, geometry, tolerances, etc.) for each view. CAD synchronization system 112 may load additional parts and add views of the additional parts to the 2D drawing. In some embodiments, CAD synchronization system 112 generates tabular data and adds the tabular data to the 2D drawing. In various embodiments, the tabular data may be automatically populated, entered by a user, or generated from a template.

Advantageously, CAD synchronization system 112 may store all of the information added to the 2D drawing as parameters of the 3D model. In some embodiments, CAD synchronization system 112 modifies the input 3D CAD model to include drawing information for the 2D drawing. Drawing information may include parameters for various views (e.g., orthogonal views, an isometric view, detail views, sectional views, auxiliary views, etc.) as well as drawing template information. The stored parameters for each view may define how the view is depicted in the 2D drawing. For example, the stored parameters may define hidden geometry (e.g., hidden lines, callout shapes, section lines, detail views, etc.) and/or text (e.g., dimensions, tolerances, annotations, etc.) in a view plane of the 3D model parallel to the corresponding view. Template information may define a relative location of each view in the 2D drawing (e.g., a spacing between views), a paper size, a drawing format, a layout template, a title block format, or other general information used to generate the 2D drawing from the 3D model.

CAD synchronization system 112 may generate and store an output 3D CAD model having the added drawing information (e.g., the view parameters, the template parameters, other drawing information, etc.). In some embodiments, the output CAD model includes one or more links to other drawings, other part files, or other assemblies. The links may define a view of another part or assembly that is included in the 2D drawing. In some embodiments, the output CAD model includes multiple different sets of drawing parameters. For example, the output CAD model may include a different set of parameters for each 2D drawing that can be reconstructed from the 3D model.

CAD synchronization system 112 may be configured to reconstruct a 2D drawing using only the information included in a stored 3D model. For example, CAD synchronization system 112 may load a saved 3D model having saved drawing parameters. CAD synchronization system 112 may use the saved drawing parameters to build a drawing format, recreate and position views of the 3D model, resolve saved drawing links and load views of other parts, position the views of the other parts, explode and locate saved tables, and/or determine a hatching for various zones of the 3D model. CAD synchronization system 112 may render hidden geometry and/or text defined by the parameters for each view (e.g., annotations, dimensions, tolerances, section lines, callout lines, etc.) and overlay the rendered content with the geometry of the part in the 2D drawing.

Figure 2:
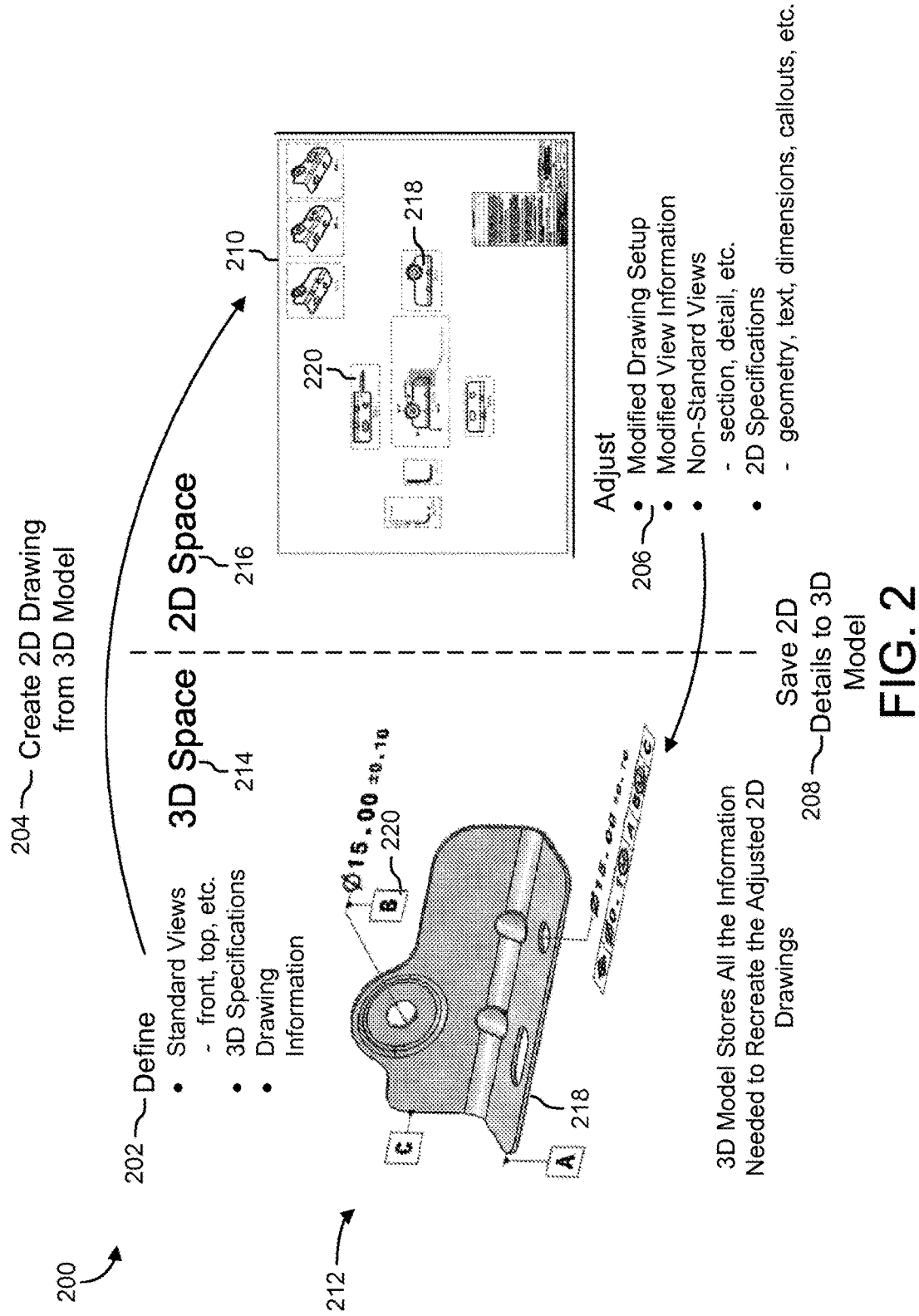
FIG. 2 is a flow diagram illustrating a process that may be performed by the CAD synchronization system of FIG. 1 for synchronizing 3D CAD models with 2D drawings, according to an exemplary embodiment.

Referring now to FIG. 2, a flow diagram 200 illustrating a process for synchronizing 3D CAD models with 2D drawings is shown, according to an exemplary embodiment. In some embodiments, the process shown in FIG. 2 is performed by CAD synchronization system 112. Flow diagram 200 is shown to include a 3D space 214 including a 3D CAD model 212. 3D CAD model 212 may be created by design engineer 114 in 3D space 214 using 3D CAD modeling software, as described with reference to FIG. 1. 3D CAD model 212 is shown to include solid surfaces 218 and drawing information 220. Solid surfaces 218 may define a physical geometry of the modeled part. Drawing information 220 may include, for example, product and manufacturing information (PMI), geometric dimensioning and tolerancing (GD&T) information, functional tolerancing and annotations (FT&A), and/or other information used to generate a 2D drawing from 3D CAD model 212. Drawing information 220 may be stored as properties or parameters of 3D CAD model 212.

Flow diagram 200 is shown to further include a 2D space 216 including a 2D drawing 210. 2D drawing 210 may be a formal 2D drawing (e.g., a GD&T drawing) of the part represented in 3D model 212. 2D drawing 210 is shown to include a plurality of views (e.g., a front view, a top view, a bottom view, a left view, a right view, a rear view, an isometric view, etc.) of 3D CAD model 212. Each view depicts the solid surfaces 218 from a different perspective and includes a portion of drawing information 220. 2D drawing 210 may be generated by CAD synchronization system 112 using 3D CAD model 212. In some embodiments, a portion of drawing information 220 is added in 2D space 216 and subsequently stored in 3D CAD model 212.

The synchronization process illustrated in FIG. 2 is shown to include defining parameters of 3D CAD model 212 in 3D space 214 (step 202). Step 202 may include defining standard views (e.g., a front view, a top view, a bottom view, a left view, a right view, a rear view, an isometric view, etc.), 3D specifications (e.g., FT&A parameters, part geometry data, etc.), and drawing information (e.g., PMI). Defining standard views may include prompting a user to select or define one view (e.g., a front view) and automatically generating a plurality of orthogonal views based on the user-selected view.

Still referring to FIG. 2, the synchronization process is shown to include creating 2D drawing 210 from 3D model 212 (step 204) and adjusting 2D drawing 210 (step 206). Step 204 may include depicting CAD model 212 from each of the standard views defined in step 202. Step 206 may include modifying the drawing setup (e.g., adjusting a spacing between the depicted views, adding tabular data, etc.), modifying the view information (e.g., adding or removing views), adding non-standard views (e.g., sectional views, detail views, etc.), and/or adding 2D specifications. 2D specifications may include, for example, geometry (e.g., lines, shapes, etc.), text, dimensions, callouts, and other specifications shown in 2D drawing 210. In some embodiments, 2D specifications include GD&T annotations.

The synchronization process shown in FIG. 2 is shown to include saving 2D details to 3D model 212 (step 208). 2D details may include any information added to 2D drawing 210 in step 206. After performing step 206, 2D drawing 210 may be more descriptive than 3D CAD model 212. Step 208 synchronizes 3D CAD model 212 with 2D drawing 210 by modifying CAD model 212 to include the changes made to 2D drawing 210. In some embodiments, step 208 includes storing the 2D specifications for each view of 2D drawing 210 as hidden text or geometry in a view plane parallel to the corresponding view. For example, drawing information 220 is shown in FIG. 2 at multiple different orientations in 3D space 214. Each of the different orientations corresponds (e.g., is parallel) to a view plane for one of the views depicted in 2D drawing 210.

Advantageously, 3D CAD model 212 may store all of the information needed to recreate the adjusted 2D drawing 210. Other data not explicitly shown in 3D space 214 may be stored as parameters of 3D CAD model 212. For example, 3D CAD model 212 may store a page size, a drawing format, tabular data, links to other parts or views, a drawing format, spacing between views, or other information used to reconstruct 2D drawing 210. In some embodiments, reconstructing 2D drawing 210 includes repeating step 204.

Drawing information 220 can be selectively hidden and unhidden when generating 2D drawing 210 from 3D CAD model 212. For example, when generating the front view depicted in 2D drawing 210, all of drawing information 220 may be hidden except for the portion of drawing information 220 corresponding to the front view. Each remaining view shown in 2D drawing 210 may be recreated in a similar fashion by selectively hiding all of drawing information 220 except for the portion of drawing information 220 corresponding to the view. Solid surfaces 218 may remain visible for view reconstructions, resulting in the views shown in 2D drawing 210. Other information such as page size, table data, view spacing, etc. may be retrieved from CAD model 212 and used to reconstruct 2D drawing 210.

Figure 3:
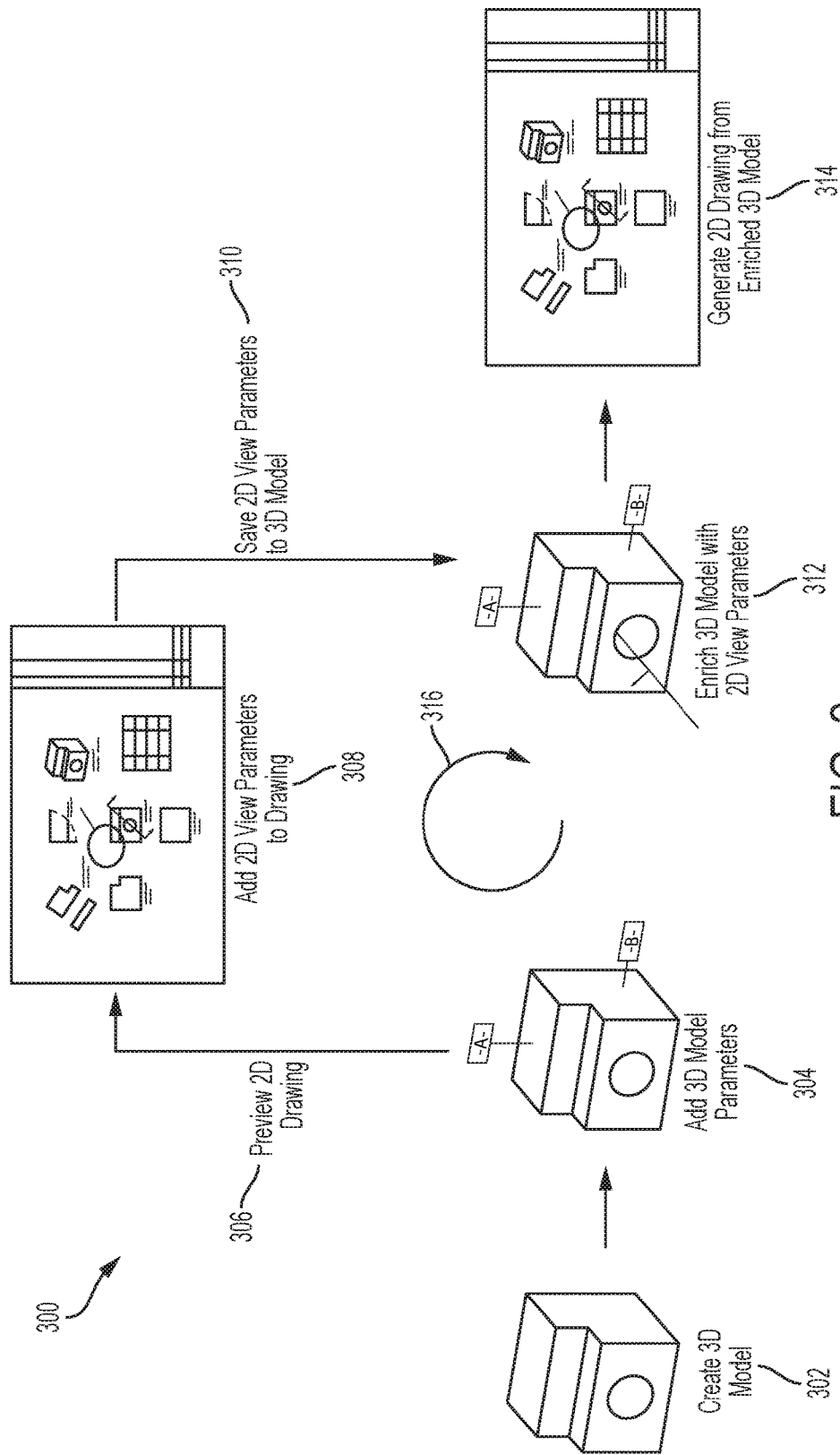
FIG. 3 is flow diagram illustrating another process that may be performed by the CAD synchronization system of FIG. 1 for synchronizing 3D CAD models and 2D drawings, according to an exemplary embodiment.

Referring now to FIG. 3, a flow diagram illustrating another process 300 for synchronizing 3D CAD models and 2D drawings is shown, according to an exemplary embodiment. Process 300 may be performed by CAD synchronization system 112, as described with reference to FIG. 1. Process 300 is shown to include creating a 3D model (step 302). The 3D model may be a 3D CAD model of a part or assembly and may be created using CAD modeling software. In various embodiments, step 302 may include creating a CAD model or receiving a pre-created CAD model.

Process 300 is shown to include adding 3D model parameters to the 3D model (step 304). 3D model parameters may include, for example, FT&A parameters, PMI parameters, and/or other parameters used to describe the geometry or structure of the 3D model. In some embodiments, 3D model parameters include standard view parameters defining one or more standard views of the 3D model (e.g., orthogonal views, an isometric view, etc.). The 3D model parameters may be stored as properties of the 3D model.

Still referring to FIG. 3, process 300 is shown to include previewing the 2D drawing (step 306) and adding 2D view parameters to the drawing (step 308). Previewing the 2D drawing may include generating a view of the 3D model for each of the standard views created in step 304. Adding 2D view parameters to the drawing may include adding spacing information between the generated views, adding or adjusting GD&T annotations, adding tabular data, setting a paper size, selecting a drawing template, selecting a drawing format, and/or setting other parameters of the 2D drawing.

Process 300 is shown to include saving the 2D view parameters to the 3D model (step 310) and enriching the 3D model with the 2D view parameters (step 312). In some embodiments, steps 310 and 312 may be combined into a single step. Saving the 2D view parameters to the 3D model may include saving the 2D view parameters as attributes or properties of the 3D model. Each set of 2D view parameters may correspond to a particular view of the 2D drawing and may be stored as parameters of the corresponding view in the 3D model. Storing the 2D view parameters in the 3D model may enrich the 3D model. The enriched 3D model may include all of the information required to recreate the 2D drawing. Steps 302-312 are described in greater detail with reference to FIG. 4.

Still referring to FIG. 3, process 300 is shown to include generating a 2D drawing from the enriched 3D model (step 314). Step 314 may include recalling the stored 2D view parameters from within the 3D model and using the stored 2D view parameters to recreate the 2D drawing. Recreating the 2D drawing may include using the stored 2D view parameters to automatically select (e.g., by CAD synchronization system 112) a drawing format, a paper size, a drawing template, or other general properties of the 2D drawing. Step 314 may include using the stored 2D parameters to identify the stored views (e.g., standard views, auxiliary views, sectional views, detail views, etc.), links to other parts or views of other parts, stored tabular data, and/or other information included in the 2D drawing. Step 314 is described in greater detail with reference to FIG. 5. In some instances, one or more steps of process 300 may be repeated iteratively (as indicated by iteration arrow 316) until the output 2D drawing is ready for release.

Figure 4:
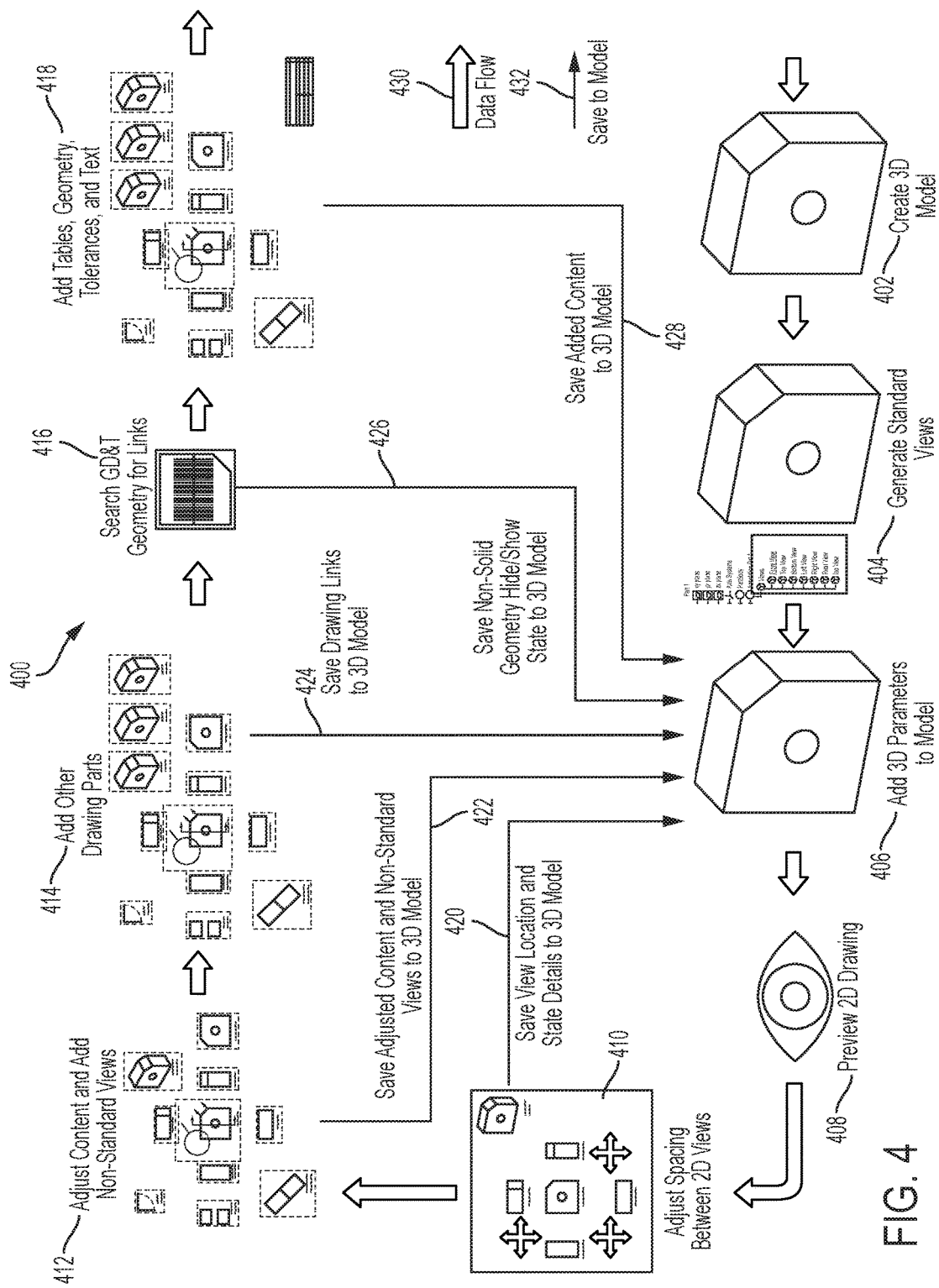
FIG. 4 is flow diagram illustrating another process that may be performed by the CAD synchronization system of FIG. 1 for synchronizing 3D CAD models and 2D drawings, according to an exemplary embodiment.

Referring now to FIG. 4, a flow diagram of another process 400 for synchronizing 3D models and 2D drawings is shown, according to an exemplary embodiment. Process 400 may be performed by CAD synchronization system 112, as described with reference to FIG. 1. Process 400 is shown to include two different data flows 430 and 432. Data flow 430 (represented by a relatively thicker arrow) illustrates the flow of data from the 3D model to the 2D drawing. Data flow 432 (represented by a relatively thinner arrow) illustrates the flow of data from the 2D drawing back to the 3D model. Process steps 402-418 are components of data flow 430, whereas steps 420-428 are components of data flow 432.

Process 400 is shown to include creating a 3D model (step 402). The 3D model may be a 3D CAD model of a part or assembly and may be created using CAD modeling software. In various embodiments, step 402 may include creating a CAD model or receiving a pre-created CAD model.

Still referring to FIG. 4, process 400 is shown to include generating standard views of the 3D model (step 404). Standard views may include a front view, a right view, a left view, a top view, a bottom view, a rear view, and an isometric view of the 3D model. In some embodiments, step 404 includes prompting a user to select or define one of the standard views (e.g., the front view) and automatically generating each of the remaining views from the selected view (e.g., by rotating the 3D model by a predetermined amount in a predetermined direction from the front view). The standard views may be created in the 3D space and saved as properties of the 3D model.

Process 400 is shown to include adding 3D parameters to the model (step 406). 3D parameters may include, for example, FT&A parameters, PMI parameters, and/or other parameters used to describe the geometry or structure of the 3D model. The 3D parameters may be stored as properties or data assets of the 3D model.

Still referring to FIG. 4, process 400 is shown to include previewing the 2D drawing (step 408) and adjusting a spacing between 2D views (step 410). Previewing the 2D drawing may include generating a view of the 3D model for each of the standard views created in step 404. Adjusting a spacing between 2D views may include moving one or more of the standard views relative to the other standard views in the 2D drawing. In some embodiments, step 410 includes selecting or marking one or more of the standard views to be included or excluded from the 2D drawing.

Process 400 is shown to include adjusting content and adding non-standard views to the 2D model (step 412). Step 412 may include adding or adjusting GD&T annotations, setting a paper size, selecting a drawing template, selecting a drawing format, and/or setting other parameters of the 2D drawing. In some embodiments, step 412 includes defining non-standard views (e.g., sectional views, detail views, etc.) based on one or more of the standard views. Sectional views may be defined by adding view planes to one or more of the standard views in the 2D drawing. Detail views may be defined by selecting a portion of one or more of the standard views in the 2D drawing. Non-standard views may be derived views added to any existing view of the 2D drawing. Step 412 may include locating or positioning the non-standard views relative to the standard views in the 2D drawing.

Still referring to FIG. 4, process 400 is shown to include adding other drawing parts to the 2D drawing (step 414). Step 414 may include inserting a view of another part or assembly in the 2D drawing. The inserted view may be a view of another 3D model and/or a portion of another 2D drawing previously created. Step 414 may include prompting a user to select an existing 2D drawing or another 3D model stored in memory. The inserted view may be any standard view or non-standard view of the other 3D model. In some embodiments, multiple additional drawing parts may be inserted in step 414. If multiple additional drawing parts are inserted, the multiple drawing parts may be different views of the same drawing or 3D model, the same view of different drawings or 3D models (e.g., isometric views of different 3D models, as shown in FIG. 4), or different views of different drawings or 3D models.

Process 400 is shown to include searching geometric dimensioning and tolerancing (GD&T) geometry for links (step 416) and adding tables, geometry, tolerances, and text (step 418). Step 416 may include editing overload properties of the 3D model to hide or show the model. If a functional tolerancing and annotations (FTA) view with GD&T is available, step 416 may include scanning the GD&T data to detect surfaces or zones of the 3D model and hatching the corresponding area of each 2D view for detected zones. Step 418 may include adding 2D tables to the 2D drawing. The information contained in the 2D tables may be a function of the template or format of the drawing. Step 418 may include adding non-solid geometry, dimensions, tolerancing information, and/or other text to the 2D drawing. The content added in step 418 may include content that is not originally part of the 3D model.

Still referring to FIG. 4, process 400 is shown to include saving data from the 2D drawing back to the 3D model (steps 420-428). Steps 420-428 may be performed to synchronize the 3D model with the more detailed information added to the 2D drawing in steps 410-418. The types of information saved back to the 3D model may include view location and state details (step 420), adjusted content and non-standard views (step 422), drawing links (step 424), non-solid geometry hide/show states (step 426), and/or tables, geometry, tolerances, and other text (step 428). Steps 420-428 may be performed at any time during process 400 after the corresponding data is updated in the 2D drawing.

Steps 420-428 may produce an enhanced 3D model that can be used to recreate the 2D drawing generated by process 400. The enhanced 3D model may be saved or stored in memory for use in recreating the 2D drawing.

Figure 5:
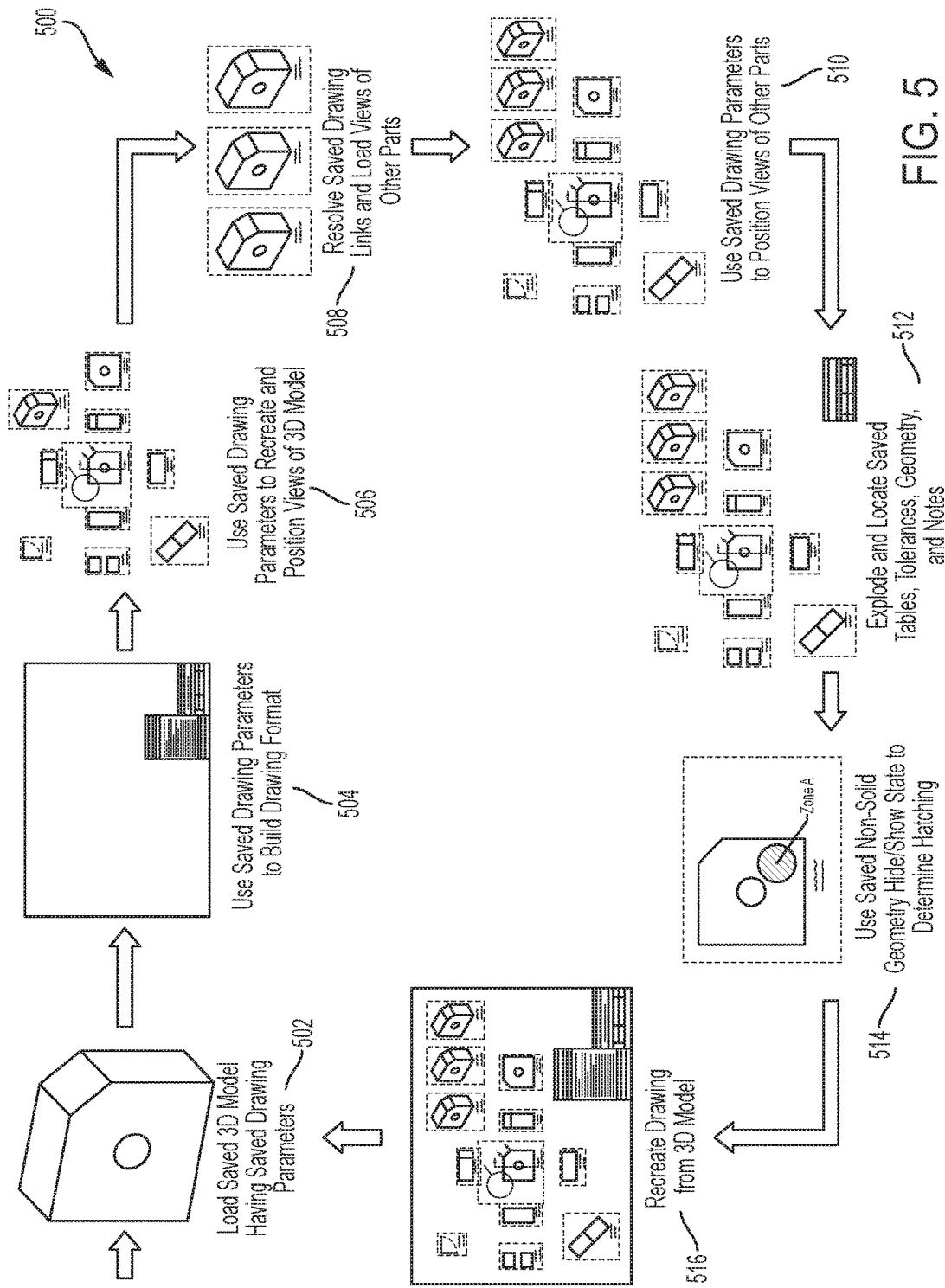
FIG. 5 is a flowchart of a process that may be performed by the CAD synchronization system of FIG. 1 for recreating a 2D drawing from an enhanced 3D model, according to an exemplary embodiment.

Referring now to FIG. 5, a flowchart of a process 500 for recreating a 2D drawing from an enhanced 3D model is shown, according to an exemplary embodiment. Process 500 is shown to include loading a saved 3D model having saved drawing parameters (step 502). Step 502 may include retrieving from memory the enhanced 3D model generated using process 400. The drawing parameters included in the enhanced 3D model may include view parameters defining standard and/or non-standard views, location parameters defining the relative locations of each defined view in the 2D drawing, links to other drawings or 3D models defining one or more auxiliary views of the 2D drawing, location parameters defining the relative locations of each auxiliary view in the 2D drawing, saved tables or tabular data, non-solid geometry, hatching, and/or other information that can be used to reconstruct the 2D drawing.

Process 500 is shown to include using the saved drawing parameters to build a drawing format (step 504) and to recreate and position views of the 3D model (step 506). The drawing format may include a drawing size (e.g., a height and width of the 2D drawing sheet), a table format or position, and/or various formatting parameters (e.g., font size, font face, view size, etc.). Positioning views of the 3D model may include locating each view defined by the 3D model in a particular location on the drawing sheet.

Still referring to FIG. 5, process 500 is shown to include resolving saved drawing links and loading views of other drawing parts (step 508) and using the saved drawing parameters to position the views of the other drawing parts (step 510). Resolving saved drawing links may include parsing a saved link to determine a file location of a 3D model or 2D drawing identified by the link. The identified 3D model or 2D drawing may be used to import or generate a drawing view of another part or assembly. Positioning views of the other drawing parts may include locating each view defined by the drawing links relative to the other views included in the 2D drawing.

Process 500 is shown to include exploding and locating saved tables, tolerances, geometry, and notes (step 512). Exploding the saved tables may include using the saved drawing parameters to determine the content of one or more tables in the 2D drawing. Locating the saved tables may include positioning the tables on the drawing sheet and/or relative to the views included in the 2D drawing. Locating saved tolerances, geometry, and notes may include retrieving non-solid geometry, textual annotations, dimensions, and other notes that were added to the 2D drawing and saved back to the 3D model.

Still referring to FIG. 5, process 500 is shown to include using saved non-solid geometry hide/show state to determine hatching (step 514) and recreating the 2D drawing from the 3D model (step 516). Step 514 may include hatching all visible zones in the 2D drawing. A zone may be defined as a surface feature pointed to by an FT&A annotation. Step 516 may include combining the results of steps 502-514 to recreate the 2D drawing. Advantageously, the 2D drawing may be recreated exclusively from the 3D model, without relying on input from other data sources and without requiring human intervention. This allows process 500 to be fully automated, thereby saving time, effort, and reducing the potential for errors in translating a 3D model into a 2D drawing.

Figure 6:
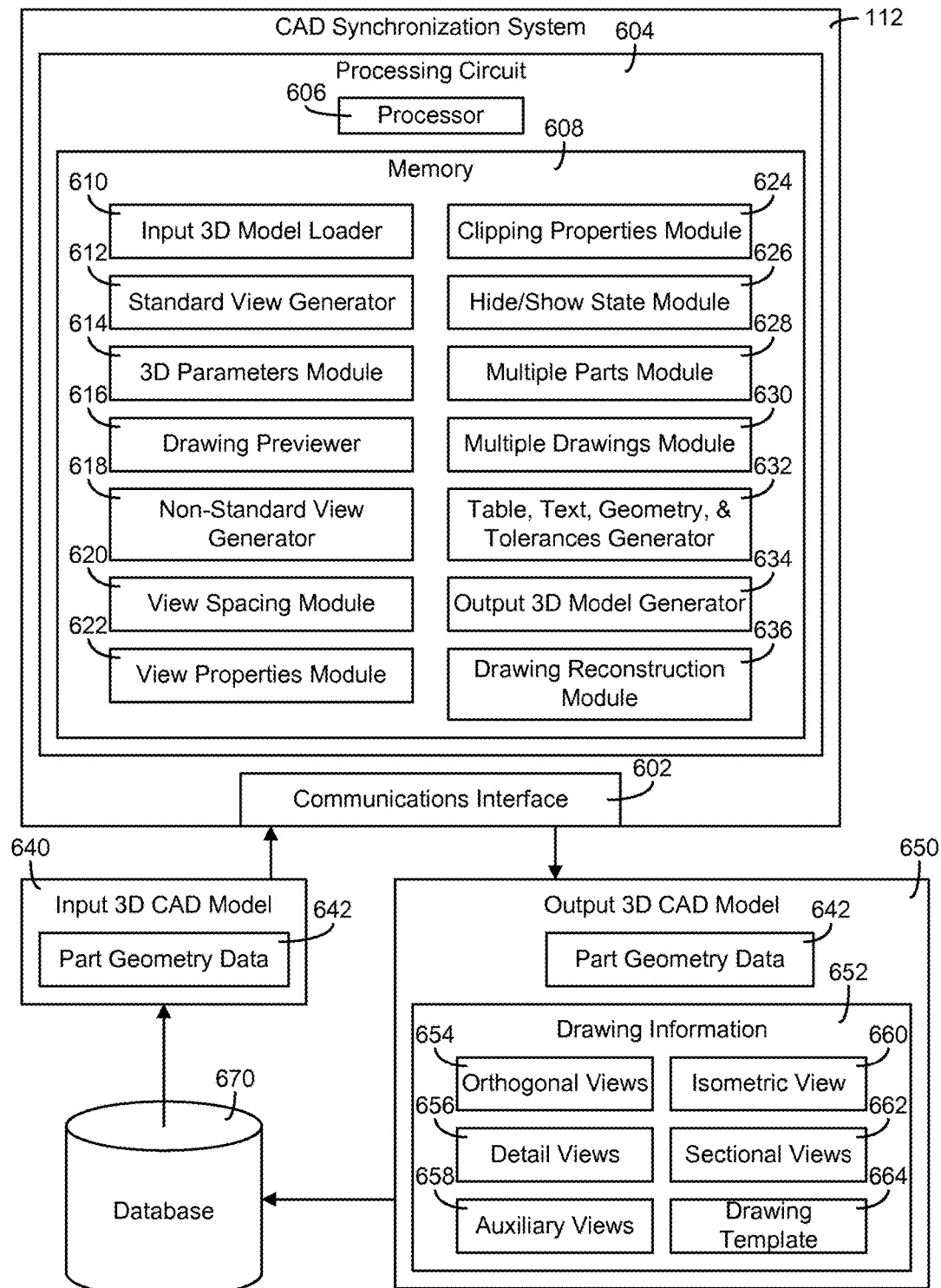
FIG. 6 is a block diagram illustrating the CAD synchronization system of FIG. 1 in greater detail is shown, according to an exemplary embodiment.

Referring now to FIG. 6, a block diagram illustrating CAD synchronization system 112 in greater detail is shown, according to an exemplary embodiment. CAD synchronization system 112 is shown to include a communications interface 602 and a processing circuit 604. Communications interface 602 may include wired or wireless interfaces (e.g., jacks, antennas, transmitters, receivers, transceivers, wire terminals, etc.) for conducting electronic data communications with various systems, devices, or networks. For example, communications interface 602 may include an Ethernet card and port for sending and receiving data via an Ethernet-based communications network. In another example, communications interface 602 includes a WiFi transceiver for communicating via a wireless communications network. Communications interface 602 may be configured to communicate via local area networks or wide area networks (e.g., the Internet, a building WAN, etc.).

Communications interface 602 may be configured to communicate with network 102, design engineer 114, and/or electronic devices 114-110. Communications interface 602 may be configured to receive an input 3D CAD model 640 from a database 670 and/or via network 102 (e.g., from design engineer 114). CAD synchronization system 112 may process input 3D CAD model 640 and generate an output 3D CAD model 650. Communications interface 602 may send output 3D CAD model back to database 670 for storage or may distribute output 3D CAD model to various external systems or devices via network 102.

Still referring to FIG. 6, processing circuit 604 is shown to include a processor 606 and memory 608. Processor 606 may be a general purpose or specific purpose processor, an application specific integrated circuit (ASIC), one or more field programmable gate arrays (FPGAs), a group of processing components, or other suitable processing components. Processor 606 is configured to execute computer code or instructions stored in memory 608 or received from other computer readable media (e.g., CDROM, network storage, a remote server, etc.).

Memory 608 may include one or more devices (e.g., memory units, memory devices, storage devices, etc.) for storing data and/or computer code for completing and/or facilitating the various processes described in the present disclosure. Memory 608 may include random access memory (RAM), read-only memory (ROM), hard drive storage, temporary storage, non-volatile memory, flash memory, optical memory, or any other suitable memory for storing software objects and/or computer instructions. Memory 608 may include database components, object code components, script components, or any other type of information structure for supporting the various activities and information structures described in the present disclosure. Memory 608 may be communicably connected to processor 606 via processing circuit 604 and may include computer code for executing (e.g., by processor 606) one or more processes described herein. When processor 606 executes instructions stored in memory 608 for completing the various activities described herein, processor 606 generally configures CAD synchronization system (and more particularly processing circuit 604) to complete such activities.

Still referring to FIG. 6, memory 608 is shown to include an input 3D model loader 610. Input 3D model loader 610 may be configured to receive and load an input 3D CAD model 640. Input 3D CAD model 640 is shown to include part geometry data 642. Part geometry data 642 may include geometric data from which a modeled part or assembly can be constructed. For example, part geometry data 642 may include one or more lines, surfaces, shapes, splines, points, or other geometric features that define the structure and arrangement of a solid part or assembly. Part geometry data 642 may represent a solid part in 3D space. In some embodiments, input 3D CAD model 640 does not include any drawing-specific data.

Still referring to FIG. 6, memory 608 is shown to include a standard view generator 612. Standard view generator 612 may be configured to generate a set of standard views of 3D model 640. Standard views may include a front view, a right view, a left view, a top view, a bottom view, a rear view, and an isometric view of 3D model 640. In some embodiments, standard view generator 612 prompts a user to select or define one of the standard views (e.g., the front view).

Standard view generator 612 may automatically generate each of the remaining views based on the selected view. For example, standard view generator 612 may generate the right and left view by rotating 3D model 640 about a first axis (e.g., the x-axis). Standard view generator 612 may rotate 3D model 640 by 90 degrees in a first direction about a first axis (e.g., positive rotation about the x-axis) to generate one of the standard views (e.g., the right view). From the user-defined view, standard view generator 612 may rotate 3D model 640 by 90 degrees in a second direction opposite the first direction about the first axis (e.g., negative rotation about the x-axis) to generate another of the standard views (e.g., the left view).

Standard view generator 612 may generate the top, bottom, and rear views by rotating 3D model 640 about a second axis (e.g., the y-axis). For example, from the user-defined view, standard view generator 612 may rotate 3D model 640 by 90 degrees in a first direction about a second axis (e.g., positive rotation about the y-axis) to generate another of the standard views (e.g., the top view). From the user-defined view, standard view generator 612 may rotate 3D model 640 by 90 degrees in a second direction opposite the first direction about the second axis (e.g., negative rotation about the y-axis) to generate another of the standard views (e.g., the bottom view). From the user-defined view, standard view generator 612 may rotate 3D model 640 by 180 degrees in the second direction about the second axis (e.g., negative rotation about the y-axis) to generate another of the standard views (e.g., the back view).

Standard view generator 612 may generate the isometric view by rotating 3D model 640 about multiple axes (e.g., the x-axis and the y-axis). For example, from the user-defined view, standard view generator 612 may rotate 3D model 640 by approximately 15 degrees in the first direction about the first axis (e.g., positive rotation about the x-axis) and by approximately 15 degrees in the first direction about the second axis (e.g., positive rotation about the y-axis) to generate the isometric view.

Figure 7:
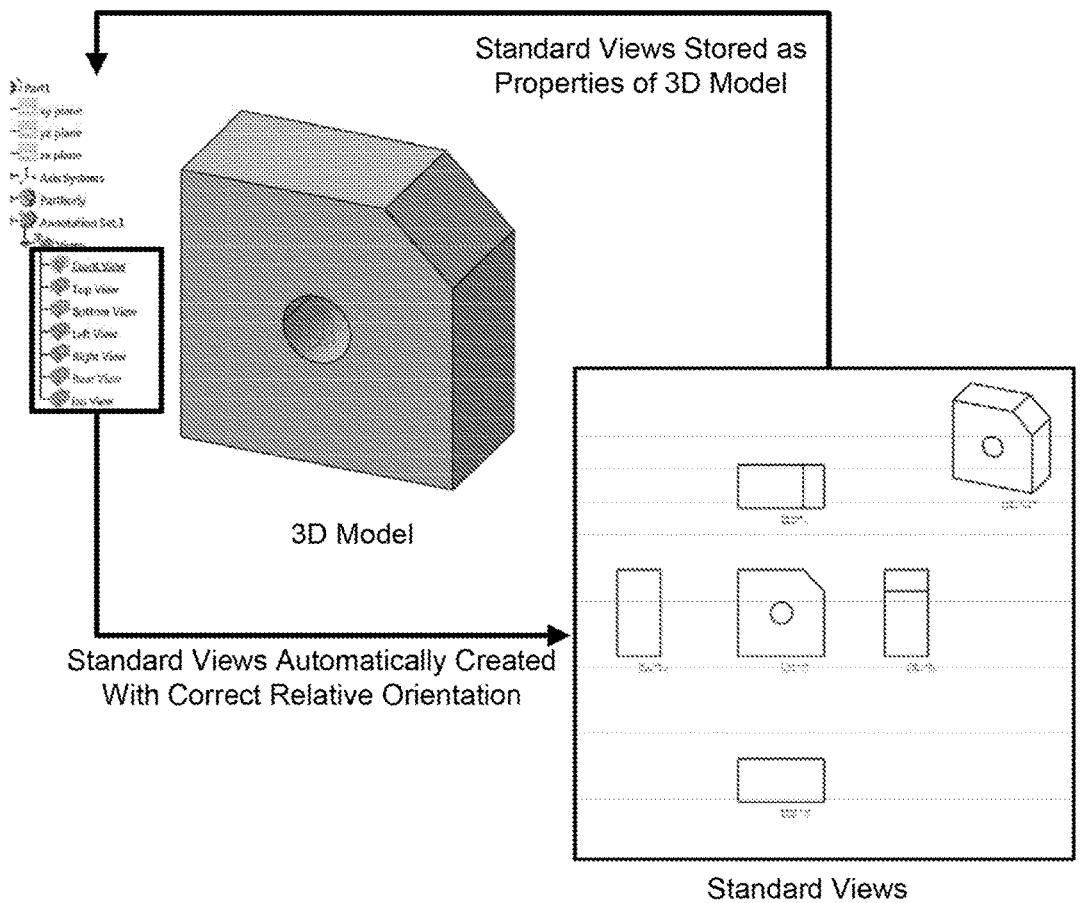
FIG. 7 is a drawing of various standard views and data structures that may be created by the CAD synchronization system of FIG. 1, according to an exemplary embodiment.

Standard view generator 612 may store each of the standard views as a data element of the 3D model. For example, standard view generator 612 may store each of the orthogonal views within orthogonal views data 654 and may store the isometric view within isometric view data 660. In some embodiments, each of the standard views is stored as a separate hierarchical node within a data hierarchy representing the 3D model. The views and data structures generated by standard view generator 612 are illustrated in FIG. 7.

Still referring to FIG. 6, memory 608 is shown to include a 3D parameters module 614. 3D parameters module 614 may be configured to add one or more 3D parameters to 3D model 640. 3D parameters may include, for example, FT&A parameters (e.g., tolerances, annotations, etc.), PMI parameters (e.g., material selection, material properties, manufacturing processes, etc.), and/or other parameters used to describe the geometry or structure of 3D model 640. 3D parameters may describe 3D CAD model 640 or the part or assembly represented by 3D CAD model 640. 3D parameters module 614 may store the 3D parameters as properties or data assets of the 3D model.

Still referring to FIG. 6, memory 608 is shown to include a drawing previewer 616. Drawing previewer 616 may be configured to generate a preview of a 2D drawing that can be generated from 3D model 640. The preview of the 2D drawing may include one or more of the standard views created by standard view generator 612. In some embodiments, the preview of the 2D drawing includes all of the standard views.

Drawing previewer 616 may automatically arrange the standard views relative to each other according to a predetermined standard for formal drawings. For example, drawing previewer 616 may arrange the standard views with the top view, bottom view, right view, and left view located respectively above, below, to the right, and to the left of the front view. In some embodiments, drawing previewer 616 positions the rear view to the right of the right view.

Drawing previewer 616 may generate a 2D drawing preview that includes the standard views. The drawing preview may illustrate the part represented by 3D model 640 from various perspectives. In some embodiments, the drawing preview does not include any hidden lines or supplemental GD&T features. An example of a drawing preview that may be generated by drawing previewer 616 is shown in FIG. 7.

Still referring to FIG. 6, memory 608 is shown to include a non-standard views generator 618. Non-standard views generator 618 may be configured to generate one or more non-standard views of 3D model 640. Non-standard views may include, for example, sectional views or detail views based on one or more of the standard views. Non-standard views generator 618 may provide a user interface through which a user can define non-standard views. For example, sectional views may be defined by drawing a sectional line through a standard view in the drawing preview generated by drawing previewer 616. Non-standard views generator 618 may use the location of the sectional line to define a sectional view plane in the 3D model. Non-standard views generator 618 may automatically generate a sectional view of the 3D model from the sectional view plane and add the sectional view to the 2D drawing preview.

Detail views may be defined by selecting a portion of one or more of the standard views in the drawing preview. Non-standard views generator 618 may use the selected portion of a standard view to automatically generate a detail view (e.g., having a larger scale) of the selected portion and add the detail view to the 2D drawing preview. Non-standard views generator 618 may create a non-solid geometric feature (e.g., a circle) and/or text annotations to identify the location of the detail view. Non-standard views generator 618 may add the non-solid geometric feature and/or text annotation to a view plane of the 3D model.

Non-standard views generator 618 may be configured to define and generate non-standard views from one or both of the 2D drawing preview and the 3D model. Generating a non-standard view from the 3D model may include providing a user interface through which a user can orient the 3D model to depict a desired non-standard view on screen. Non-standard views generator 618 may use the user-defined orientation of the 3D model to generate a view plane parallel to the on-screen view and add the view plane to the 3D model. Non-standard views generator 618 may automatically generate a view of the 3D model from the generated view plane and add the view to the 2D drawing preview.

Figure 9:
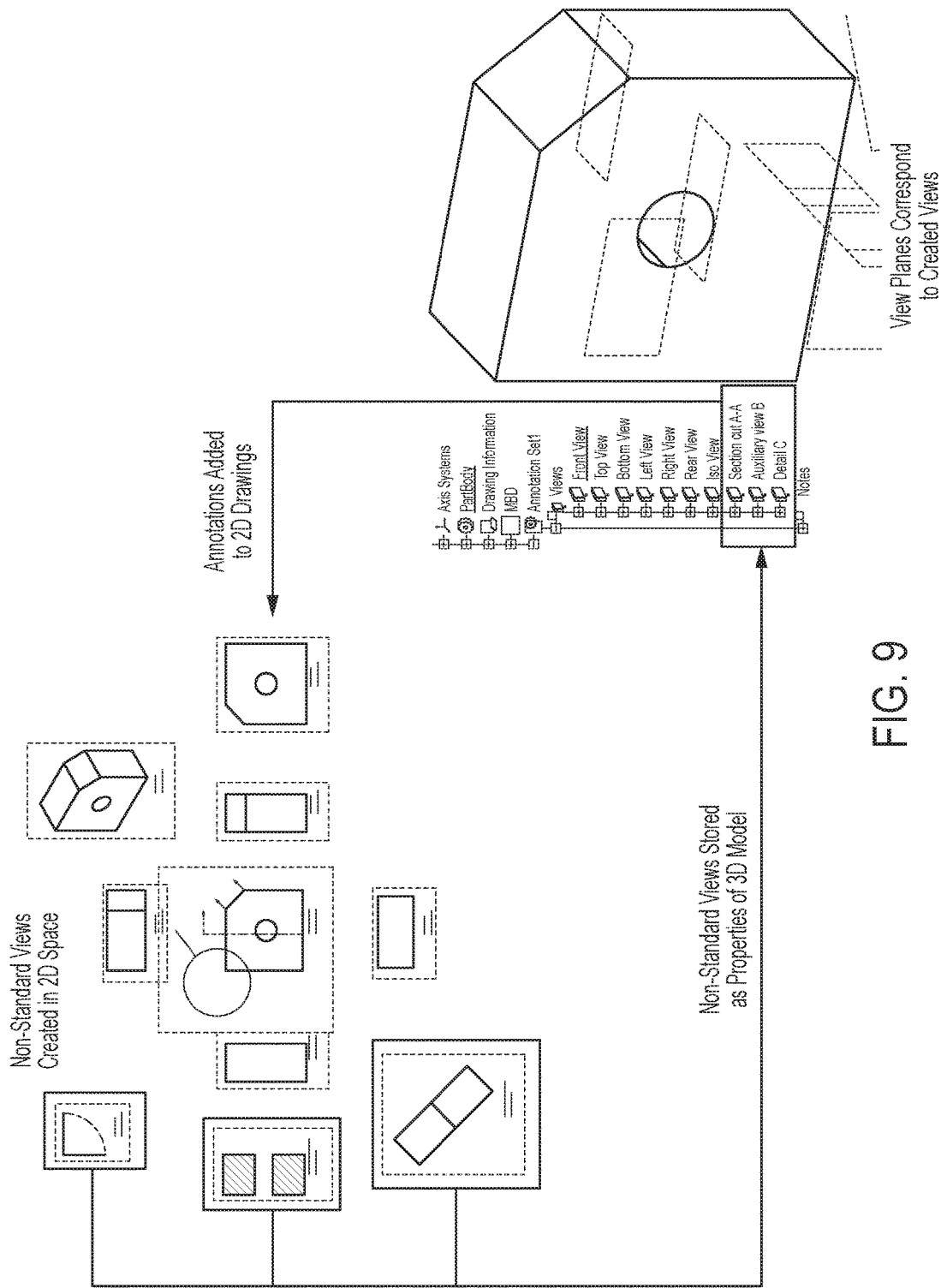
FIGS. 9-10 are drawings of several non-standard views and data structures that may be created by the CAD synchronization system of FIG. 1, according to an exemplary embodiment.
Figure 10:
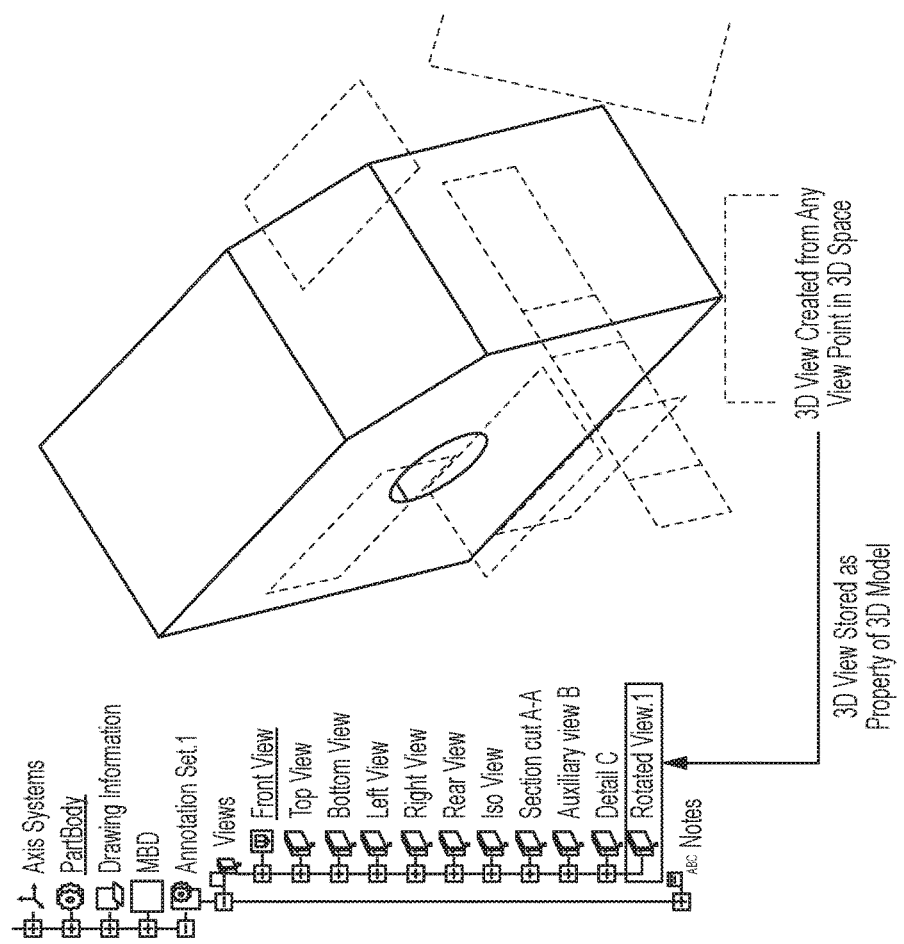

Non-standard view generator 618 may store each of the non-standard views as a data element of the 3D model. For example, non-standard view generator 618 may store each of the detail views within detail views data 656 and may store each of the sectional views within sectional view data 662. In some embodiments, each of the non-standard views is stored as a separate hierarchical node within a data hierarchy representing the 3D model. The views and data structures generated by non-standard view generator 618 are illustrated in FIGS. 9-10.

Figure 8:
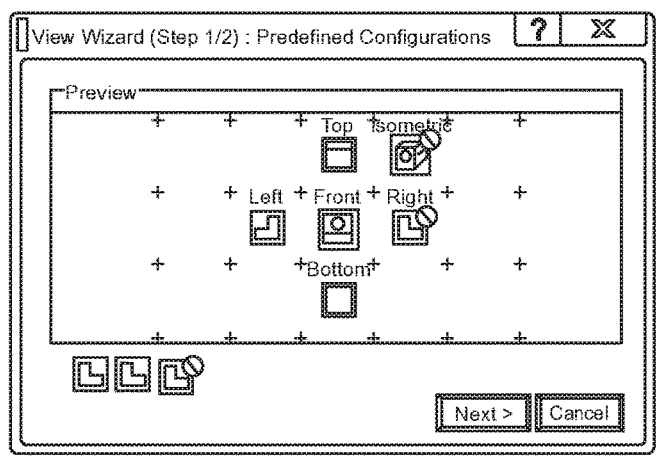
FIG. 8 is a drawing of a user interface that may be generated by the CAD synchronization system of FIG. 1 for controlling content and relative positioning of views in the 2D drawing, according to an exemplary embodiment.

Still referring to FIG. 6, memory 608 is shown to include a view spacing module 620. View spacing module 620 may be configured to adjust a spacing between the various views (e.g., standard views, non-standard views, etc.) of the 2D drawing preview. View spacing module 620 may move one or more of the views relative to the other views in the 2D drawing preview. In some embodiments, view spacing module 620 provides a user interface through which a user can define relative spacing between the views. In some embodiments, the user interface allows the user to select and/or mark one or more of the views to be included or excluded from the 2D drawing. An exemplary user interface that may be generated by view spacing module 620 is shown in FIG. 8.

Figure 12:
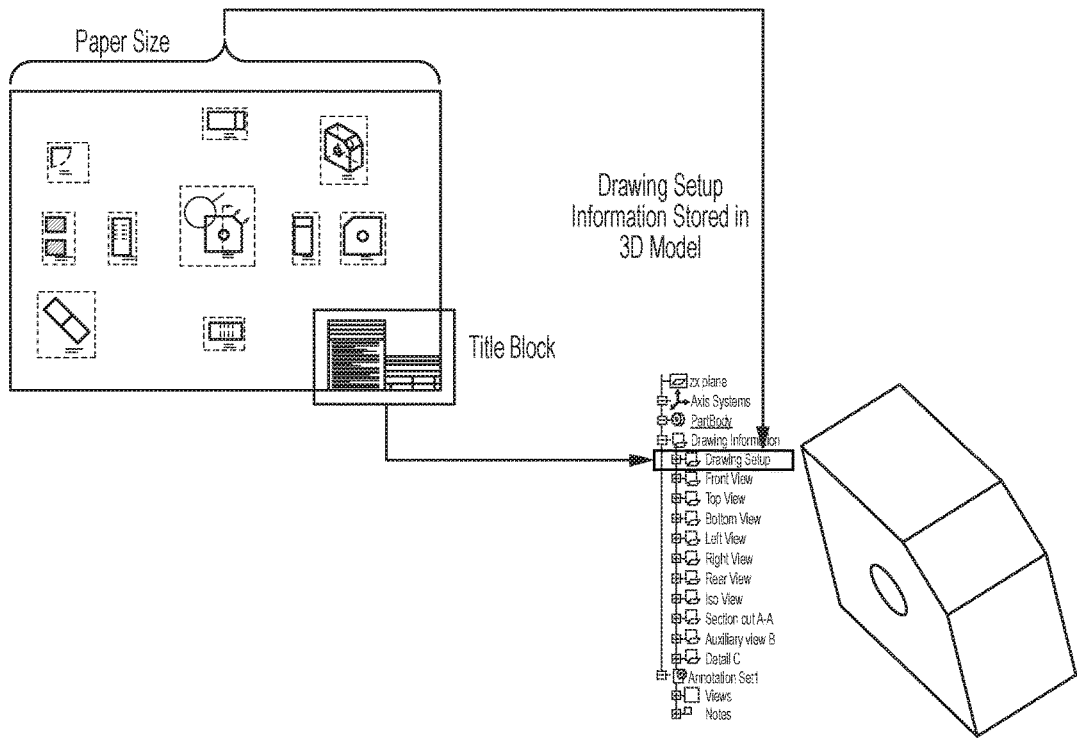
FIG. 12 is an illustration of drawing setup information (e.g., a title block, paper size, drawing standard, etc.) that may be generated the CAD synchronization system of FIG. 1, according to an exemplary embodiment.

View spacing module 620 may generate view location parameters representing the spacing and/or locations of the various views and store the view location parameters as a parameter of the 3D model. For example, view spacing module 620 may store the view location parameters within drawing template data 664. Drawing template data 664 may be a separate hierarchical node from each of the view nodes within the 3D model. The data structures generated by view spacing module 620 are illustrated in FIG. 12.

Still referring to FIG. 6, memory 608 is shown to include a view properties module 622. View properties module 622 may be configured to generate view parameters for each of the views included in the 2D drawing. The parameters generated by view properties module 622 may be referred to as view properties and may be stored as parameters of the 3D model. Each view (e.g., top, bottom, front, etc.) may have a separate set of view properties.

Figures 18, 19:
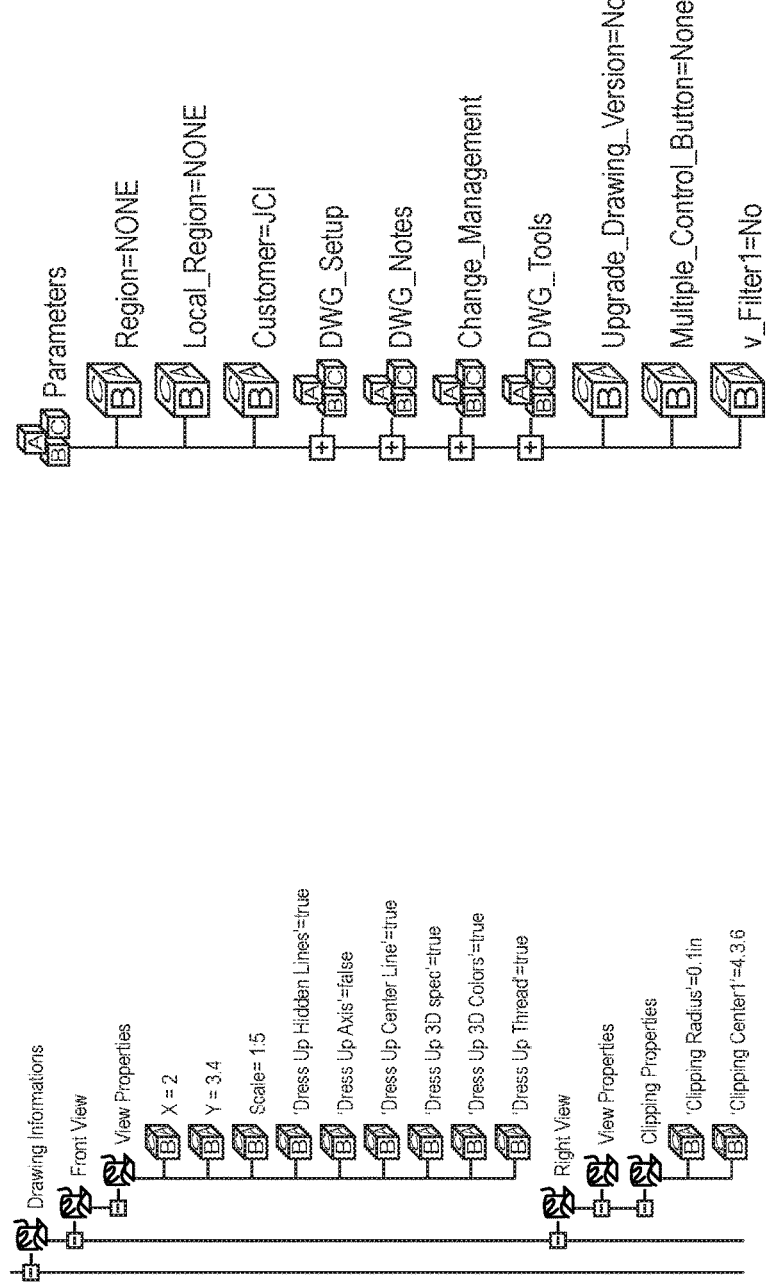
FIGS. 18-19 are drawings of hierarchical data structures that may be stored as components of a 3D model by the CAD synchronization system of FIG. 1, according to an exemplary embodiment.

View properties may include, for example, a view origin (e.g., coordinates defining a viewpoint or view plane), a scale (e.g., a size ratio indicating the size of the corresponding view in the 2D drawing relative to an actual size of the 3D model), an orientation (e.g., an angle of the view from the view origin), CATIA (Computer Aided Three-dimensional Interactive Application) dress-up features (e.g., hidden lines, axes, center lines, 3D spec, 3D colors, threads, filets, 3D points, and 3D wireframe), and/or a view generation mode (e.g., exact view, approximate view, perspective, no perspective, etc.). View properties module 622 may generate view properties for each view of the 2D drawing and store the view properties in the 3D model. In some embodiments, each set of view properties may be stored hierarchically within the corresponding view in the 3D model. A hierarchical representation of view properties is shown in FIG. 18.

Still referring to FIG. 6, memory 608 is shown to include a clipping properties module 624. Clipping properties module 624 may be configured to generate clipping parameters for each of the views included in the 2D drawing. The parameters generated by clipping properties module 624 may be referred to as clipping properties and may be stored as parameters of the 3D model. Each view (e.g., top, bottom, front, etc.) may have a separate set of clipping properties.

Clipping properties may define a portion of each view that is visible in the 2D drawing. Clipping can be applied to any existing view of the 2D drawing. Clipping properties may be stored inside the 3D model for each view having a clipping property. In some embodiments, clipping properties do not cause any visible modification to the 3D model. However, clipping properties may affect the portion of the 3D model that is represented in the 2D drawing. A hierarchical representation of clipping properties is shown in FIG. 18.

Still referring to FIG. 6, memory 608 is shown to include a hide/show state module 626. Hide/show state module 626 may control whether drawing information 220 is hidden or shown in the 3D model and/or the 2D drawing. Hide/show state module 626 may set a hide/show state for each feature of drawing information 220 to control whether the feature is hidden or shown. Features of drawing information 220 may include, for example, annotations, dimensions, tolerances, section lines, callout lines, and/or other non-solid features of the 3D model. As shown in FIG. 2, features of drawing information 220 may be located in view planes parallel to the corresponding view of the 2D drawing to which the feature applies.

Hide/show state module 626 may selectively hide or show various features of drawing information 220 when generating the 2D drawing from the 3D model. For example, when generating the front view, hide/show state module 626 may hide all of drawing information 220 except for the features corresponding to the front view (e.g., the features located on the front view plane). When generating each remaining view, hide/show state module 626 may selectively hide all of drawing information 220 except for the features corresponding to the view currently being generated. In this way, hide/show state module 626 may cause each view of the 2D drawing to include a subset of drawing information 220 (e.g., the features located on the corresponding view plane).

Still referring to FIG. 6, memory 608 is shown to include a multiple parts module 628. Multiple parts module 628 may be configured to generate views of other parts and/or assemblies and add the generated views to the 2D drawing. In some embodiments, multiple parts module 628 generates a user interface prompting a user to select an existing 2D drawing or another 3D model stored in memory. Multiple parts module 628 may be configured to identify or generate a view of the user-selected part or assembly. The view may be a standard or non-standard view of another 3D model or 2D drawing.

Figure 14:
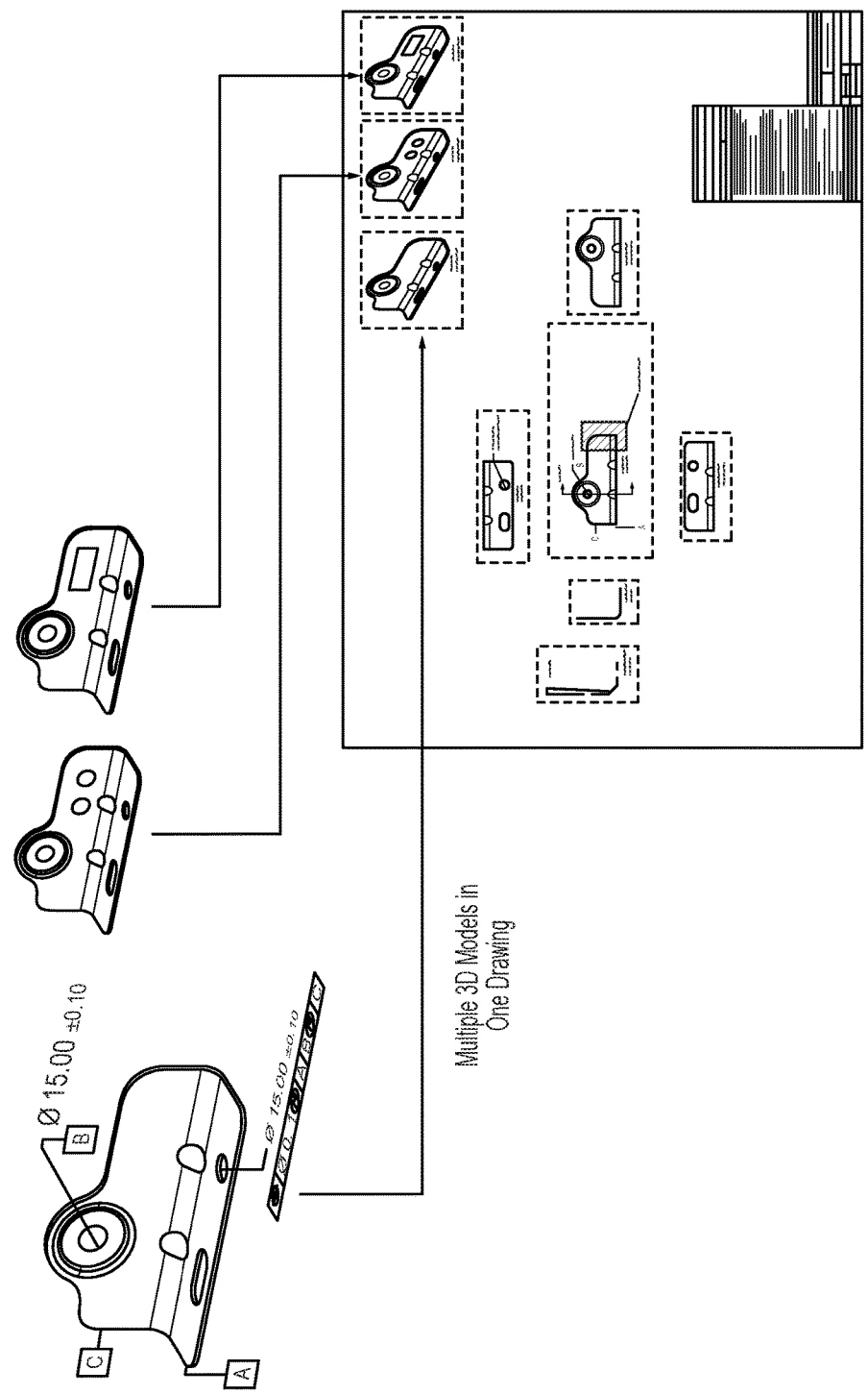
FIG. 14 is a drawing that may be generated by the CAD synchronization system of FIG. 1 with views from multiple different parts, according to an exemplary embodiment.

In some embodiments, multiple parts module 628 is configured to add multiple additional views to the 2D drawing. The multiple views may be different views of the same drawing or 3D model, the same view of different drawings or 3D models (e.g., isometric views of different 3D models), or different views of different drawings or 3D models. A drawing with views from multiple different parts is shown in FIG. 14.

Figure 15:
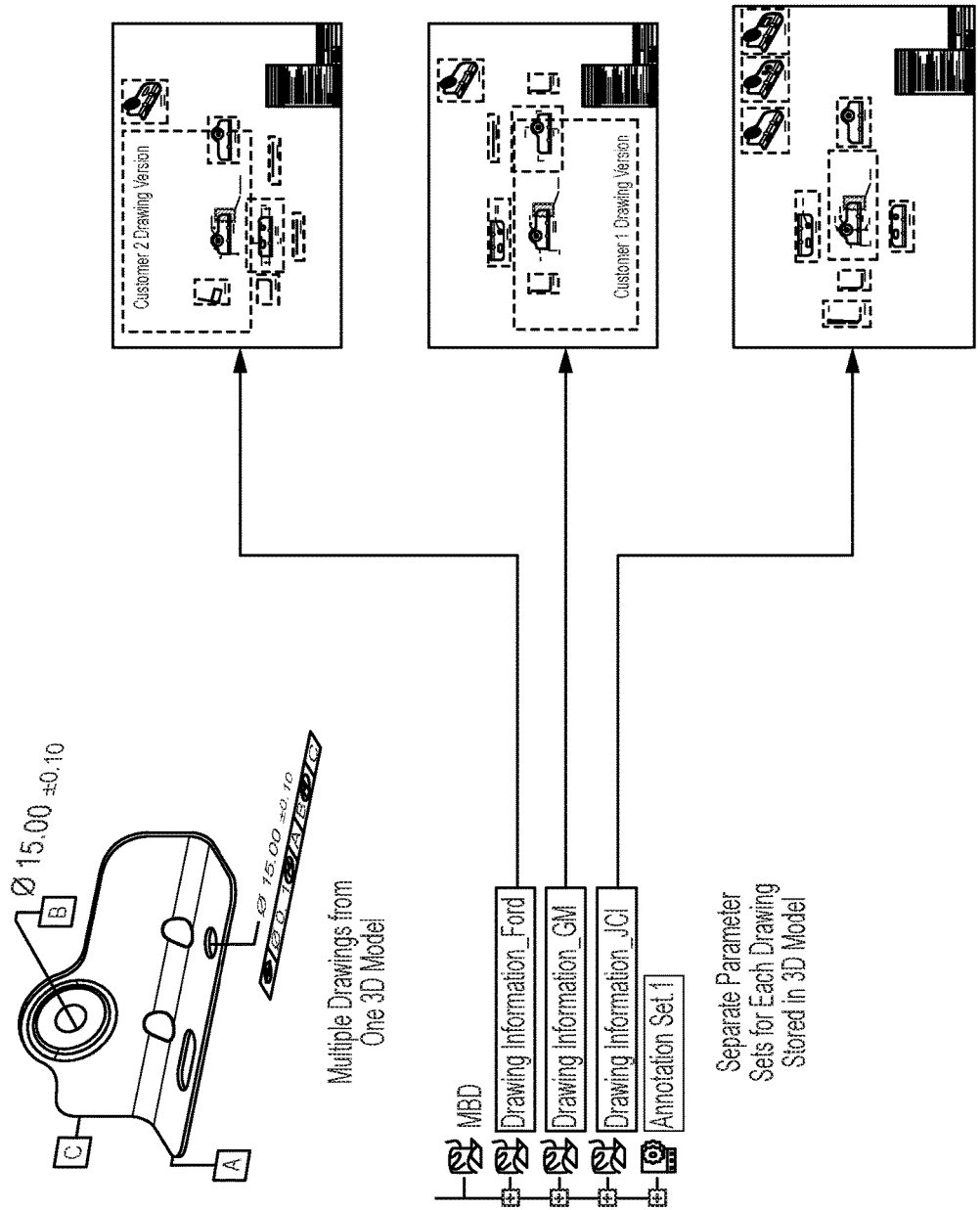
FIG. 15 is a drawing of a data structure that may be generated by the CAD synchronization system of FIG. 1 for storing multiple discrete sets of drawing parameters in a 3D model, according to an exemplary embodiment.

Still referring to FIG. 6, memory 608 is shown to include a multiple drawings module 630. Multiple drawings module 630 may be configured to generate multiple different sets of drawing parameters for the same 3D model. Each set of drawing parameters may be stored as a discrete set within the 3D model and may be used to generate a different 2D drawing from the same 3D model. Each set of drawing parameters may include, for example, different defined views, different view properties, different clipping properties, and/or different template parameters. An example of a 3D model with multiple discrete sets of drawing parameters is shown in FIG. 15.

Figure 13:
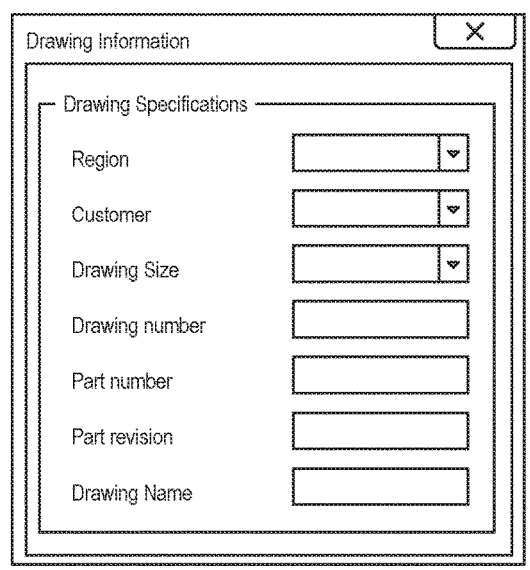
FIG. 13 is a drawing of a user interface that may be generated by the CAD synchronization system of FIG. 1 through which a user can enter or import table data, according to an exemplary embodiment.

Still referring to FIG. 6, memory 608 is shown to include a table, text, geometry, and tolerances (TTG&T) generator 632. TTG&T generator 632 may be configured to generate data table parameters defining the type and/or content of a data table in the 2D drawing. TTG&T generator 632 may determine the size, headings, columns, rows, and other attributes of a data table or title block shown in the 2D drawing. In some embodiments, TTG&T generator 632 provides a user interface through which a user can enter or import table data. An example of such a user interface is shown in FIG. 13.

TTG&T generator 632 may store the data table parameters as properties of the 3D model. In some embodiments, TTG&T generator 632 stores the data table parameters within drawing template data 664. Drawing template data 664 may be a separate hierarchical node from each of the view nodes within the 3D model. The data structures generated by TTG&T generator 632 are illustrated in FIG. 12. In some embodiments, TTG&T generator 632 stores textual data, geometric data, tolerances and other information added to the 2D drawing as properties of the 3D model Still referring to FIG. 6, memory 608 is shown to include an output 3D model generator 634. output 3D model generator 634 may be configured to generate output 3D CAD model 650. In some embodiments, output 3D CAD model 650 has a hierarchical data structure. A top level node of the data hierarchy may be a node representing the entire part or assembly depicted in the 3D model. Data under the top level node may be separated into part geometry data 642 and drawing information 652. Part geometry data 642 may include geometric data from which a modeled part or assembly can be constructed. For example, part geometry data 642 may include one or more lines, surfaces, shapes, splines, points, or other geometric features that define the structure and arrangement of a solid part or assembly. Part geometry data 642 may represent a solid part in 3D space.

Drawing information 652 may include separate nodes for each of the views represented in the 2D drawing (e.g., front, top, left, right, sectional views, detail views, etc.). In some embodiments, each view node includes one or more attributes defining various view properties and/or clipping properties of the corresponding view. Drawing information 652 may further include a node for view-independent drawing information such as template information (e.g., drawing size, drawing format, title block information, view spacing, etc.). In some embodiments, output 3D CAD model 650 includes multiple discrete sets of drawing information 652 (e.g., if the 3D model is used to generate multiple different 2D drawings).

Still referring to FIG. 6, memory 608 is shown to include a drawing reconstruction module 636. Drawing reconstruction module 636 may be configured to recreate a 2D drawing from an enhanced 3D model. Drawing reconstruction module 636 may load a saved 3D model having saved drawing parameters. The drawing parameters included in the enhanced 3D model may include view parameters defining standard and/or non-standard views, location parameters defining the relative locations of each defined view in the 2D drawing, links to other drawings or 3D models defining one or more auxiliary views of the 2D drawing, location parameters defining the relative locations of each auxiliary view in the 2D drawing, saved tables or tabular data, non-solid geometry, hatching, and/or other information that can be used to reconstruct the 2D drawing.

Drawing reconstruction module 636 may use the saved drawing parameters to build a drawing format and to recreate and position views of the 3D model. The drawing format may include a drawing size (e.g., a height and width of the 2D drawing sheet), a table format or position, and/or various formatting parameters (e.g., font size, font face, view size, etc.). Positioning views of the 3D model may include locating each view defined by the 3D model in a particular location on the drawing sheet.

Drawing reconstruction module 636 may be configured to resolve saved drawing links, load views of other drawing parts, and use the save drawing parameters to position the views of the other drawing parts. Resolving saved drawing links may include parsing a saved link to determine a file location of a 3D model or 2D drawing identified by the link. The identified 3D model or 2D drawing may be used to import or generate a drawing view of another part or assembly. Positioning views of the other drawing parts may include locating each view defined by the drawing links relative to the other views included in the 2D drawing.

Drawing reconstruction module 636 may explode and locate saved tables. Exploding the saved tables may include using the saved drawing parameters to determine the content of one or more tables in the 2D drawing. Locating the saved tables may include positioning the tables on the drawing sheet and/or relative to the views included in the 2D drawing.

Drawing reconstruction module 636 may use a saved non-solid geometry hide/show state to determine hatching and recreating the 2D drawing from the 3D model. Determining hatching may include hatching all visible zones in the 2D drawing. A zone may be defined as a surface feature pointed to by an FT&A annotation. Advantageously, drawing reconstruction module 636 may recreate the 2D drawing exclusively from the 3D model, without relying on input from other data sources and without requiring human intervention. This allows drawing recreation to be fully automated, thereby saving time, effort, and reducing the potential for errors in translating a 3D model into a 2D drawing.

Referring now to FIG. 7, a drawing of the standard views and data structures that may be created by standard view generator 612 are shown, according to an exemplary embodiment. The standard views are shown to include a front view, a top view, a bottom view, a right view, a left view, and an isometric view. In some embodiments, one of the standard views is user-defined and the rest of the standard views are automatically generated based on the user-defined view. Standard view generator 612 may automatically create the standard views and display the standard views with a correct relative orientation (e.g., according to a 2D drawing standard or convention). Standard view generator 612 may store each standard view as a data element (e.g., an attribute, a property, an array, etc.) within the 3D model.

Referring now to FIG. 8, a user interface for positioning views of the 2D drawing is shown, according to an exemplary embodiment. In some embodiments, the user interface shown in FIG. 8 is generated by view spacing module 620. The user interface may allow a user to define a relative spacing between views. In some embodiments, the user interface allows the user to select and/or mark one or more of the views to be included or excluded from the 2D drawing.

Referring now to FIGS. 9-10, a drawing illustrating several non-standard views and data structures that may be created by non-standard views generator 618 is shown, according to an exemplary embodiment. Non-standard views may include, for example, sectional views, detail views, and/or auxiliary views in addition to the standard views shown in FIG. 7. In some embodiments, the display shown in FIG. 9 serves as a user interface through which a user can define non-standard views. For example, sectional views may be defined by drawing a sectional line through one of the standard views shown in FIG. 9. Non-standard views generator 618 may use the location of the sectional line to define a sectional view plane in the 3D model. Non-standard views generator 618 may automatically generate a sectional view of the 3D model from the sectional view plane and add the sectional view to the 2D drawing preview.

Detail views may be defined by selecting a portion of a standard view in the drawing preview. Non-standard views generator 618 may use the selected portion of a standard view to automatically generate a detail view (e.g., having a larger scale) of the selected portion and add the detail view to the 2D drawing preview. Non-standard views generator 618 may create a non-solid geometric feature (e.g., a circle) and/or text annotations to identify the location of the detail view. Non-standard views generator 618 may add the non-solid geometric feature and/or text annotation to a view plane of the 3D model. Annotations added to a view of the 3D model may be added as text annotations to the corresponding view plane of the 3D model and made visible in the 2D drawing.

Non-standard view generator 618 may store each of the non-standard views as a data element of the 3D model. For example, the data structure shown in FIG. 9 is shown to include a "Section cut A-A" view, an "Auxiliary view B" view, and a "Detail C" view. The data structure shown in FIG. 10 is shown to include a "Rotated View 1" view. In some embodiments, each of the non-standard views is stored as a separate hierarchical node within a data hierarchy representing the 3D model.

Figure 11:
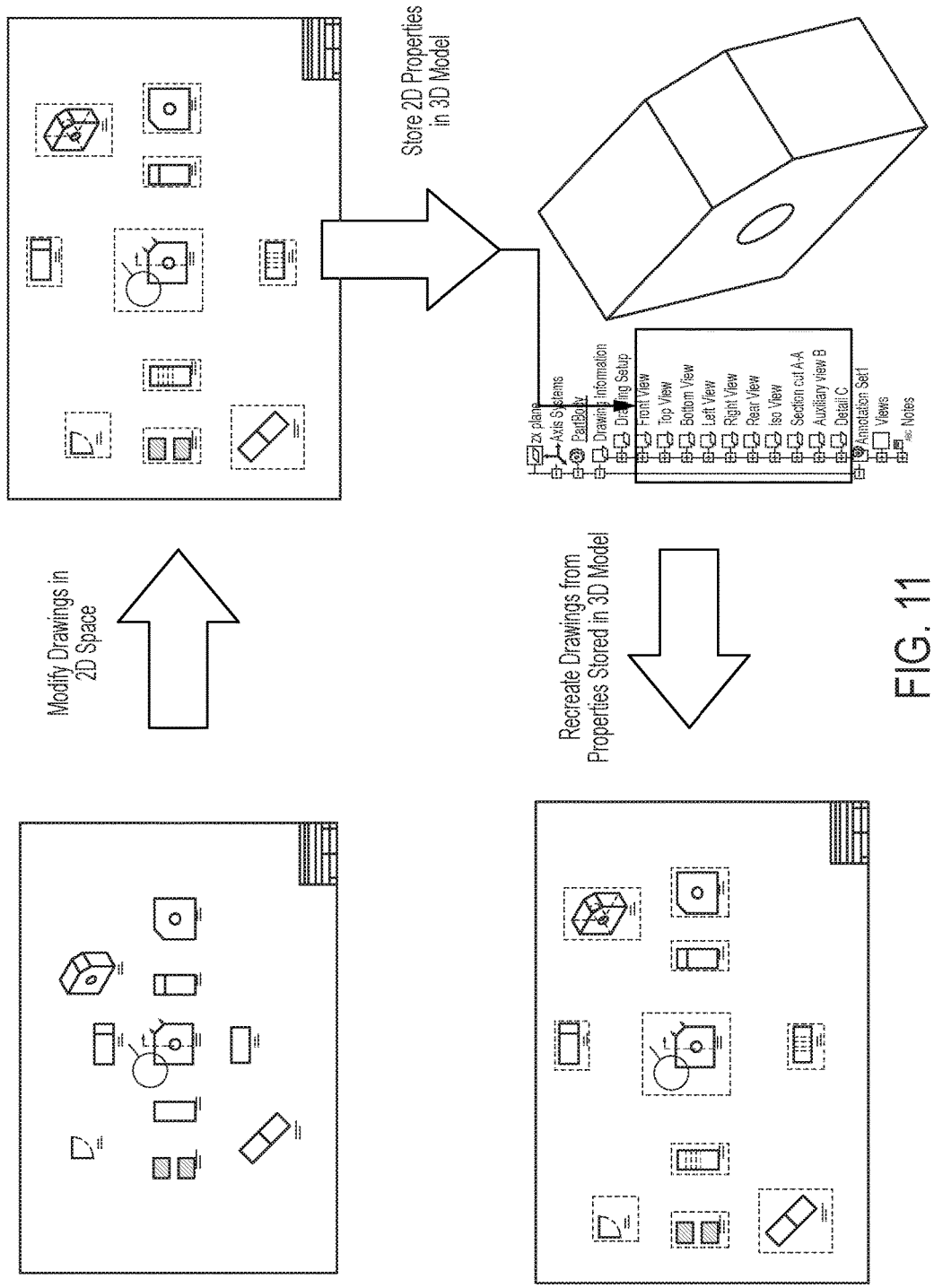
FIG. 11 is a flow diagram illustrating another process that may be performed by the CAD synchronization system of FIG. 1 for synchronizing 3D models and 2D drawings, according to an exemplary embodiment.

Referring now to FIG. 11, a flow diagram illustrating another process for synchronizing 3D models and 2D drawings is shown, according to an exemplary embodiment. As shown in FIG. 11, a drawing is created and modified in 2D space. The modified 2D drawing includes various features not in the original 2D drawing. For example, the modified 2D drawing may include non-standard views, hidden lines, GD&T annotations, and/or other features that make the modified 2D drawing more descriptive than the original 2D drawing.

As shown in FIG. 11, 2D features represented in the 2D drawing are stored as properties of the 3D model. Each view shown in the 2D drawing may be stored as a separate data element in the 3D model. Each view stored in the 3D model may include various view properties, clipping properties, and/or other properties that can be used to reconstruct the view. General properties of the 2D drawing may also be stored in the 3D model. General properties may include, for example, a size of the 2D drawing, spacing between views, table data, formatting data, and/or other attributes of the 2D drawing that are not specific to any single view.

The 2D drawing may be recreated from the properties stored in the 3D model. All of the data required to reconstruct the 2D drawing may be stored in the 3D model. Advantageously, the 2D drawing can be reconstructed without relying on input from other data sources and without requiring human intervention. This allows drawing recreation to be fully automated, thereby saving time, effort, and reducing the potential for errors in translating a 3D model into a 2D drawing.

Referring now to FIGS. 12-13, a drawing illustrating a title block and data structure that may be generated by table data generator 632 is shown, according to an exemplary embodiment. Table data generator 632 may be configured to generate data table parameters defining the type and/or content of a data table in the 2D drawing. Table data generator 632 may determine the size, headings, columns, rows, and other attributes of a data table or title block shown in the 2D drawing. FIG. 13 illustrates an exemplary user interface that may be provided by table data generator 632 through which a user can enter or import table data.

Table data generator 632 may store the data table parameters as properties of the 3D model. In some embodiments, table data generator 632 stores the data table parameters within drawing template data 664. Drawing template data 664 may be a separate hierarchical node from each of the view nodes within the 3D model. For example, drawing template data 664 may be stored within the hierarchical node labeled "drawing setup information" in FIG. 12.

Referring now to FIG. 14, a drawing with views from multiple different parts is shown, according to an exemplary embodiment. The drawing shown in FIG. 14 may be generated by multiple parts module 628, as described with reference to FIG. 6. For example, multiple parts module 628 may be configured to generate views of multiple different parts and/or assemblies and add the generated views to the 2D drawing. In some embodiments, multiple parts module 628 generates a user interface prompting a user to select an existing 2D drawing or another 3D model stored in memory. Multiple parts module 628 may be configured to identify or generate a view of the user-selected part or assembly. The view may be a standard or non-standard view of another 3D model or 2D drawing. In some embodiments, multiple parts module 628 is configured to add multiple additional views to the 2D drawing. The multiple views may be different views of the same drawing or 3D model, the same view of different drawings or 3D models (e.g., isometric views of different 3D models), or different views of different drawings or 3D models.

Referring now to FIG. 15, a 3D model with multiple discrete sets of drawing parameters is shown, according to an exemplary embodiment. The 3D model shown in FIG. 15 may be generated by multiple drawings module 630, as described with reference to FIG. 6. For example, multiple drawings module 630 may be configured to generate multiple different sets of drawing parameters for the same 3D model. Each set of drawing parameters may be stored as a discrete set within the 3D model and may be used to generate a different 2D drawing from the same 3D model. Each set of drawing parameters may include, for example, different defined views, different view properties, different clipping properties, and/or different template parameters.

Figure 16:
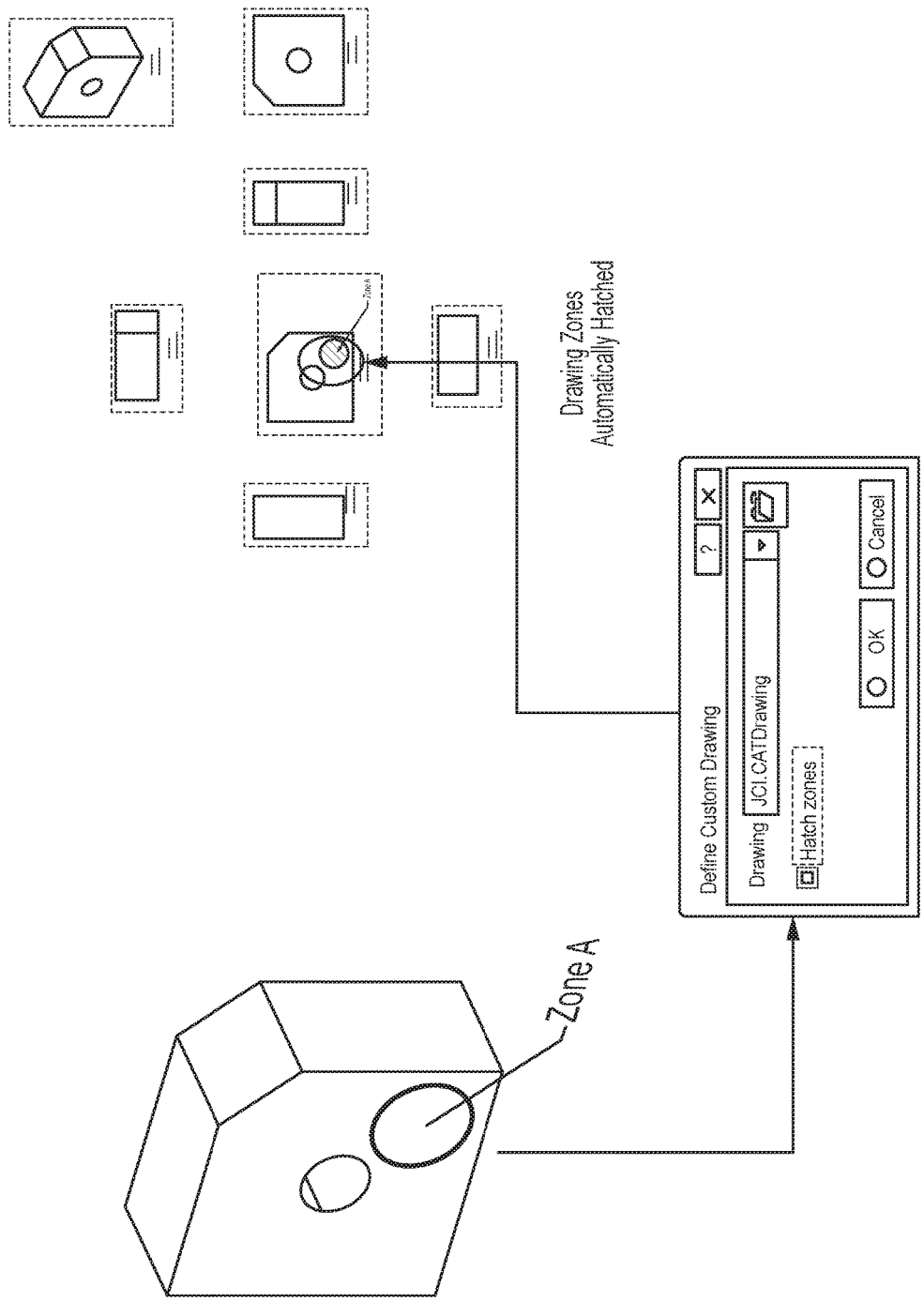
FIG. 16 illustrates a 3D model and 2D drawing with a hatched zone that may be generated by the CAD synchronization system of FIG. 1, according to an exemplary embodiment.

Referring now to FIG. 16, a 3D model and 2D drawing with a hatched zone are shown, according to an exemplary embodiment. CAD synchronization system 112 may be configured to use a saved non-solid geometry hide/show state to identify one or more surfaces for hatching. In some embodiments, CAD synchronization system 112 hatches all visible zones in the 2D drawing. In this context, a zone may be defined as a surface feature pointed to by an FT&A annotation. As shown in FIG. 16 CAD synchronization system 112 may provide a user interface through which a user can toggle zone hatching.

Figure 17:
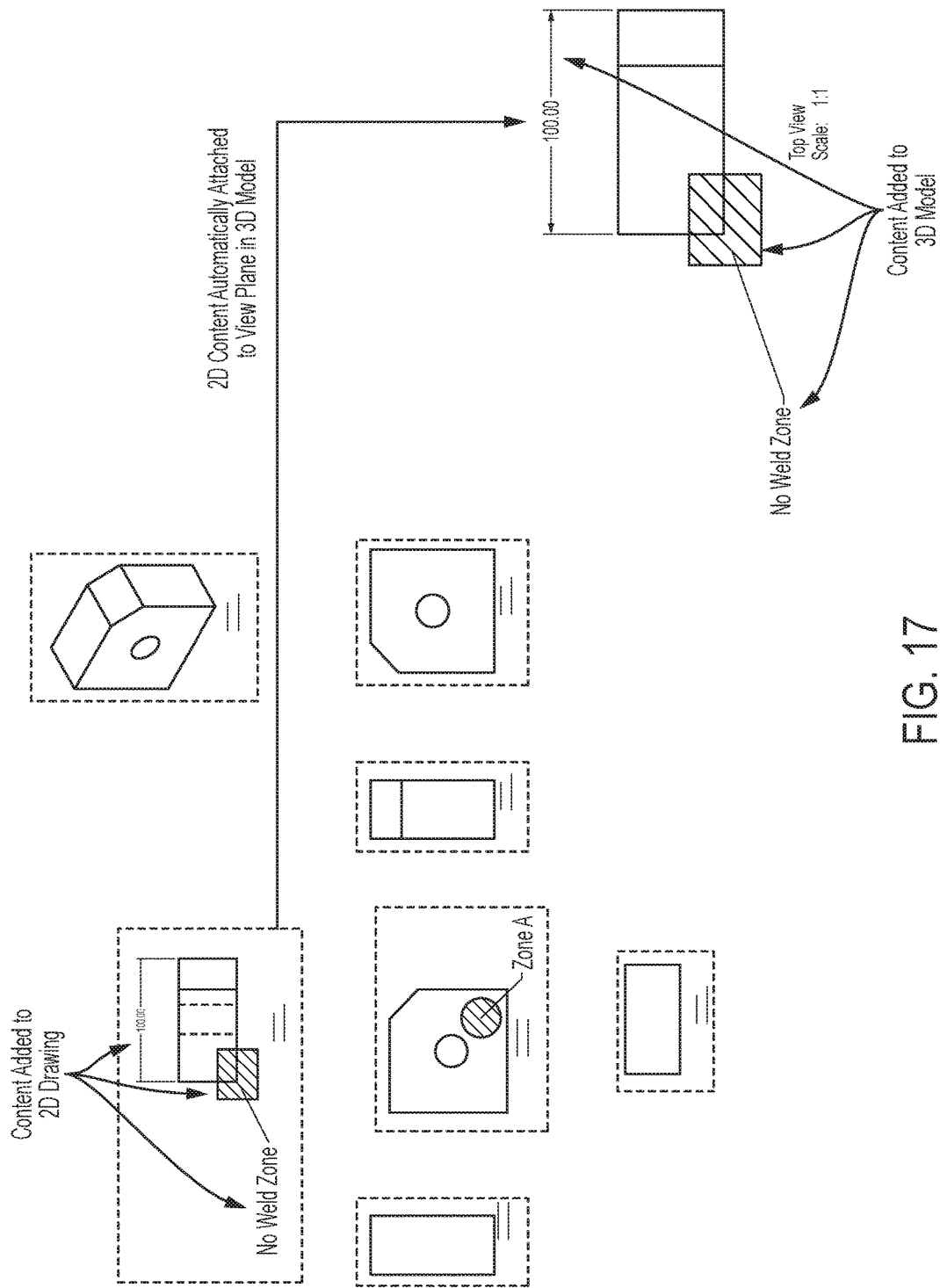
FIG. 17 is a flow diagram illustrating a process that may be performed by the CAD synchronization system of FIG. 1 for synchronizing 2D content from a 2D drawing to a 3D model, according to an exemplary embodiment.

Referring now to FIG. 17, a drawing illustrating the synchronization of 2D content from a 2D drawing to a 3D model is shown, according to an exemplary embodiment. The 2D drawing may be modified to include additional content such as dimensions, annotations (e.g., GD&T annotations), geometry (e.g., shapes defining an area), and/or text. For example, the 2D drawing is shown to include an added dimension (i.e., "100.00"), a selected area represented by a hatched rectangle, and a textual annotation applied to the selected area (i.e., "No Weld Zone").

Synchronizing the 2D content to the 3D model may include copying the additional content in the 2D drawing to a corresponding view plane of the 3D model. For example, if the additional content is added to the top view of the part (as shown in FIG. 17), the added content may be copied to a top view plane of the 3D model. The added content may be illustrated in the 3D model as hidden or non-solid content independent from the geometry or structure of the part represented in the 3D model. Advantageously, storing the additional content in the 3D model allows the exact same 2D drawing to be automatically recreated from the 3D model without requiring human intervention or re-modification of the 2D drawing to include the added content.

Referring now to FIGS. 18-19, a drawing of hierarchical data structures that may be stored as components of the 3D model are shown, according to an exemplary embodiment. FIG. 18 illustrates a data hierarchy having multiple different views (i.e., a front view and a right view). Each of the views has a plurality of properties defining the view. For example, the front view is shown to include view properties and the right view is shown to include both view properties and clipping properties. View properties may include a view origin (e.g., coordinates defining a viewpoint or view plane), a scale (e.g., a size ratio indicating the size of the corresponding view in the 2D drawing relative to an actual size of the 3D model), an orientation (e.g., an angle of the view from the view origin), CATIA (Computer Aided Three-dimensional Interactive Application) dress-up features (e.g., hidden lines, axes, center lines, 3D spec, 3D colors, threads, filets, 3D points, and 3D wireframe), and/or a view generation mode (e.g., exact view, approximate view, perspective, no perspective, etc.). Clipping properties may define a portion of each view that is visible in the 2D drawing. Clipping can be applied to any existing view of the 2D drawing. View properties and clipping properties may be generated by view properties module 622 and clipping properties module 624, respectively, and stored as properties each view of the 3D model.

FIG. 19 illustrates a hierarchy of view-independent drawing parameters that may be stored in the 3D model. The drawing parameters shown in FIG. 19 are stored under the "parameters" node of the hierarchical data model. In some embodiments, the parameters node is at the same level as the various view nodes (e.g., front view, right view, etc.) under the "drawing information" node in the hierarchical data model. View-independent drawing parameters stored under the parameters node in FIG. 19 may include, for example, a drawing size, a drawing format, title block information, view spacing, or other parameters of the 2D drawing that are not specific to any single view.

Figure 20:
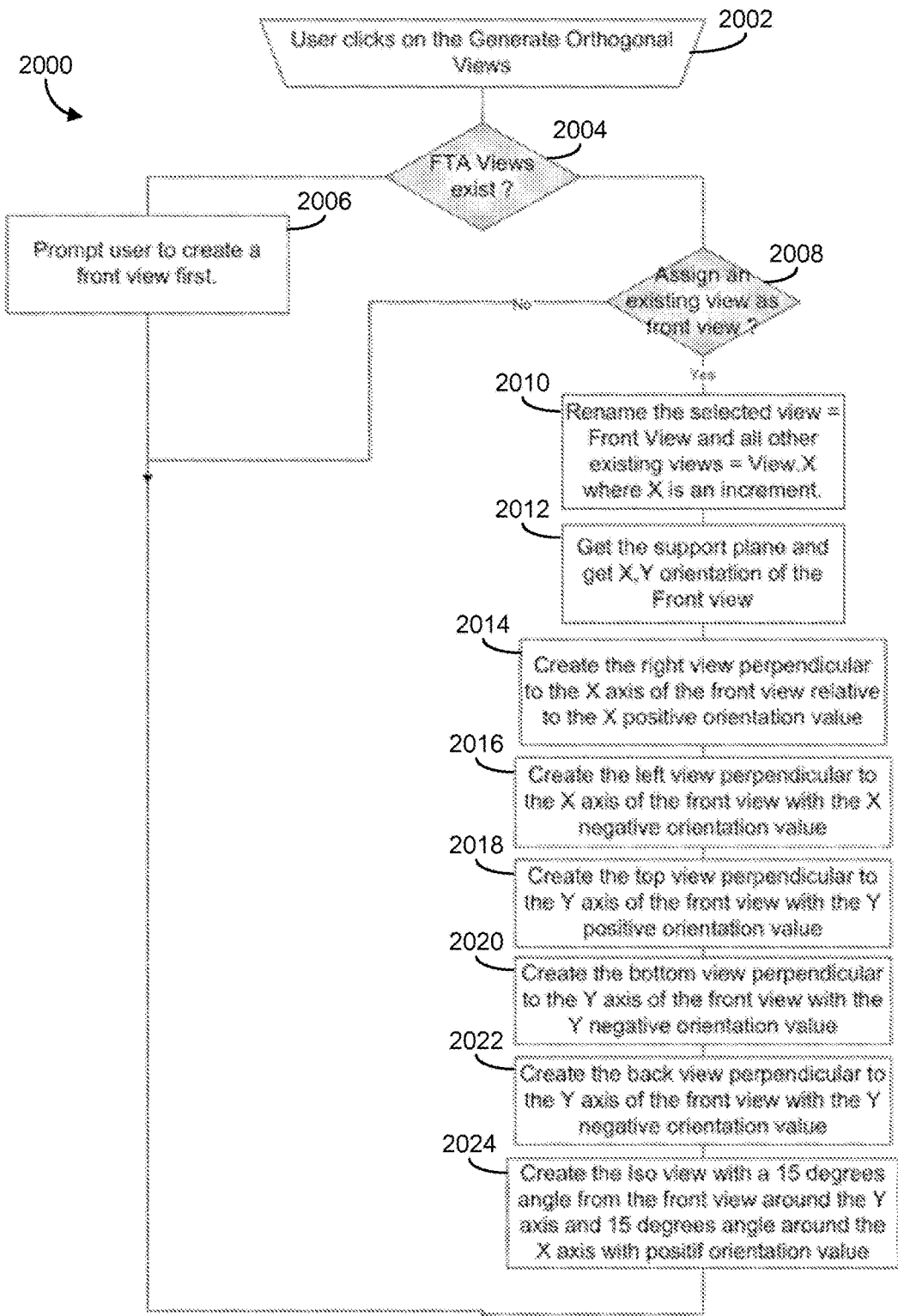
FIG. 20 is a flowchart of a process that may be performed by the CAD synchronization system of FIG. 1 for generating standard views of a 3D model, according to an exemplary embodiment.

Referring now to FIG. 20, a flowchart of a process 2000 for generating standard views of a 3D model is shown, according to an exemplary embodiment. In some embodiments, process 2000 is performed by standard view generator 612 of CAD synchronization system 112, as described with reference to FIG. 6. Process 2000 is shown to include a user clicking on an icon for generating orthogonal views (step 2002). The icon may be displayed as part of a user interface of 3D modeling software or 3D model viewing software.

Process 2000 is shown to include determining whether functional tolerancing and annotations (FTA) views of the 3D model exist (step 2004). FTA views may include user-selected view that is defined as the front view of the 3D model. If no FTA views of the 3D model exist, process 2000 may prompt a user to define a front view before process 2000 can be run (step 2006). However, if FTA views of the 3D model exist, process 2000 may assign an existing view to the front view (step 2008) rename the selected view to "Front View" and rename all other views to View.X, where X is an increment (e.g., View.1, View.2, View.3, etc.) (step 2010). Process 2000 may include getting the support plane and X-Y orientation of the front view (step 2012).

Still referring to FIG. 20, process 2000 is shown to include creating the right view perpendicular to the X axis of the front view relative to the X positive orientation value (step 2014) and creating the left view perpendicular to the X axis of the front view with the X negative orientation value (step 2016). Process 2000 may include creating the top view perpendicular to the Y axis of the front view relative to the Y positive orientation value (step 2018), creating the bottom view perpendicular to the Y axis of the front view with the Y negative orientation value (step 2020), and creating the bottom view perpendicular to the Y axis of the front view with the Y negative orientation value (step 2022). Process 2000 is shown to include creating the isometric view with a 15 degree angle from the front view around the Y axis and a 15 degree angle around the X axis with a positive orientation value (step 2024).

Figure 21:
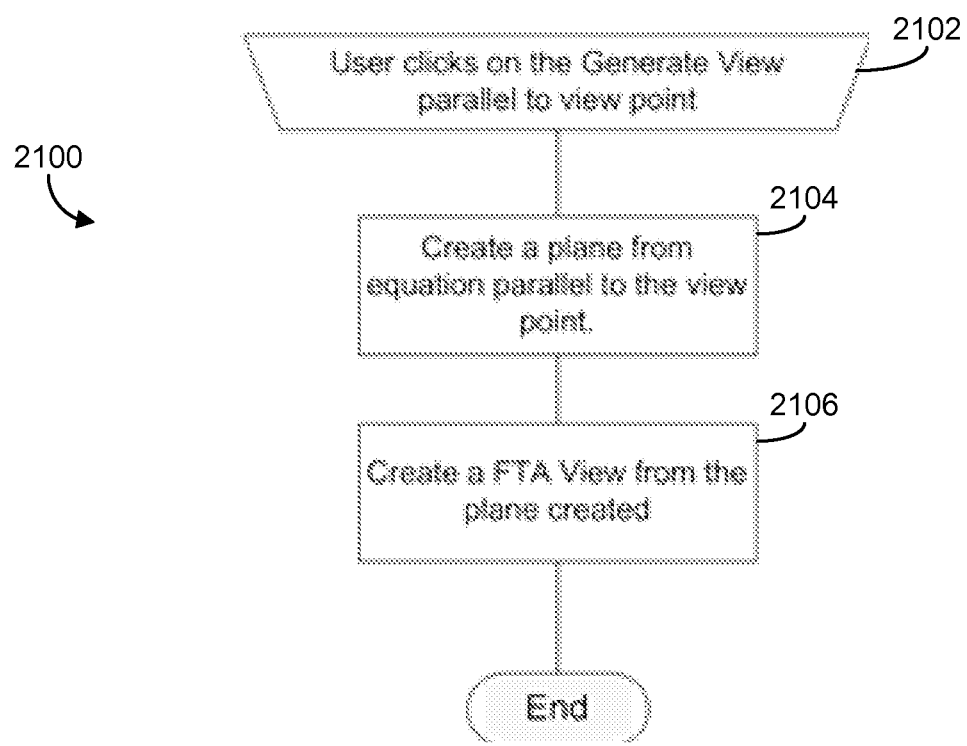
FIG. 21 is a flowchart of a process that may be performed by the CAD synchronization system of FIG. 1 for generating a view parallel to a viewpoint, according to an exemplary embodiment.

Referring now to FIG. 21, a flowchart of a process 2100 for generating a view parallel to a viewpoint is shown, according to an exemplary embodiment. In some embodiments, process 2100 is performed by CAD synchronization system 112, as described with reference to FIG. 6. Process 2100 is shown to include a user clicking on an icon for generating a view parallel to a viewpoint (step 2102). The icon may be displayed as part of a user interface of 3D modeling software or 3D model viewing software.

Process 2100 is shown to include creating a plane parallel to the current view point of the 3D model (step 2104). In some embodiments, process 2100 includes storing the plane as a feature of the 3D model. Process 2100 may further include creating a FTA view of the 3D model from the created plane (step 2106).

Figure 22:
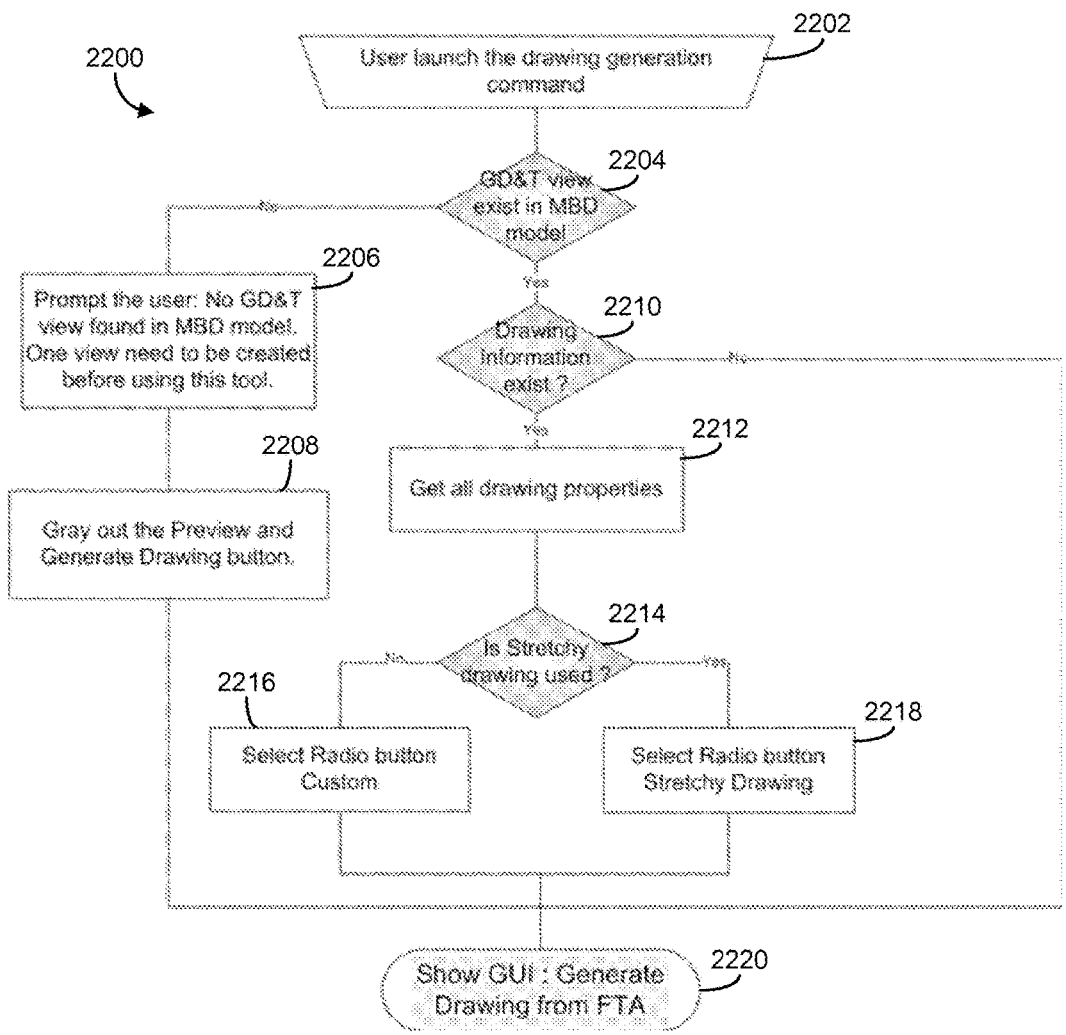
FIG. 22 is a flowchart of a process that may be performed by the CAD synchronization system of FIG. 1 for generating a 2D drawing from a 3D model, according to an exemplary embodiment.

Referring now to FIG. 22, a flowchart of a process 2200 for generating a 2D drawing from a 3D model is shown, according to an exemplary embodiment. In some embodiments, process 2200 is performed by CAD synchronization system 112, as described with reference to FIG. 6. Process 2200 is shown to include a user launching a drawing generation command (e.g., be clicking on an icon displayed within a user interface of 3D modeling software or 3D model viewing software) (step 2202).

Process 2200 is shown to include determining whether a geometric dimensioning and tolerancing (GD&T) view of the 3D model exists (step 2204). If a GD&T view of the 3D model does not yet exist, process 2200 may inform the user that no GD&T view exists in the 3D model (i.e., the 3D model does not contain all of the information required to automatically generate a formal 2D drawing) and prompt the user to create a GD&T view before generating the 2D drawing (step 2206). If no GD&T view exists, process 2200 may gray out the preview option and the generate drawing option of a user interface through which drawings can be created (step 2208).

If a GD&T view of the 3D model exists, process 2200 may proceed to determining whether drawing information exists (step 2210). Drawing information may be stored in the 3D model if the 3D model has already been modified to include all of the information necessary to recreate a formal 2D drawing. If no drawing information exists, process 2200 may terminate without generating a formal 2D drawing (step 2220). However, if drawing information exists, process 2200 may get all of the drawing properties from the 3D model (step 2212). The drawing properties may indicate whether the 2D drawing is constructed using a "stretchy drawing" template or a custom template.

Process 2200 is shown to include determining whether the stretchy drawing template is used (step 2214). If the stretchy drawing template is used, process 2200 may select the stretchy drawing radio button of the drawing generation interface (step 2218). However, if the stretchy drawing template is not used, process 2200 may select the custom radio button of the drawing generation interface (step 2216). Process 2200 may conclude with showing the interface for generating a 2D drawing from a 3D model (step 2220).

Figure 23:
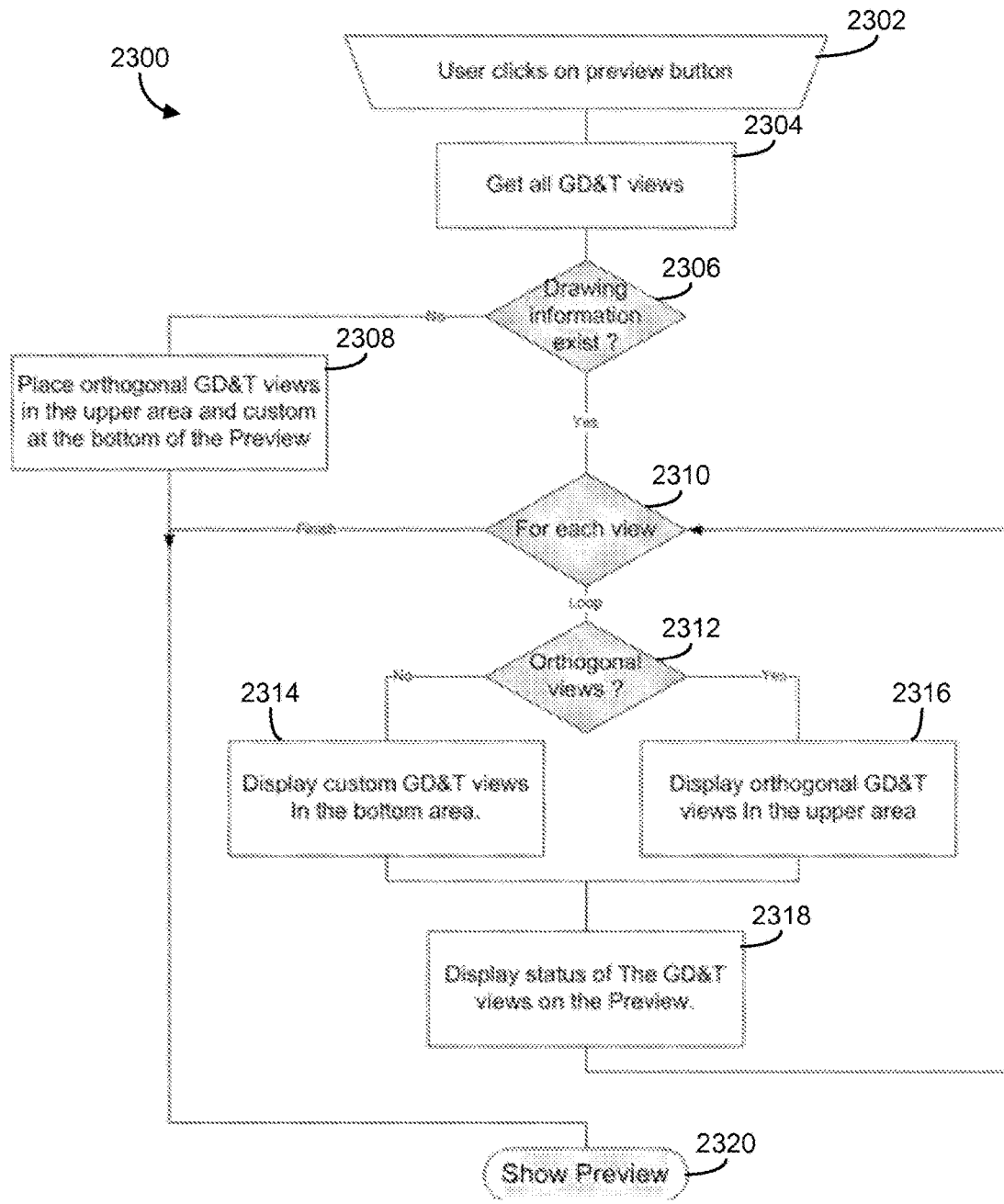
FIG. 23 is a flowchart of a process that may be performed by the CAD synchronization system of FIG. 1 for generating a preview of a 2D drawing, according to an exemplary embodiment.

Referring now to FIG. 23, a flowchart of a process 2300 for generating a preview of a 2D drawing is shown, according to an exemplary embodiment. In some embodiments, process 2300 is performed by CAD synchronization system 112, as described with reference to FIG. 6. Process 2300 is shown to include a user clicking on an icon for generating a preview of a 2D drawing (step 2302). The icon may be displayed as part of a user interface of 3D modeling software or 3D model viewing software.

Process 2300 is shown to include retrieving all of the GD&T views from the 3D model (step 2304). The GD&T views may be stored as data elements of the 3D model.

Process 2300 may continue with determining whether drawing information exists (step 2306). Drawing information may be stored in the 3D model if the 3D model has already been modified to include all of the information necessary to recreate a formal 2D drawing.

If no drawing information exists, process 2300 may place orthogonal GD&T views in an upper area of the drawing preview and placing a custom view in a bottom area of the drawing preview and display the drawing preview (step 2308). However, if drawing information exists, process 2300 may execute a loop for each view of the GD&T views (step 2310). The loop may include determining whether orthogonal views exist (step 2312). If one or more orthogonal views exists, process 2300 may display the orthogonal GD&T views in an upper area of the drawing preview and display a status of the GD&T views in the drawing preview (step 2316). If no orthogonal views exist, process 2300 may display custom GD&T views in a bottom area of the drawing preview and display a status of the GD&T views in the drawing preview (step 2314). Once the loop in step 2310 has been executed for each GD&T views, process 2300 may conclude with showing the drawing preview (step 2320).

Figure 24:
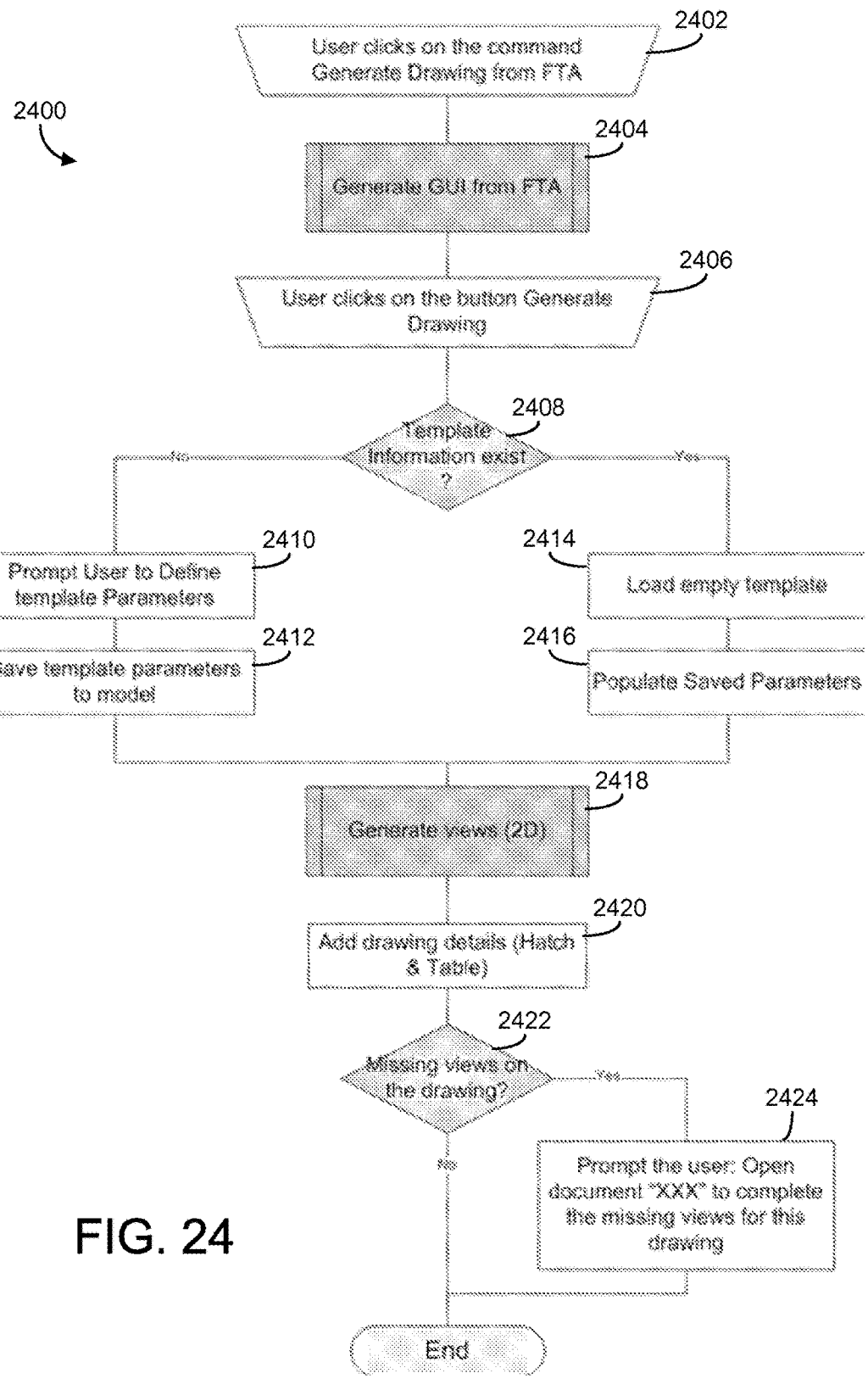
FIG. 24 is a flowchart of a process that may be performed by the CAD synchronization system of FIG. 1 for generating a 2D drawing from a 3D model, according to an exemplary embodiment.

Referring now to FIG. 24, a flowchart of a process 2400 for generating a 2D drawing from a 3D model is shown, according to an exemplary embodiment. In some embodiments, process 2400 is performed by CAD synchronization system 112, as described with reference to FIG. 6. Process 2400 is shown to include a user clicking on an icon for generating a 2D drawing (step 2402). The icon may be displayed as part of a user interface of 3D modeling software or 3D model viewing software. In response to clicking on the icon, process 2400 may call and run a sub-process for generating a graphical user interface from a FTA model (step 2404). Step 2404 may include performing process 2200, as described with reference to FIG. 22. Process 2400 is shown to further include a user clicking on an icon for generating a 2D drawing (step 2406). The icon may be displayed as part of the user interface generated by process 2200.

Process 2400 may include determining whether template information exists (step 2408). Template information may include one or more templates that can be selected for the 2D drawing. If no template information exists, process 2400 may prompt a user to define template parameters (step 2410) and save the template parameters to the 3D model (step 2412). However, if template information exists, process 2400 may load an empty template (step 2414) and populate the empty template with the saved template information (step 2416).

Process 2400 is shown to include generating 2D views of the 3D model (step 2418). Step 2418 may include performing process 2500, as described below with reference to FIG. 25. Once the 2D views have been generated, process 2400 may proceed to adding drawing details to the 2D drawing (step 2420). Drawing details may include, for example hatching information, tabular information, and/or other information retrieved from the 3D model.

Process 2400 is shown to include determining whether the 2D drawing includes any missing views (step 2422). Missing views may be views of other parts or assemblies identified by a link or parameter of the 3D model. If the 2D drawing includes missing views, process 2400 may prompt the user to open an identified document (e.g., the part or assembly identified by the link) to retrieve the missing views (step 2424). If the 2D drawing does not include missing views, process 2400 may conclude without prompting the user to open another document.

Figure 25:
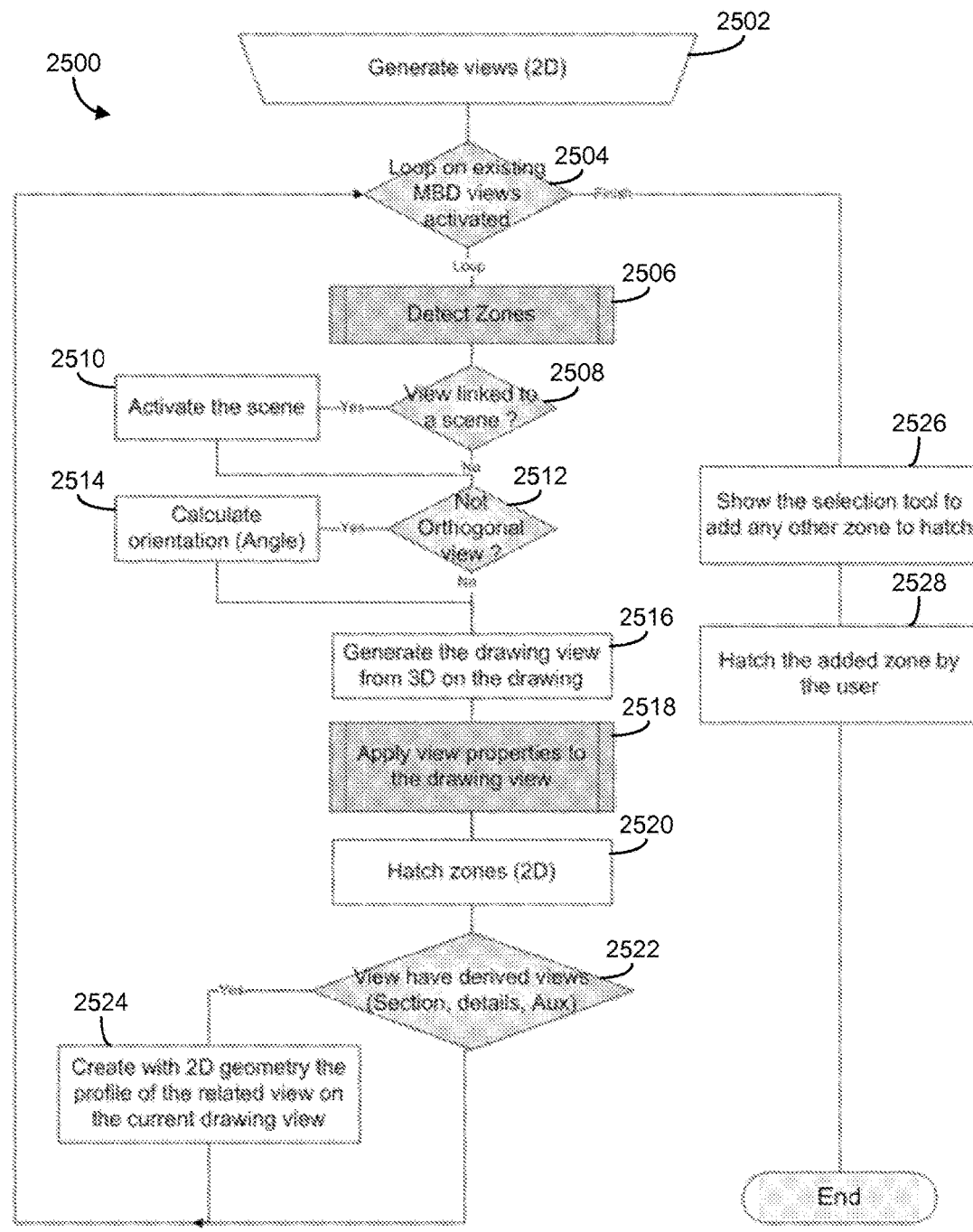
FIG. 25 is a flowchart of a process that may be performed by the CAD synchronization system of FIG. 1 for generating 2D views of a 3D model, according to an exemplary embodiment.

Referring now to FIG. 25, a flowchart of a process 2500 for generating 2D views of a 3D model is shown, according to an exemplary embodiment. Process 2500 illustrates step 2418 of process 2400 in greater detail. In some embodiments, process 2500 is performed by CAD synchronization system 112, as described with reference to FIG. 6. Process 2500 may begin at step 2502 when step 2418 of process 2400 is performed.

Process 2500 is shown to include running a loop for each view of a 3D model (step 2504). The loop includes detecting zones of the 3D model (step 2506). Step 2506 may include performing process 2700, as described with reference to FIG. 27. Once the zones are detected, the process 2500 may determine whether the current view is linked to a scene (step 2508) and whether the current view is an orthogonal view (step 2512). If the current view is linked to a scene, process 2500 may activate the scene (step 2510). If the current view is not an orthogonal view, process 2500 may calculate the angle of orientation of the view (step 2514).

Process 2500 may generate each 2D drawing view from the current view stored in the 3D model (step 2516) and apply view properties to the current view (step 2518). Step 2518 may include performing process 2600, as described with reference to FIG. 26. Once the view properties are applied to the current view, process 2500 may hatch 2D zones (step 2520) and determine whether the view has any derived views (step 2500). Derived views may include, for example, sectional views, detail views, and auxiliary view. If the current view has any auxiliary view, process 2500 may use 2D geometry to create a profile of the derived view on the current drawing view (step 2524).

Once the loop in step 2504 is run for each view of the 3D model, process 2500 may show the selection tool to add any other zone to hatch (step 2526). The selection tool may allow a user to define one or more additional zones to hatch. Process 2500 may hatch any zones added by the user (step 2528).

Figure 26:
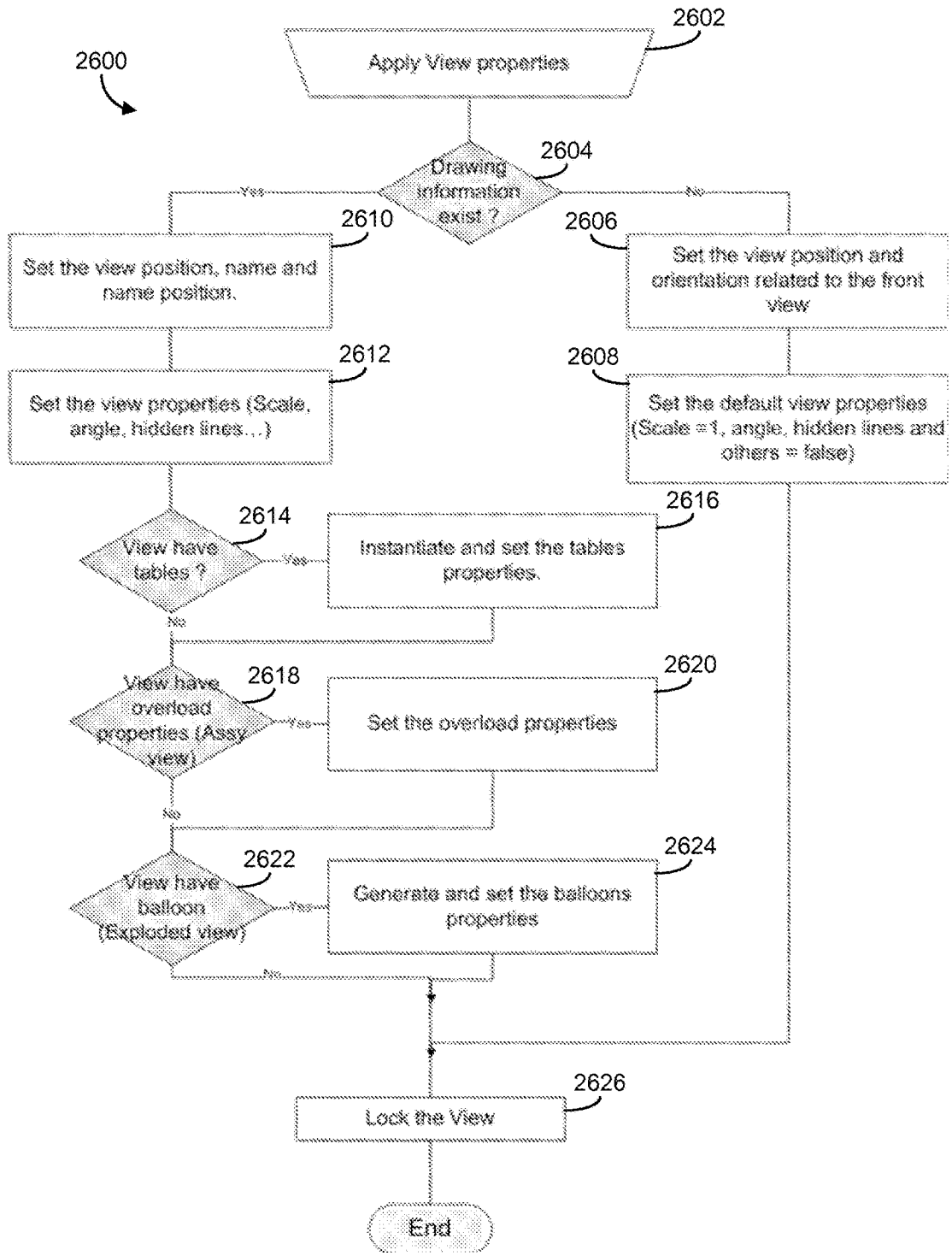
FIG. 26 is a flowchart of a process that may be performed by the CAD synchronization system of FIG. 1 for applying view properties to a 2D drawing, according to an exemplary embodiment.

Referring now to FIG. 26, a flowchart of a process 2600 for applying view properties to a 2D drawing is shown, according to an exemplary embodiment. Process 2600 illustrates step 2518 of process 2500 in greater detail. In some embodiments, process 2600 is performed by CAD synchronization system 112, as described with reference to FIG. 6. Process 2600 begins at step 2602 when step 2518 of process 2500 is performed.

Process 2600 is shown to include determining whether drawing information exists (step 2604). Drawing information may be stored in the 3D model if the 3D model has already been modified to include all of the information necessary to recreate a formal 2D drawing. If no drawing information exists, process 2600 may set the view position and orientation related to the front view (step 2606) and set default view properties (step 2608). Default view properties may include setting the scale of the view to 1 and setting the angle, hidden lines, and other view properties to false.

If drawing information exists, process 2600 may set the view position, name, name position, and other view properties (e.g., scale, angle, hidden lines, etc.) to the values indicated in the drawing information (steps 2610 and 2612). Process 2600 may determine whether the current view has any tables (step 2614), overload properties (step 2618), or balloons (step 2622). Overload properties may exist if the current view is a view of an assembly. Balloons may exist if the current view is an exploded view. If the current view has tables, process 2600 may instantiate and set the table properties using the drawing information (step 2616). If the current view has overload properties, process 2600 may set the overload properties (step 2620). If the current view has balloons, process 2600 may set the balloon properties (step 2624). Process 2600 may conclude with locking the current view (step 2626).

Figure 27:
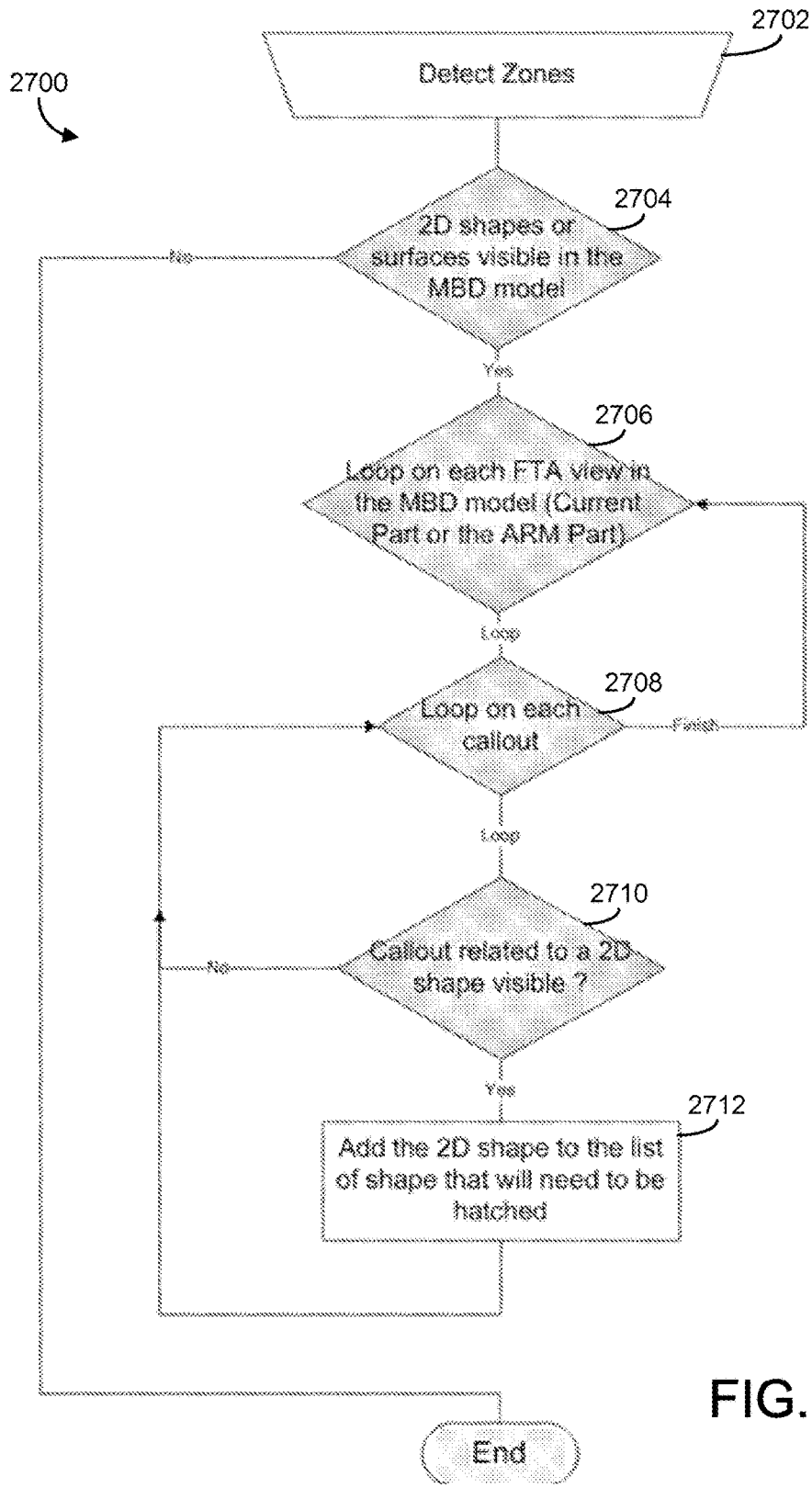
FIG. 27 is a flowchart of a process that may be performed by the CAD synchronization system of FIG. 1 for hatching zones of a 2D drawing, according to an exemplary embodiment.

Referring now to FIG. 27, a flowchart of a process 2700 for hatching zones of a 2D drawing is shown, according to an exemplary embodiment. Process 2600 illustrates step 2506 of process 2500 in greater detail. In some embodiments, process 2700 is performed by CAD synchronization system 112, as described with reference to FIG. 6. Process 2700 may begin at step 2702 when step 2506 of process 2500 is performed.

Process 2700 is shown to include determining whether any 2D shapes or surfaces are visible in the 3D model (step 2704). If no 2D shapes or surfaces are visible in the 3D model, process 2700 may terminate without hatching any zones. However, if any 2D shapes or surfaces are visible in the 3D model, process 2700 may run a main loop for each FTA view in the 3D model (step 2706). The main loop includes running a sub-loop for each callout (step 2708). The sub-loop includes determining whether the callout is related to a 2D visible shape (step 2710). If the callout is related to a 2D visible shape, process 2700 may add the 2D shape to a list of shapes that will be hatched (step 2712). Once all of the callouts for a given view are processed, the main loop of step 2706 continues to the next FTA view of the 3D model and performs the sub-loop of step 2708 for each callout of the next FTA view. Once all of the FTA views have been processed in step 2706, process 2700 terminates.

Figure 28:
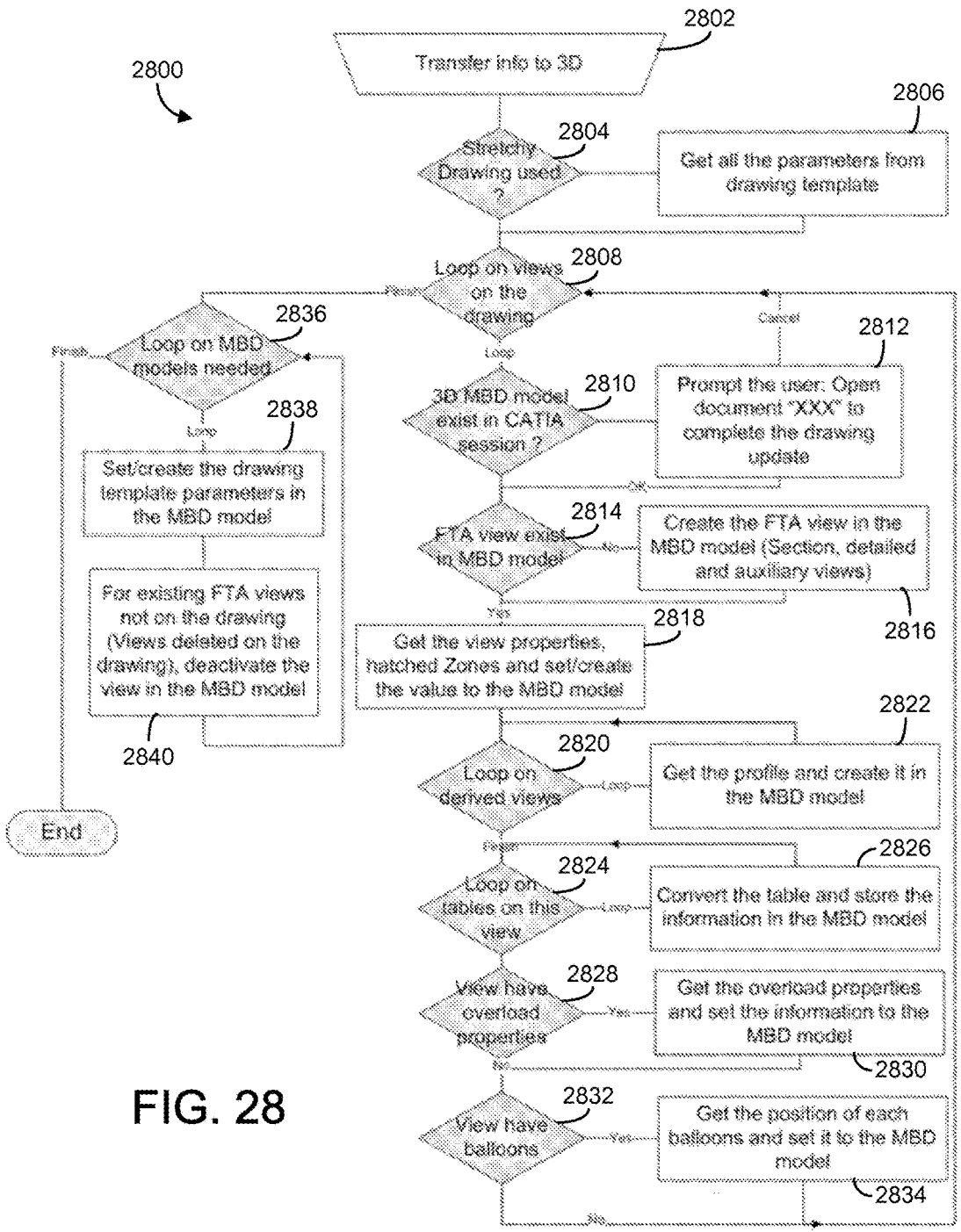
FIG. 28 is a flowchart of a process that may be performed by the CAD synchronization system of FIG. 1 for transferring information from a 2D drawing to a 3D model, according to an exemplary embodiment.

Referring now to FIG. 28, a flowchart of a process 2800 for transferring information from a 2D drawing to a 3D model is shown, according to an exemplary embodiment. In some embodiments, process 2800 is performed by CAD synchronization system 112, as described with reference to FIG. 6. Process 2800 may begin at step 2800 when the 2D drawing contains more information than the 3D model. Process 2800 is shown to include determining whether a stretchy drawing template is used to generate the 2D drawing (step 2804). If a stretchy drawing template is used, process 2800 retrieves all of the parameters from the stretchy drawing template (step 2806).

Process 2800 is shown to include running a main loop for each view of the 2D drawing (step 2808). The main loop includes determining whether the 3D model corresponding to the 2D drawing exists in the active 3D modeling session (step 2810). If the corresponding 3D model is not already open, process 2800 may prompt the user to open the 3D model so that information from the 2D drawing can be transferred thereto (step 2812). The main loop of step 2808 then proceeds to determine whether the current view of the 2D drawing exists in the 3D model (step 2814). If the current view does not exist in the 3D model, process 2800 may create the current view in the 3D model, along with any non-standard views based on the current view (step 2816). The main loop of step 2808 is shown to include identifying any view properties and hatched zones associated with the current view and setting/creating a value in the 3D model defining the view properties and/or hatched zones (step 2818).

The main loop of step 2808 is shown to include running a first sub-loop for each derived view associated with the current view (step 2820). The first sub-loop of step 2820 includes retrieving the profile associated with the derived view and storing the profile in the 3D model (step 2822). The main loop of step 2808 is shown to include running a second sub-loop for table associated with the current view (step 2824). The second sub-loop of step 2824 includes converting the table to storable information and storing the table information in the 3D model (step 2826).

The main loop of step 2808 is shown to include determining whether the current view has any overload properties (step 2828) or balloons (step 2832). If the current view has overload properties, process 2800 may store the overload properties in the 3D model (step 2830). If the current view has balloons, process 2800 may store the position and/or content of each balloon in the 3D model (step 2834). The main loop of step 2808 then proceeds to the next view of the 2D drawing and repeats step 2808 until all of the views of the 2D drawing have been stored in the 3D model.

Once all of the views of the 2D drawing have been stored in the 3D model, process 2800 runs a loop for each additional 3D model that provides content to the 2D drawing (step 2836). The loop of step 2836 includes setting or creating drawing template parameters in the corresponding 3D model (step 2838) and deactivating any views of the 3D model that are not in the 2D drawing (step 2840). Once the loop has been run for all of the 3D models that provide content to the 2D drawing, process 2800 terminates.

Referring now to FIGS. 29-40, a series of drawings illustrating a process for automatically creating 2D drawings from an annotated 3D model is shown, according to an exemplary embodiment. In brief overview, the process illustrated in FIGS. 29-40 may be performed by CAD synchronization system 112 to create a 2D drawing from a 3D model, add supplementary 2D content to the 2D drawing, and synchronize/copy the added 2D content back to the 3D model. The 2D content added to the 2D drawing (e.g., tolerances, annotations, notes, view spacing parameters, links to other drawing parts, etc.) is stored within the 3D model to create an annotated 3D model. The annotated 3D model is then used to automatically recreate the 2D drawing with the supplementary content. In various embodiments, multiple 3D parts may be shown in a single 2D drawing and multiple 2D drawings may be created from a single 3D model.

Figure 29:
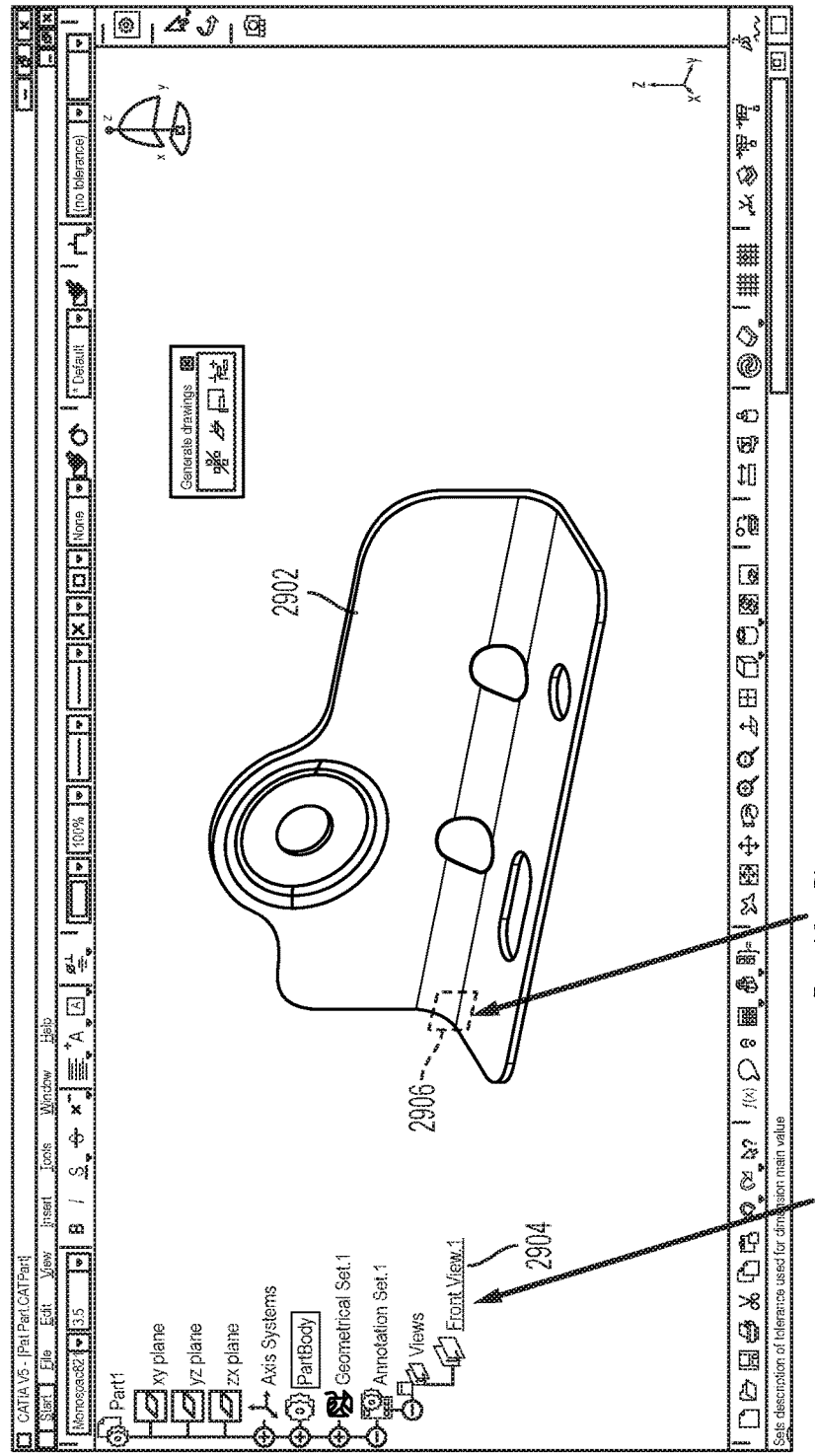
FIGS. 29-40 are drawings illustrating a process that may be performed by the CAD synchronization system of FIG. 1 for automatically creating 2D drawings from an annotated 3D model, according to an exemplary embodiment.

Referring specifically to FIG. 29, a user interface 2900 that may be provided by 3D modeling software is shown, according to an exemplary embodiment. Although a specific type of 3D modeling software is shown in FIG. 29 (e.g., CATIA v5), it is understood that user interface 2900 or a similar user interface may be generated by any type of 3D modeling software or 3D model viewing software to display a 3D model of a part or assembly. User interface 2900 is shown to include a 3D model of a part 2902.

The illustrated process is shown to include creating a 3D model and selecting a front view (step 1). Part 2902 may be modeled using any type of 3D modeling software and visualized via user interface 2900. As shown in FIG. 29, the 3D model may include a hierarchical representation of various objects (e.g., view planes, axis systems, part geometry, geometrical sets, annotation sets, etc.) that may be rendered to visualize part 2902 or define various views/attributes thereof. For example, the 3D model is shown to include a front view object 2904 that defines the location of a front view plane 2906. Front view object 2904 may be created automatically or manually in response to a user selecting a front view for part 2902.

Figure 30:
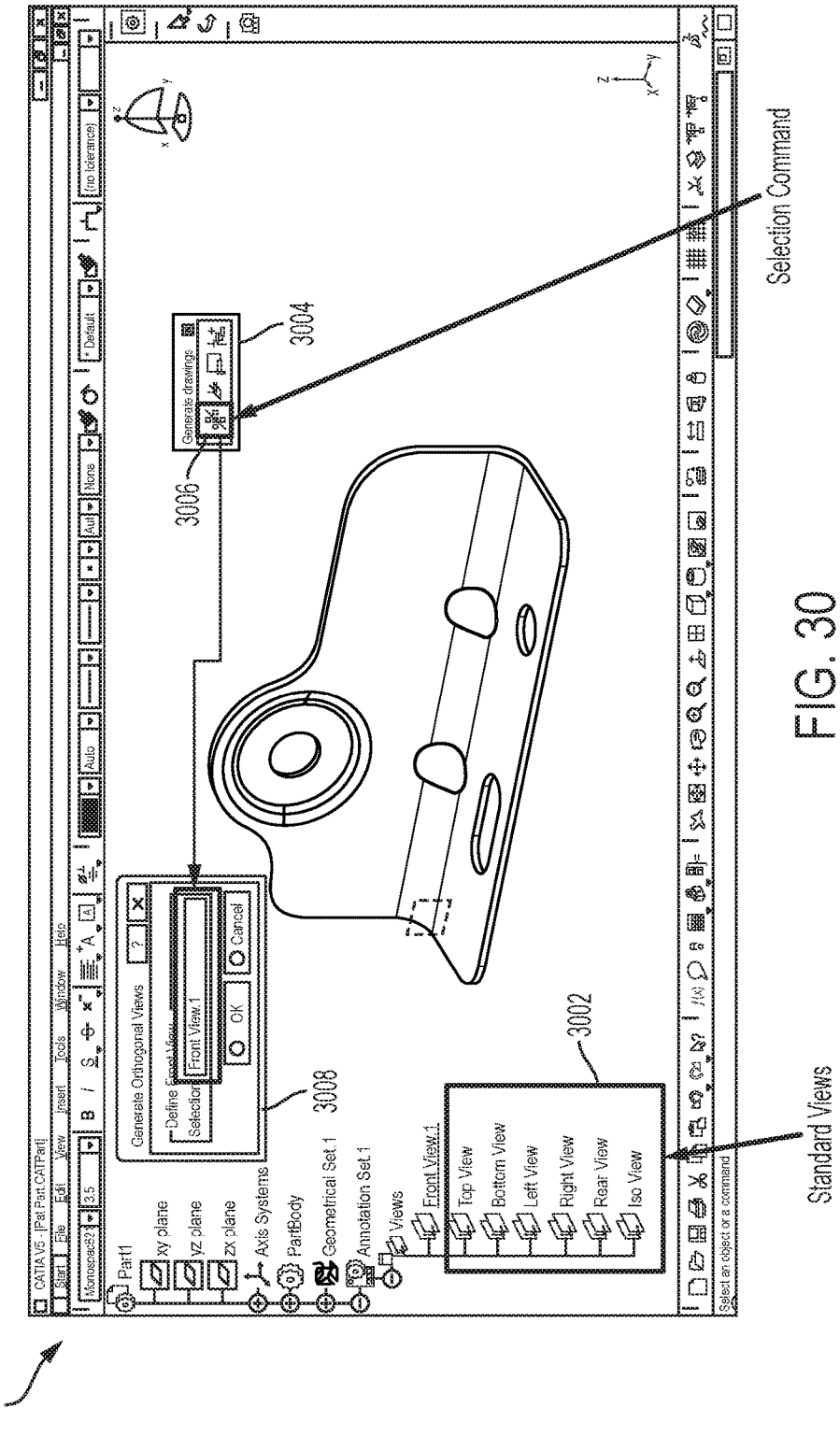

Referring now to FIG. 30, the illustrated process is shown to include automatically creating standard views (step 2). User interface 2900 is shown to include a generate drawings toolbar 3004 having a selectable icon 3006. When selected, icon 3006 may cause user interface 2900 to display a window 3008 for automatically creating standard views from the user-defined front view. Front view object 2904 can be specified as an input (e.g., by selecting front view plane 2906 or front view object 2904) to window 3008. Upon clicking the "OK" button in window 3008, CAD synchronization system 112 may automatically generate a plurality of standard views 3002 based on the specified front view. Standard views 3002 may be added to the 3D model as part of the objects hierarchy.

Figure 31:
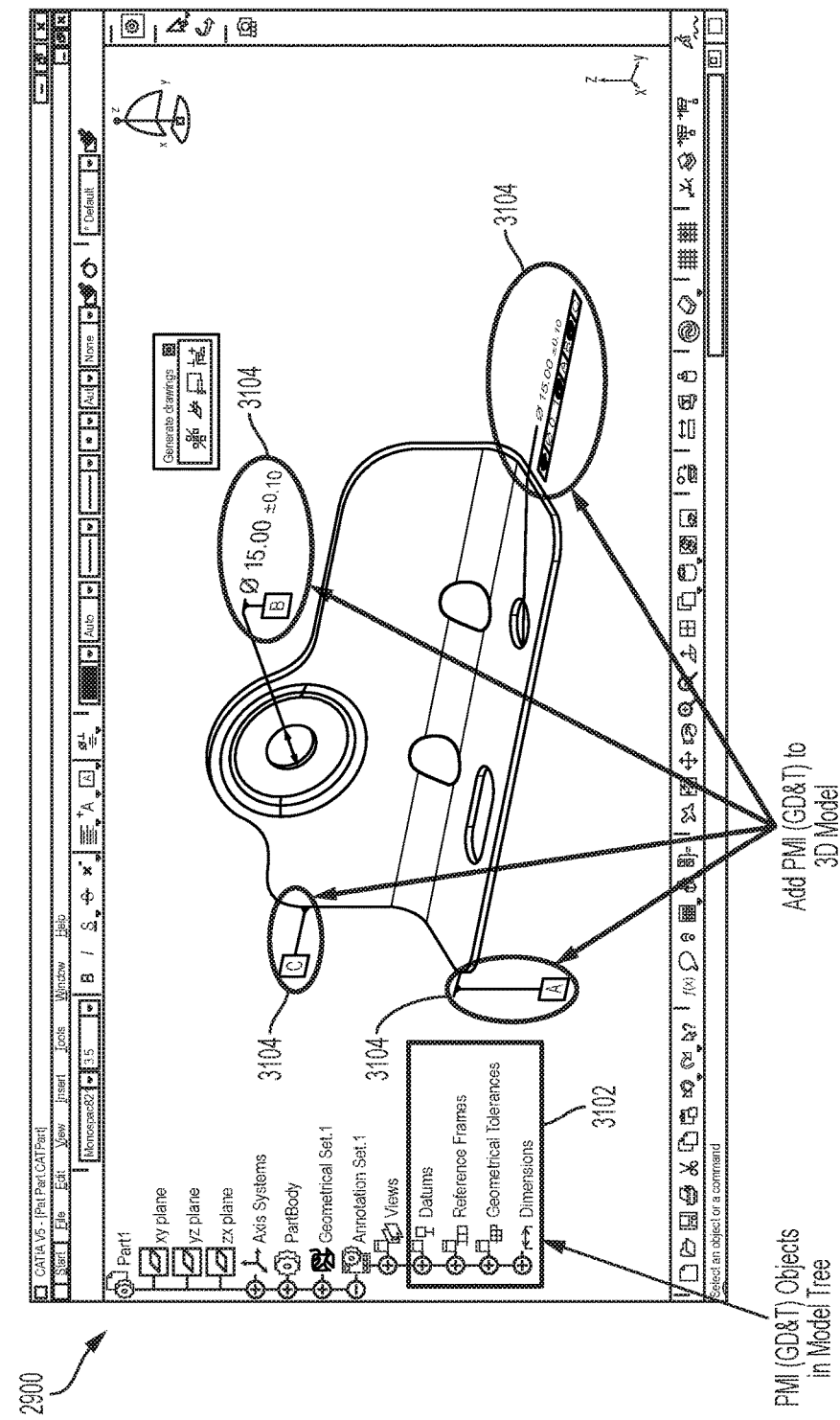

Referring now to FIG. 31, the illustrated process is shown to include adding details to the 3D model (step 3). In step 3, details 3104 such as PMI information, GD&T annotations, dimensions, tolerances, and/or other types of content may be added to the 3D model via user interface 2900. Objects 3102 (e.g., datums, reference frames, geometrical tolerances, dimensions, etc.) may be added to the 3D model as part of the objects hierarchy. Objects 3102 may represent details 3104 added via user interface 2900.

Figure 32:
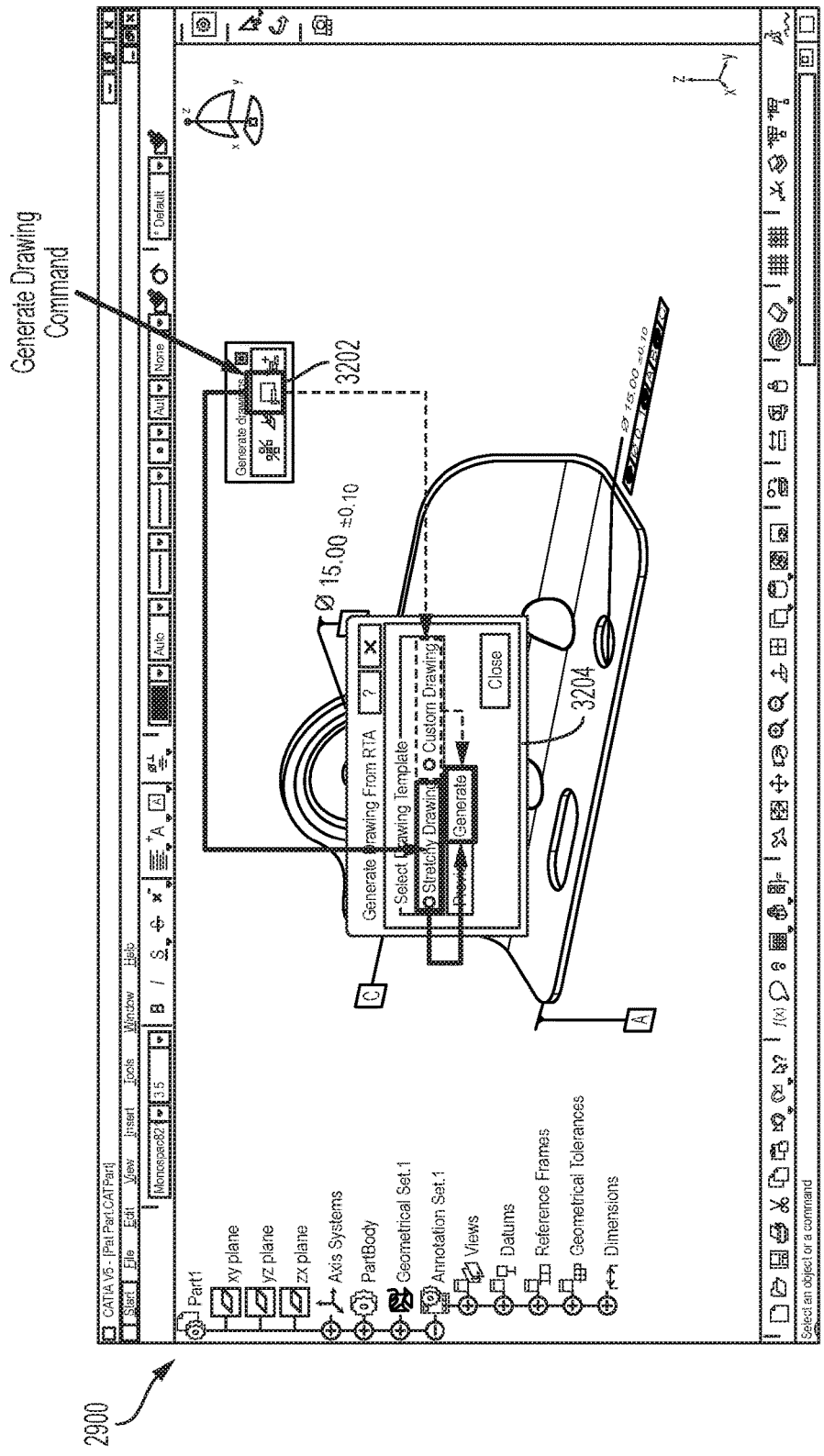

Referring now to FIG. 32, the illustrated process is shown to include sending a generate drawing command and selecting a drawing template (step 4). Sending the generate drawing command may be accomplished by selecting an icon 3202 (e.g., "generate drawing command") in generate drawings toolbar 3004. Selecting icon 3202 may cause user interface 2900 to display a template selection window 3204 through which a user can select a drawing template for the 2D drawing. In FIG. 32, template selection window 3204 is shown to include a "stretchy drawing" option and a "custom drawing" option. Selecting the stretchy drawing option may select an intelligent drawing template (e.g., a predefined and/or flexible template), whereas selecting the custom drawing option may allow a user to define a new drawing template.

Figure 33:
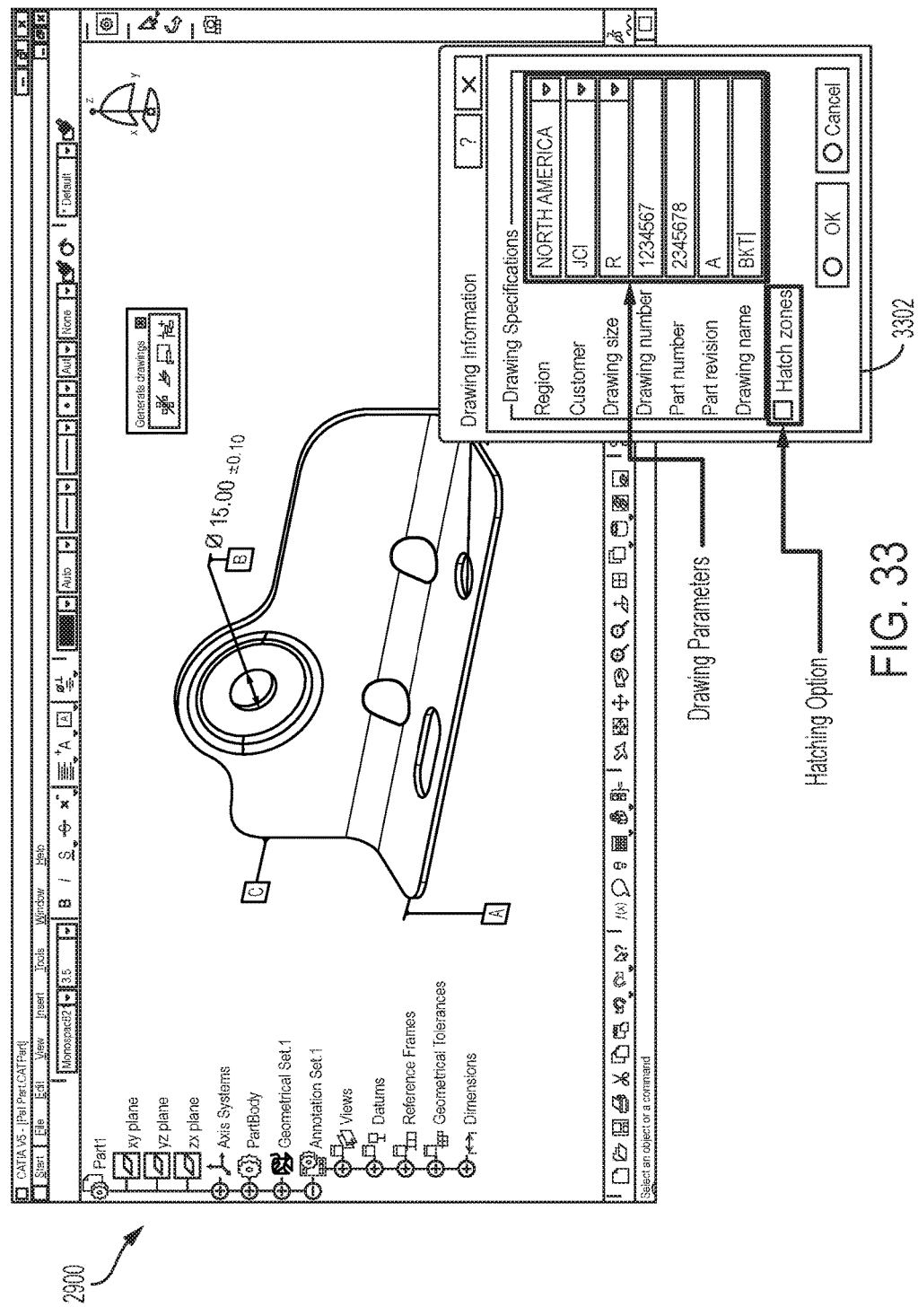

Referring now to FIG. 33, the illustrated process is shown to include defining drawing parameters (step 5). Drawing parameters may be defined via a drawing information window 3302 displayed via user interface 2900 in response to a user clicking the "generate" icon in template selection window 3204. Drawing information window 3302 is shown to include several fields (e.g., drop down menus, custom text fields, etc.) which may be used to select or enter various drawing parameters. Drawing parameters may include, for example, a region parameter (e.g., defining a geographic region), a customer parameter, a drawing size parameter, a drawing number parameter, a part number parameter, a revision number parameter, a drawing name parameter, and/or other parameters that further define the 2D drawing created from the 3D model. In some embodiments, the drawing parameters include a hatching option. CAD synchronization system 112 may use the drawing parameters to format the 2D drawing and/or populate a table displayed in the 2D drawing. The drawing parameters may be stored as attributes of the 3D model (e.g., within the objects hierarchy).

Figure 34:
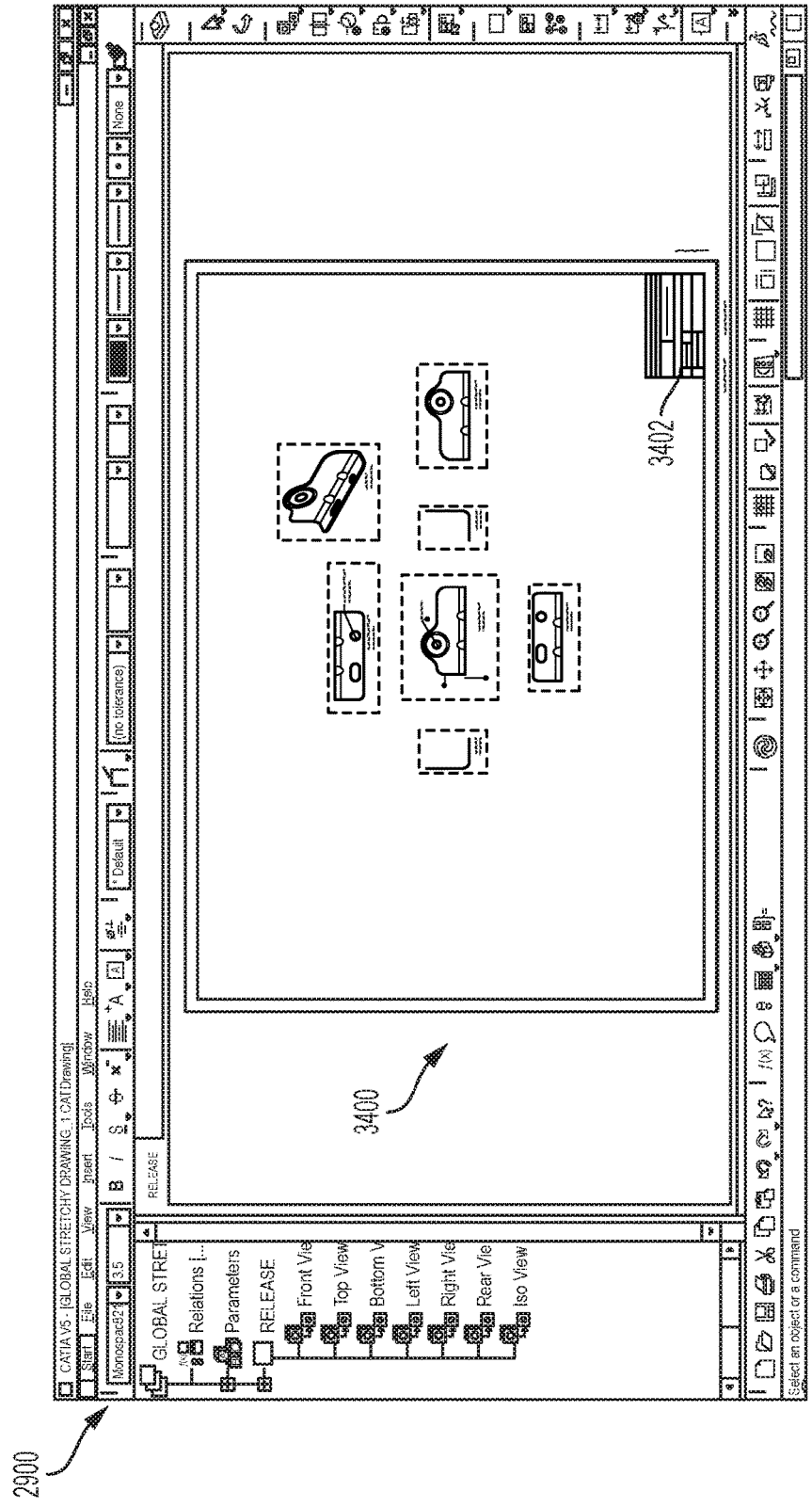

Referring now to FIG. 34, the illustrated process is shown to include creating a formal 2D drawing from the annotated 3D model (step 6). CAD synchronization system 112 may use the drawing parameters entered via drawing information window 3302 and/or the standard views defined in step 2 to create the formal 2D drawing 3400. 2D drawing 3400 may be formatted according to a particular drawing standard defined by the drawing parameters. 2D drawing 3400 is shown to include a front view, a left view, a right view, a rear view, a top view, a bottom view, and an isometric view. The initial spacing and relative positions of the views may be defined by the drawing parameters of the 3D model. In some embodiments, 2D drawing 3400 includes a table 3402 which may include various parameters or notes defined by the drawing parameters or the details 3104 of the 3D model specified via user interface 2900.

Figure 35:
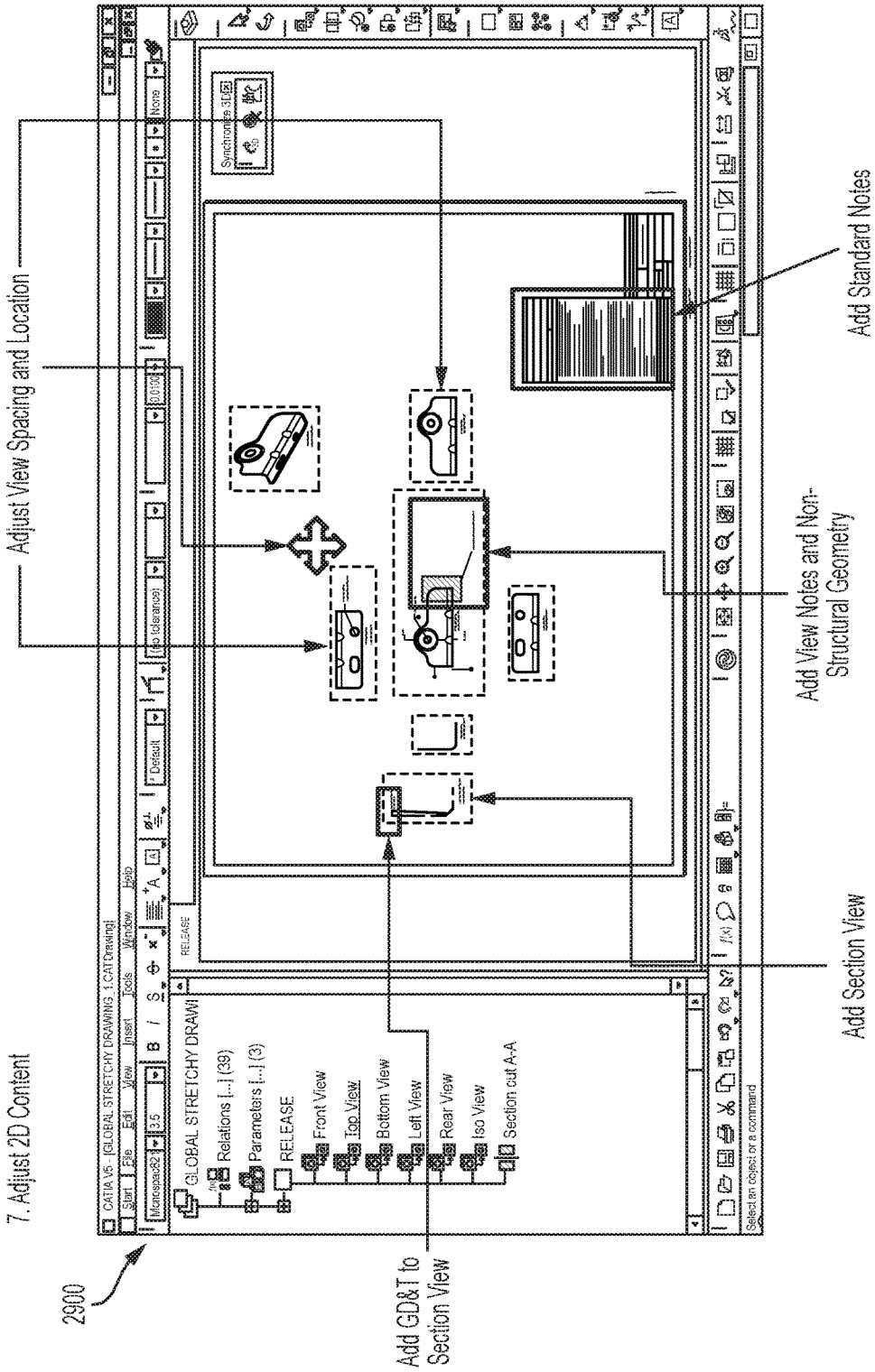

Referring now to FIG. 35, the illustrated process is shown to include adjusting 2D content (step 7). Adjusting 2D content may include, for example, adjusting the spacing and locations of the standard views, removing one or more of the standard views, adding a non-standard view (e.g., a detail view, a section view, etc.), adding view notes or non-structural geometry to one or more of the views, adding standard notes, adding GD&T parameters to one or more of the views, adding supplementary content to the 2D drawing (i.e., content that is not part of the 3D model), or otherwise adjusting the content of the 2D drawing. Advantageously, allowing content to be added or adjusted via the 2D drawing may facilitate user interaction for users who prefer to work with 2D drawings over a 3D model.

Figure 36:
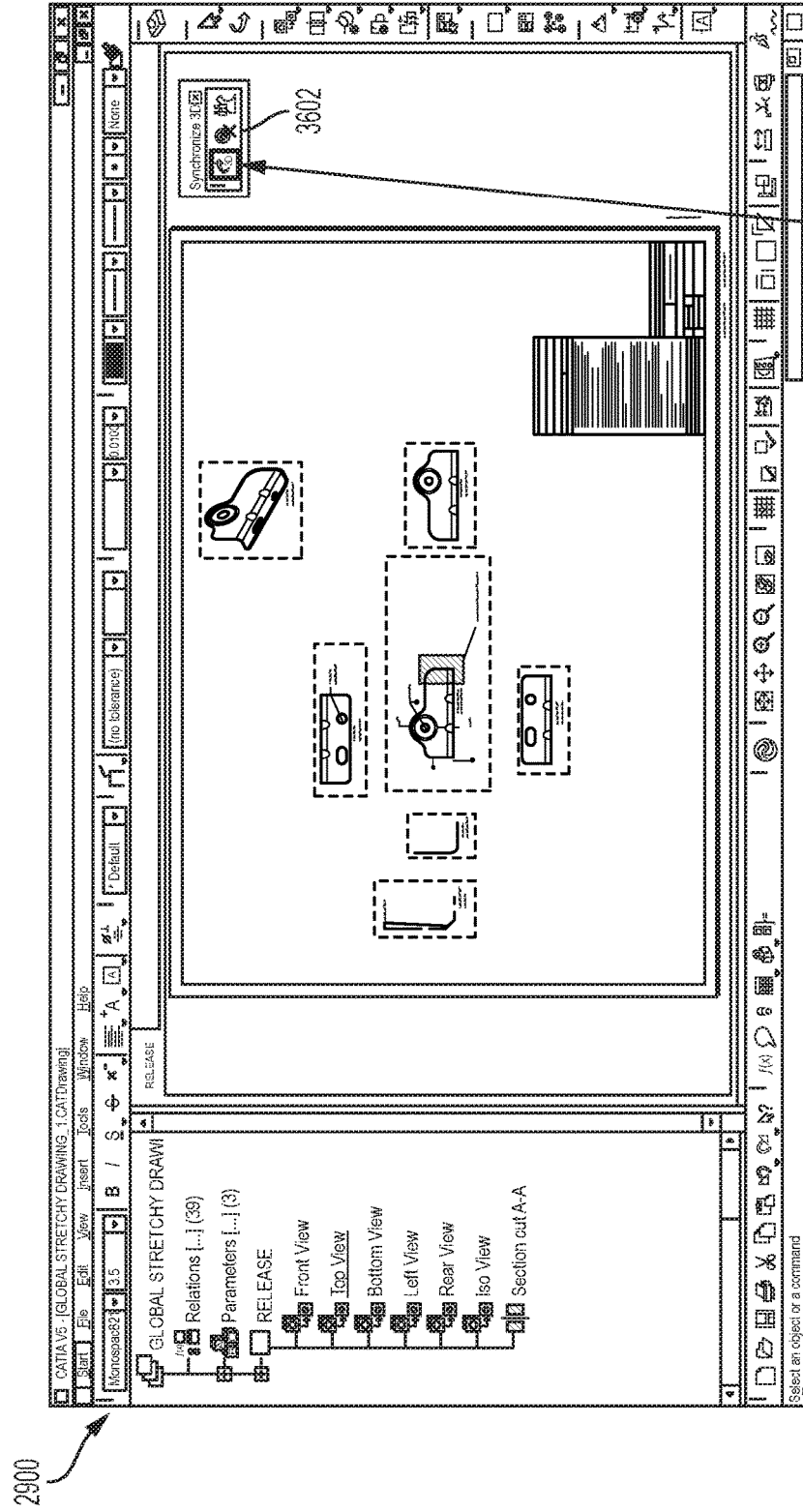

Referring now to FIG. 36, the illustrated process is shown to include synchronizing/copying the added 2D content to the 3D model (step 8). User interface 2900 is shown to include a synchronize 3D toolbar 3602 including a sync command icon. Selecting the sync command icon may cause CAD synchronization system 112 to synchronize (e.g., copy, move, store, etc.) the added 2D content with the 3D model. Synchronizing the 2D content and the 3D model may include saving any changes made to the 2D drawing within the 3D model.

Figure 37:
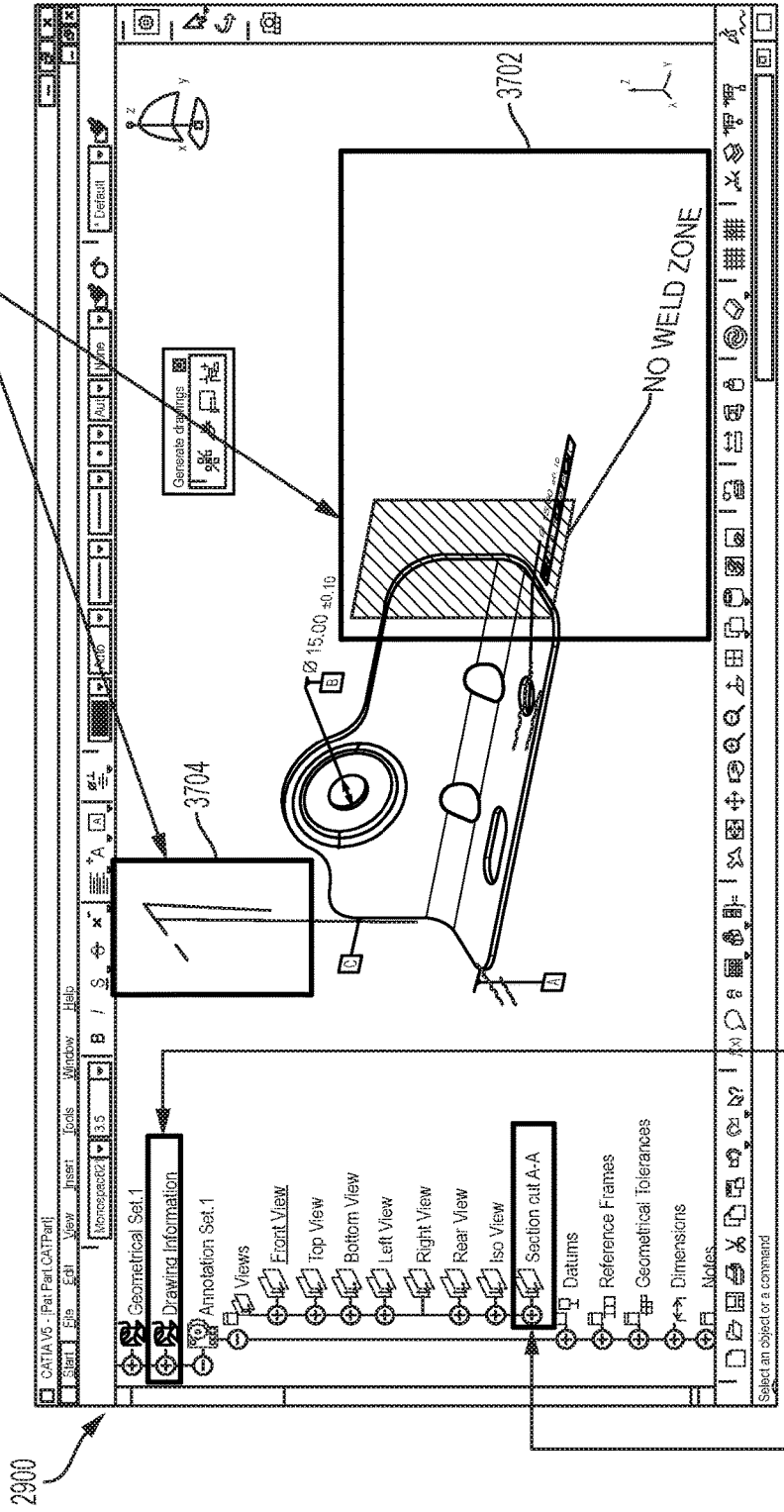

Referring now to FIG. 37, the illustrated process is shown to include incorporating the synchronized 2D content into the 3D model (step 9). Some types of 2D content such as GD&T annotations and non-structural geometry may be copied to the 3D model as graphic information and stored as a graphical element within the corresponding view plane. For example, 2D content 3702 added to the front view in the 2D drawing may be copied to the front view plane of the 3D model. Similarly, 2D content 3704 added to the section view in the 2D drawing may be copied to a section view plane of the 3D model.

Additional view planes (e.g., a section view plane) may be created in the 3D model for any section views or auxiliary views defined in the 2D drawing and corresponding view objects (e.g., a section view object) may be added to the objects hierarchy of the 3D model. Content added to the 2D drawing may be saved as object attributes of the 3D model. In some embodiments, 2D content such as the drawing parameters entered via drawing information window 3302 and view spacing information may be stored within the objects hierarchy as attributes of the "drawing information" hierarchical node.

Figure 38:
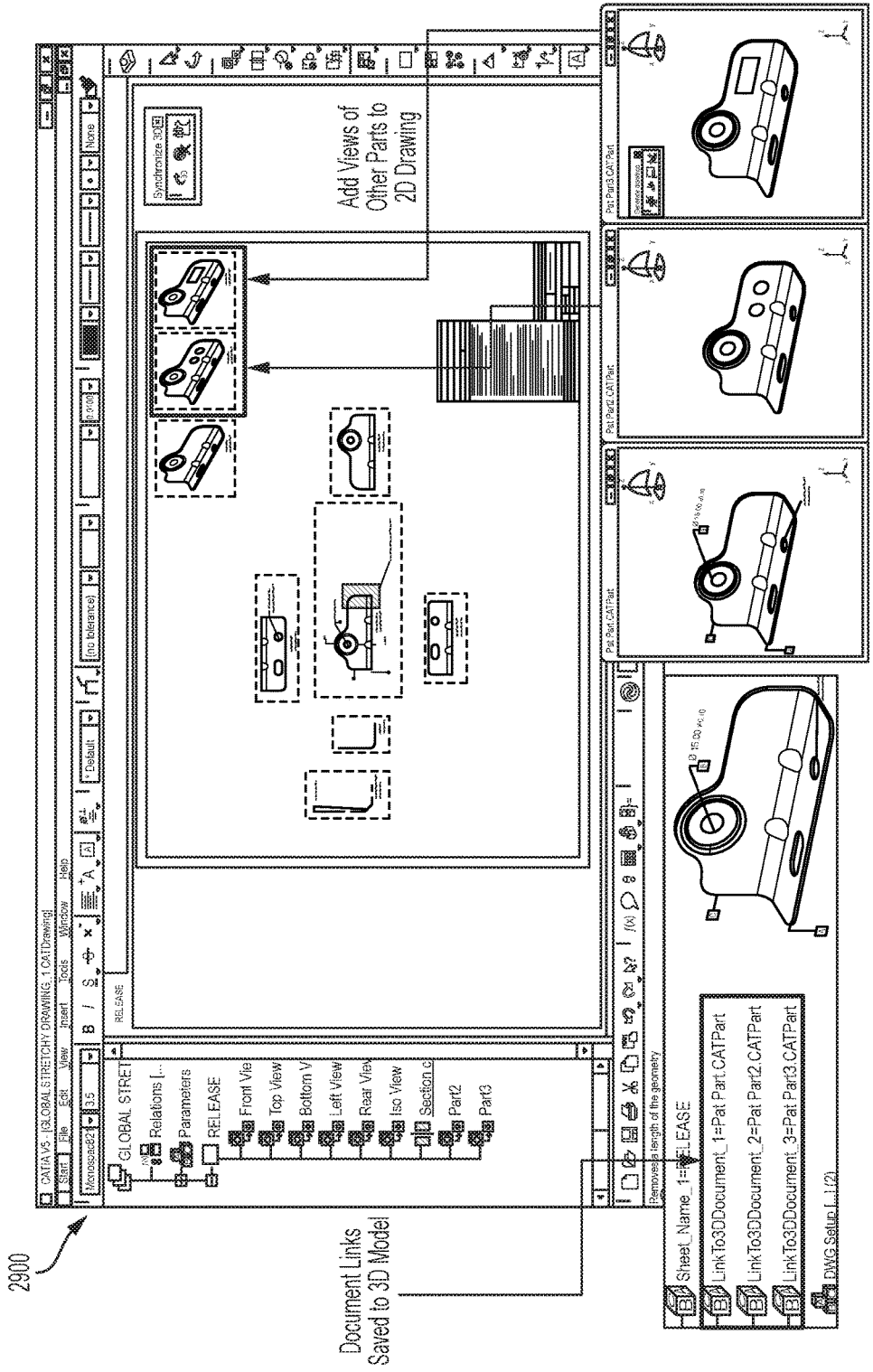

Referring now to FIG. 38, the illustrated process is shown to include adding derived views and/or views of other 3D parts (step 10). In various embodiments, the derived views and the views of other 3D parts may be added directly to the 3D model (e.g., by manually creating a link parameter) or added to the 2D drawing and subsequently copied to the 3D model. Step 10 may include adjusting a spacing or positioning of the added views in the 2D drawing.

Views of other 3D parts may be saved as attributes of the 3D model. The attributes may specify links (e.g., file paths, file names, file locations, etc.) to the other 3D parts. When the 3D model is used to recreate the 2D drawing, CAD synchronization system 112 may use the links to the other 3D parts to automatically open the specified 3D parts and retrieve the views thereof. In some embodiments, CAD synchronization system 112 may check whether the specified 3D parts are already open (i.e., active in the current session) and prompt a user to open the specified 3D parts if the specified parts are not already open.

Figure 39:
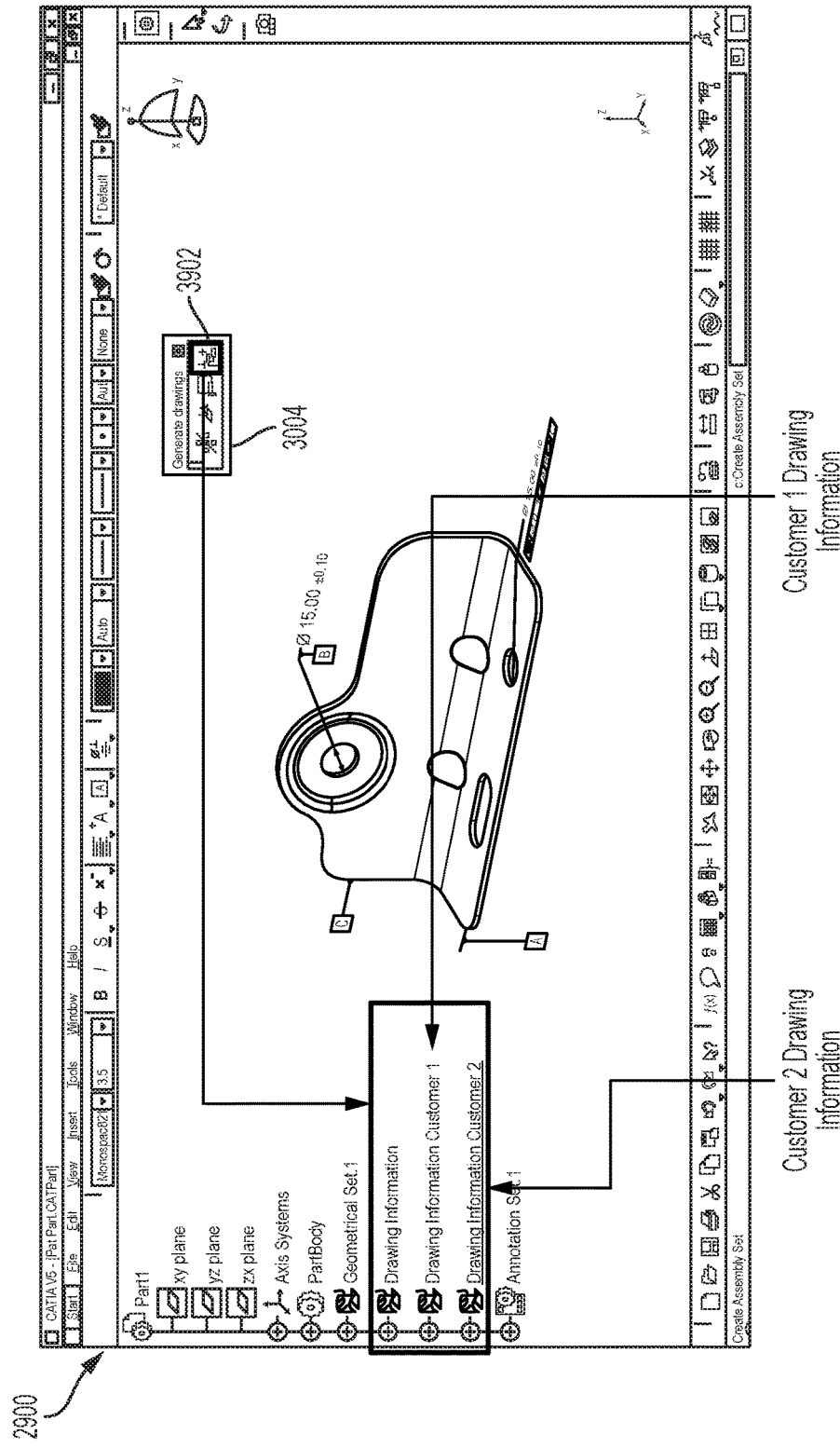

Referring now to FIG. 39, the illustrated process is shown to include adding multiple drawing versions (step 11). Adding multiple drawing versions may include creating multiple copies of the drawing information object (and any parameters or attributes contained therein) in the objects hierarchy of the 3D model. In some embodiments, step 11 is performed in response to a user selecting an icon 3902 of generate drawings toolbar 3004.

Each instance of the drawing information object may contain a discrete set of drawing parameters. Each set of drawing parameters may be adjusted independently (e.g., directly via the 3D model or via a 2D drawing) to define multiple different drawing versions that can be created from the same 3D model. In some embodiments, each instance of the drawing information object corresponds to a particular customer or drawing standard. For example, in FIG. 39, a first set of drawing parameters corresponds to customer 1, whereas a second set of drawing parameters corresponds to customer 2.

Figure 40:
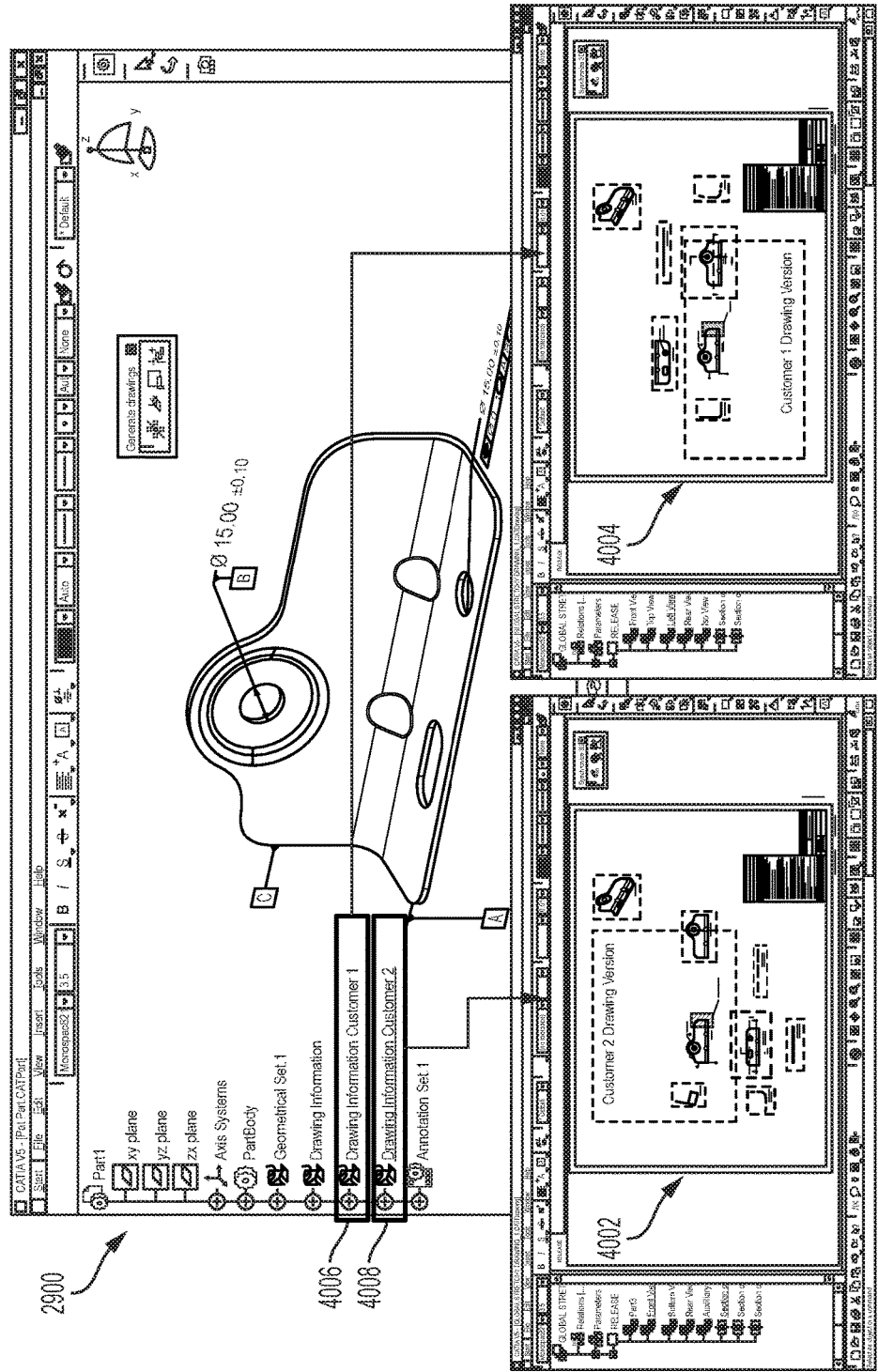

Referring now to FIG. 40, the illustrated process is shown to include creating multiple 2D drawings from the 3D model (step 12). Each 2D drawing may be created according to the drawing parameters specified within the corresponding drawing information object of the 3D model. Any changes made to the 2D drawings may be synchronized with the 3D model and stored as attributes of the corresponding drawing information object. For example, any changes made to drawing 4002 may be stored as attributes of drawing information object 4008, whereas any changes made to drawing 4004 may be stored as attributes of drawing information object 4006.

Advantageously, the 3D model created and adjusted as described herein may be used to create one or more 2D drawings on demand in a fully automated manner. For example, once the 3D model has been adjusted to include the supplementary information added to the 2D drawings, the 2D drawings can be automatically reproduced from the 3D model without requiring further user input or modification. Storing all of the information required to reproduce the 2D drawings as attributes of the 3D model allows the 3D model to be the master document. The annotated 3D model may be used to readily reproduce the 2D drawings on demand or on the fly to create one or more 2D drawings for various purposes. Any changes made to the 2D drawings are automatically saved back to the 3D model to ensure that the 3D model can accurately reproduce the changed 2D drawings.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for reproducing a 2D drawing from an annotated 3D computer-aided design (CAD) model, the method comprising:
   receiving, at a processing circuit, an annotated 3D CAD model of a physical part or assembly;
   generating, by the processing circuit, a 2D drawing of the physical part of assembly using the annotated 3D CAD model;
   receiving, at the processing circuit via a user interface, a modification to the 2D drawing;
   storing, by the processing circuit, the modification to the 2D drawing as 2D drawing parameters within the annotated 3D CAD model to amend the annotated 3D CAD model, wherein the 2D drawing parameters provide instructions for reproducing the 2D drawing including the modification, such that the 2D drawing is not saved; and
   reproducing, by the processing circuit, the 2D drawing including the modification using the 2D drawing parameters within the annotated 3D CAD model.

2. The method of claim 1, wherein the modification to the 2D drawing comprises supplemental content not included in the annotated 3D CAD model prior to being amended.

3. The method of claim 2, wherein the modification to the 2D drawing comprises at least one of non-solid geometry, a textual annotation, a dimension, and a tolerance.

4. The method of claim 1, further comprising:
receiving a user selection of a first standard 3D view of the annotated 3D CAD model via the user interface;
automatically defining a plurality of other standard 3D views of the annotated 3D CAD model based on the first standard view; and
storing the first standard 3D view and the plurality of other standard 3D views as objects of the annotated 3D CAD model.

5. The method of claim 1, further comprising:
receiving, via the user interface, a command to generate a drawing from the annotated 3D CAD model;
prompting a user to identify a drawing template in response to receiving the command;
using the identified drawing template to format the 2D drawing; and
storing an indication of the identified drawing template as an attribute of the annotated 3D CAD model.

6. The method of claim 1, further comprising:
prompting a user to select or input the 2D drawing parameters for the 2D drawing; and
storing the 2D drawing parameters as attributes of the annotated 3D CAD model.

7. The method of claim 1, wherein the modification to the 2D drawing comprises a non-standard view of the annotated 3D CAD model;
wherein storing the modification within the annotated 3D CAD model comprises storing a view object defining the non-standard view as a 3D view of the annotated 3D CAD model.

8. The method of claim 1, wherein storing the modification to the 2D drawing as 2D drawing parameters within the annotated 3D CAD model comprises:
generating a drawing information object comprising one or more of the 2D drawing parameters defining the modification to the 2D drawing; and
storing the drawing information object as an object of the annotated 3D CAD model.

9. The method of claim 1, further comprising:
generating multiple drawing information objects, each drawing information object is configured to reproduced a different 2D drawing and comprises additional 2D drawing parameters defining multiple different views of the corresponding 2D drawing; and
storing the drawing information objects as discrete sets of 2D drawing parameters within the annotated 3D CAD model.

10. The method of claim 1, wherein the annotated 3D CAD model is a first annotated 3D CAD model;
wherein the modification to the 2D drawing comprises a view of a second annotated 3D CAD model;
wherein storing the modification to the 2D drawing as 2D drawing parameters within the annotated 3D CAD model comprises storing a link defining a location of the second annotated 3D CAD model as an attribute of the first annotated 3D CAD model.

11. The method of claim 1, wherein the processing circuit is configured to display multiple different 2D views at the same time within the 2D drawing.

12. The method of claim 1, wherein the 2D drawings are formal 2D drawings that are compliant with and formatted according to drafting standards.

13. The method of claim 1, wherein the 2D drawing is reproduced using only the 2D drawing parameters stored in the annotated 3D model.

14. The method of claim 1, wherein the 2D drawing is not stored and is discarded before being reproduced.

15. A method for synchronizing an annotated 3D computer-aided design (CAD) model and a 2D drawing, the method comprising:
receiving, at a processing circuit, an annotated 3D CAD model of a physical part or assembly;
generating, by the processing circuit, a 2D drawing of the physical part or assembly using the annotated 3D CAD model;
adding, by the processing circuit, supplemental content to the 2D drawing, wherein the supplemental content is not included in the annotated 3D CAD model; and
modifying, by the processing circuit, the annotated 3D CAD model to include 2D drawing parameters that include the supplemental content added to the 2D drawing,
wherein the 2D drawing parameters provide instructions for reproducing the 2D drawing including the supplemental content, such that the 2D drawing is not saved.

16. The method of claim 15, further comprising:
using the 2D drawing parameters within the annotated 3D CAD model to re-create the 2D drawing including the supplemental content.

17. The method of claim 15, further comprising:
generating a graphical user interface;
receiving user input via the graphical user interface; and
using the user input to generate at least one non-standard view of the physical part of assembly;
wherein the supplemental content added to the 2D drawing includes the generated non-standard view.

18. The method of claim 15, wherein modifying the annotated 3D CAD model to include the 2D drawing parameters that include the supplemental content comprises:
generating a plurality of data elements, each data element corresponding to a view depicted in the 2D drawing and being added to the 2D drawing parameters that at least partially defining the corresponding view; and
storing the plurality of data elements as properties of the annotated 3D CAD model.

19. The method of claim 15, wherein adding the supplemental content to the 2D drawing comprises adding to a view of the 2D drawing at least one of non-solid geometry, a textual annotation, a dimension, and a tolerance.

20. The method of claim 15, wherein modifying the annotated 3D CAD model to include the 2D drawing parameters that include the supplemental content comprises:
identifying the view of the 2D drawing to which the supplemental content is added; and
storing the supplemental content to a view plane of the annotated 3D CAD model corresponding to the identified view.

21. The method of claim 15, wherein adding the supplemental content to the 2D drawing comprises adding clarifying information comprising at least one of hidden lines, axes, and center lines;
wherein modifying the annotated 3D CAD model to include the 2D drawing parameters that include the supplemental content comprises storing the clarifying information as a data element of the annotated 3D model.

22. The method of claim 15, wherein modifying the annotated 3D CAD model to include the 2D drawing parameters that include the supplemental content comprises:

generating a plurality of data elements, each data element corresponding to a different 2D drawing and being added to the 2D drawing parameters defining multiple different views of the corresponding 2D drawing; and storing the plurality of data elements as properties of the annotated 3D CAD model.

23. A system for synchronizing an annotated 3D computer-aided design (CAD) model and a 2D drawing, the system comprising:

a communications interface configured to receive an annotated 3D CAD model of a physical part or assembly; and a processing circuit configured to:
generate a 2D drawing of the physical part or assembly using the annotated 3D CAD model;
add supplemental content to the 2D drawing, wherein the supplemental content is not included in the annotated 3D CAD model; and
modify the annotated 3D CAD model to include 2D drawing parameters that include the supplemental content added to the 2D drawing,
wherein the 2D drawing parameters provide instructions for reproducing the 2D drawing including the supplemental content, such that the 2D drawing is not saved.

24. The system of claim 23, wherein the processing circuit is configured to use the 2D drawing parameters within the annotated 3D CAD model to re-create the 2D drawing including the supplemental content.

25. The system of claim 23, wherein the processing circuit is configured to:
generate a graphical user interface;
receive user input via the graphical user interface; and
use the user input to generate at least one non-standard view of the physical part of assembly;
wherein the supplemental content added to the 2D drawing includes the generated non-standard view.

26. The system of claim 23, wherein modifying the annotated 3D CAD model to include the 2D drawing parameters that include the supplemental content comprises:
generating a plurality of data elements, each data element corresponding to a view depicted in the 2D drawing and being added to the 2D drawing parameters at least partially defining the corresponding view; and
storing the plurality of data elements as properties of the annotated 3D CAD model.

27. The system of claim 23, wherein adding the supplemental content to the 2D drawing comprises adding to a view of the 2D drawing at least one of non-solid geometry, a textual annotation, a dimension, and a tolerance.

28. The system of claim 27, wherein modifying the annotated 3D CAD model to include the 2D drawing parameters that include the supplemental content comprises:
identifying the view of the 2D drawing to which the supplemental content is added; and
storing the supplemental content to a view plane of the annotated 3D CAD model corresponding to the identified view.

29. The system of claim 23, wherein adding the supplemental content to the 2D drawing comprises adding clarifying information comprising at least one of hidden lines, axes, and center lines;
wherein modifying the annotated 3D CAD model to include the 2D drawing parameters that include the supplemental content comprises storing the clarifying information as a data element of the annotated 3D model.

30. The system of claim 23, wherein modifying the annotated 3D CAD model to include the 2D drawing parameters that include the supplemental content comprises:
generating a plurality of data elements, each data element corresponding to a different 2D drawing and being added to the 2D drawing parameters defining multiple different views of the corresponding 2D drawing; and
storing the plurality of data elements as properties of the annotated 3D CAD model.

31. A system for synchronizing an annotated 3D computer-aided design (CAD) model and a 2D drawing, the system comprising:

a communications interface configured to receive a 2D drawing based on an annotated 3D CAD model of a physical part or assembly; and a processing circuit configured to:
identify supplemental content in the 2D drawing that is not included in the annotated 3D CAD model; and
modify the annotated 3D CAD model to include 2D drawing parameters that include the supplemental content from the 2D drawing,
wherein the 2D drawing parameters provide instructions for reproducing the 2D drawing including the supplemental content, such that the 2D drawing is not saved.

32. The system of claim 31, wherein the supplemental content comprises at least one of non-solid geometry, a textual annotation, a dimension, and a tolerance.

33. The system of claim 31, wherein modifying the annotated 3D CAD model to include 2D drawing parameters that include the supplemental content comprises:
identifying a view of the 2D drawing that includes the supplemental content; and
storing the supplemental content to a view plane of the annotated 3D CAD model corresponding to the identified view.

34. The system of claim 31, wherein the processing circuit is configured to use the 2D drawing parameters within the annotated 3D CAD model to re-create the 2D drawing including the supplemental content.

* * * * *